US012745561B2

(12) United States Patent
Kim et al.

(10) Patent No.: US 12,745,561 B2
(45) Date of Patent: Sep. 22, 2026

(54) ORGANIC LIGHT EMITTING DEVICE

(71) Applicant: LG CHEM, LTD., Seoul (KR)

(72) Inventors: Hoon Jun Kim, Daejeon (KR); Jae Seung Ha, Daejeon (KR); Ji Young Choi, Daejeon (KR); Woochul Lee, Daejeon (KR); Joo Ho Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 906 days.

(21) Appl. No.: 18/018,928

(22) PCT Filed: Aug. 31, 2021

(86) PCT No.: PCT/KR2021/011677

§ 371 (c)(1),
(2) Date: Jan. 31, 2023

(87) PCT Pub. No.: WO2022/050656

PCT Pub. Date: Mar. 10, 2022

(65) Prior Publication Data

US 2023/0292609 A1 Sep. 14, 2023

(30) Foreign Application Priority Data

Sep. 1, 2020 (KR) ........................ 10-2020-0111073

(51) Int. Cl.
*H10K 85/60* (2023.01)
*H10K 50/10* (2023.01)
(Continued)

(52) U.S. Cl.
CPC ....... *H10K 85/6574* (2023.02); *H10K 85/658* (2023.02); *H10K 50/10* (2023.02); *H10K 50/11* (2023.02); *H10K 2101/90* (2023.02)

(58) Field of Classification Search
CPC .... H10K 2101/90; H10K 50/10; H10K 50/11; H10K 85/615; H10K 85/626; H10K 85/654; H10K 85/6574; H10K 85/658
See application file for complete search history.

(56) References Cited

U.S. PATENT DOCUMENTS 11,133,472 B1 9/2021 Cha et al.
2018/0009776 A1 1/2018 Cha et al.
(Continued)

FOREIGN PATENT DOCUMENTS

CN 110770363 A 2/2020
CN 111164182 A 5/2020
(Continued)

OTHER PUBLICATIONS

KR 10-2020-0081984 A English Translation by FIT database, translated on Mar. 4, 2026.*

*Primary Examiner* — Golam Mowla
(74) *Attorney, Agent, or Firm* — Bryan Cave Leighton Paisner LLP

(57) ABSTRACT

Provided is an organic light emitting device comprising: a first electrode; a second electrode; one or more organic material layers including a light emitting layer provided between the first electrode and the second electrode, wherein the light emitting layer includes a compound of Chemical Formula 1 and a compound of Chemical Formula 2:
(Continued)

[Chemical Formula 1]

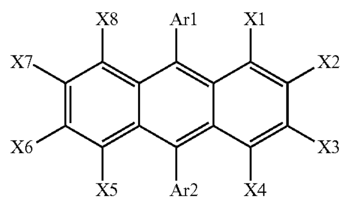

[Chemical Formula 2]

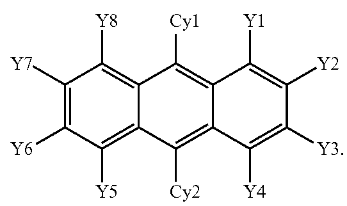

15 Claims, 2 Drawing Sheets

(51) Int. Cl.
*H10K 50/11* (2023.01)
*H10K 101/00* (2023.01)

(56) References Cited

U.S. PATENT DOCUMENTS

| | | | |
|---|---|---|---|
| 2019/0207112 | A1 | 7/2019 | Katakeyama et al. |
| 2020/0111972 | A1 | 4/2020 | Nakano et al. |
| 2020/0411771 | A1 | 12/2020 | Kim et al. |
| 2021/0367164 | A1 | 11/2021 | Song et al. |
| 2021/0408386 | A1 | 12/2021 | Song et al. |
| 2022/0006019 | A1 | 1/2022 | Kim et al. |
| 2023/0042023 | A1 | 2/2023 | Tasaki et al. |

FOREIGN PATENT DOCUMENTS

| | | | |
|---|---|---|---|
| KR | 10-2013-0060157 | | 6/2013 |
| KR | 10-2016-0089693 | | 7/2016 |
| KR | 10-2018-0037695 | | 4/2018 |
| KR | 10-2018-0134850 | | 12/2018 |
| KR | 10-2019-0138477 | | 12/2019 |
| KR | 10-2019-0140421 | | 12/2019 |
| KR | 10-2020-0047400 | | 5/2020 |
| KR | 10-2020-0081984 | | 7/2020 |
| KR | 10-2020-0081985 | | 7/2020 |
| WO | 2019-002198 | A | 1/2019 |
| WO | 2020-075763 | A1 | 4/2020 |
| WO | 2020080416 | A1 | 4/2020 |

* cited by examiner

【FIG. 1】
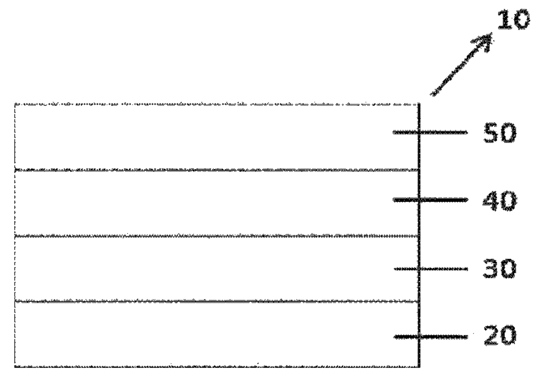
【FIG. 2】
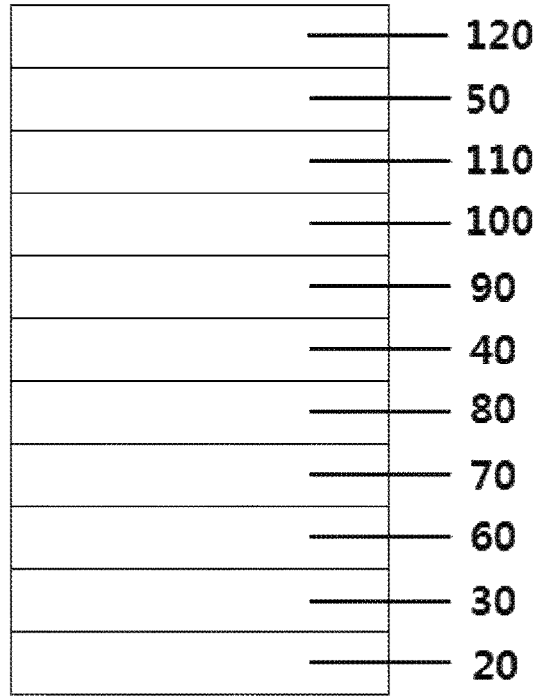

【FIG. 3】
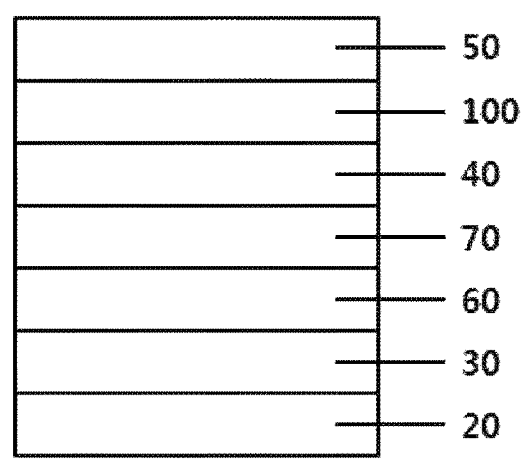

ORGANIC LIGHT EMITTING DEVICE

CROSS-REFERENCE TO RELATED APPLICATIONS

This application is a National Stage Application of International Application No. PCT/KR2021/011677 filed on Aug. 31, 2021, which claims priority to and the benefits of Korean Patent Application No. 10-2020-0111073, filed with the Korean Intellectual Property Office on Sep. 1, 2020, the entire contents of which are incorporated herein by reference.

TECHNICAL FIELD

The present specification relates to an organic light emitting device.

BACKGROUND

An organic light emitting device has a structure in which an organic thin film is disposed between two electrodes. When a voltage is applied to an organic light emitting device having such a structure, electrons and holes injected from the two electrodes bind and pair in the organic material layer, and light emits as these annihilate. The organic material layer can be formed in a single layer or a multilayer as necessary.

In order to obtain a high performance organic light emitting device, materials for each organic material layer have been actively developed. Particularly, anthracene-based compounds have been developed as a material of a light emitting layer, however, there have been difficulties in developing a device having low driving voltage, high efficiency and long lifetime at the same time.

Development of a light emitting layer material has been continuously required in order to enhance performance, lifetime and efficiency of an organic light emitting device at the same time.

[Prior Art Documents] (Patent Document 1) Korean Patent Application Laid-Open Publication No. 10-2013-0060157

BRIEF DESCRIPTION

Technical Problem

The present specification is directed to providing an organic light emitting device having high stability, and properties of low driving voltage, high efficiency and long lifetime.

Technical Solution

An organic light emitting device according to one embodiment of the present specification includes a first electrode; a second electrode; and one or more organic material layers including a light emitting layer provided between the first electrode and the second electrode, wherein the light emitting layer includes a compound of the following Chemical Formula 1 and a compound of the following Chemical Formula 2:

[Chemical Formula 1]

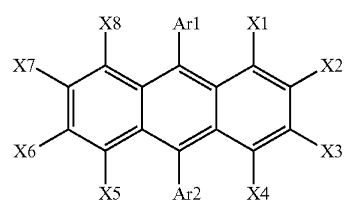

wherein in Chemical Formula 1:

X1 to X8 are the same as or different from each other, and each independently is hydrogen, deuterium, a substituted or unsubstituted aryl group, or a substituted or unsubstituted heteroaryl group;

Ar1 is a bond to R1 or R2 of the following Chemical Formula A; and

Ar2 is a substituted or unsubstituted phenyl group;

[Chemical Formula A]

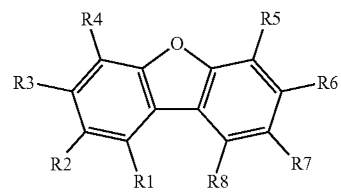

wherein in Chemical Formula A:

a substituent among R1 and R2 not bonding to Ar1, and substituents R3 to R8 are the same as or different from each other, and each independently is hydrogen, deuterium, a substituted or unsubstituted aryl group, or a substituted or unsubstituted heteroaryl group, or bond to adjacent groups to form a substituted or unsubstituted ring;

[Chemical Formula 2]

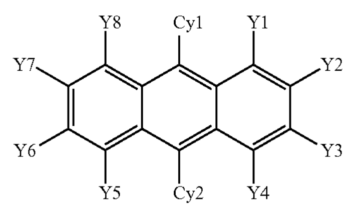

wherein in Chemical Formula 2:

Y1 to Y8 are the same as or different from each other, and each independently is hydrogen, deuterium, a substituted or unsubstituted aryl group, or a substituted or unsubstituted heteroaryl group;

Cy1 is a bond to R11 or R12 of the following Chemical Formula B; and

Cy2 is a substituted or unsubstituted fused aryl group having 10 to 20 carbon atoms;

[Chemical Formula B]

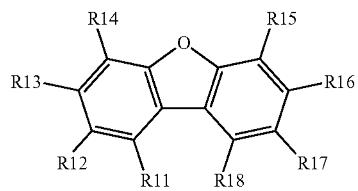

wherein in Chemical Formula B:

a substituent among R11 and R12 not bonding to Cy1, and substituents R13 to R18 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

Advantageous Effects

By including a compound of Chemical Formula 1 and a compound of Chemical Formula 2 in a light emitting layer at the same time, organic light emitting devices according to embodiments described in the present specification have properties of low driving voltage, high efficiency and long lifetime.

The compound of Chemical Formula 1 has an excellent electron injection ability, and when used in a device, effects of improving driving voltage and long lifetime can be obtained. By including the compound of Chemical Formula 1 and the compound of Chemical Formula 2 having high efficiency properties at the same time in a device, an effect of increasing device efficiency can be obtained as well while maintaining the advantages of the compound of Chemical Formula 1. In other words, a device in which driving voltage, lifetime and efficiency are improved at the same time can be obtained without a trade-off effect.

DESCRIPTION OF THE DRAWINGS

FIG. 1 to FIG. 3 each illustrate an organic light emitting device according to one embodiment of the present specification.

REFERENCE NUMERALS

10: Organic Light Emitting Device
20: Substrate
30: Anode
40: Light Emitting Layer
50: Cathode
60: Hole Injection Layer
70: Hole Transfer Layer
80: Hole Control Layer
90: Electron Control Layer
100: Electron Transfer Layer
110: Electron Injection Layer
120: Capping Layer

DETAILED DESCRIPTION

Hereinafter, the present specification will be described in detail.

When an anthracene-based compound is included in a light emitting layer of an organic light emitting device, a device with stable performance can be obtained, and accordingly, an anthracene-based compound has been commercialized up to now. However, when using an anthracene-based compound as a single host, an opposite effect is obtained in device lifetime and efficiency, and there have been difficulties in obtaining a device having both excellent lifetime and efficiency.

In view of the above, the present specification is directed to providing a device having both excellent device lifetime and efficiency by including a compound of Chemical Formula 1 and a compound of Chemical Formula 2 in a light emitting layer. When including the compound of Chemical Formula 1 and the compound of Chemical Formula 2 at the same time, a device in which driving voltage, lifetime and efficiency are improved at the same time can be obtained without a trade-off effect.

A blue light emitting device often has decreased efficiency when using a material having a strong electron transfer ability although properties of low voltage or long lifetime are obtained, and, when using a material having strong hole transfer properties, has declined voltage or lifetime properties although high efficiency properties are obtained. The compound of Chemical Formula 1 is a material having low voltage/long lifetime/low efficiency properties when used alone, and the compound of Chemical Formula 2 is a material having high voltage/short lifetime/high efficiency properties when used alone. However, when using the two materials at the same time as in the disclosure of the present application, device efficiency can be maximized by Compound 2 while electron injection and transfer smoothly occur by Compound 1.

In the present specification, a description of a certain part "including" certain constituents means capable of further including other constituents, and does not exclude other constituents unless particularly stated on the contrary.

In the present specification, a description of a B layer being formed "on" an A layer means not only the B layer being formed to be adjacent to the A layer, but also capable of further including one or more additional layers between the A layer and the B layer unless particularly stated on the contrary.

Examples of substituents in the present specification are described below, however, the substituents are not limited thereto.

The team "substitution" means a hydrogen atom bonding to a carbon atom of a compound being changed to another substituent, and the position of substitution is not limited as long as it is a position at which the hydrogen atom is substituted, that is, a position at which a substituent is capable of substituting, and when two or more substituents substitute, the two or more substituents can be the same as or different from each other.

In the present specification, a term "substituted or unsubstituted" means being substituted with one, two or more substituents selected from the group consisting of deuterium; a halogen group; a nitrile group; a nitro group; a hydroxyl group; an alkyl group; a cycloalkyl group; a heterocycloalkyl group; an alkoxy group; an aryloxy group; a silyl group; a boron group; an aryl group; and a heterocyclic group, or being substituted with a substituent linking two or more substituents among the substituents illustrated above, or having no substituents. For example, the "substituent linking two or more substituents" can be a heteroaryl group substituted with an aryl group; or an aryl group substituted with a heteroaryl group. In addition, a biphenyl group can be an aryl group, or can be interpreted as a substituent linking two phenyl groups.

The term "substituted or unsubstituted" of the present specification means being substituted with one, two or more substituents selected from the group consisting of deuterium, an alkyl group having 1 to 20 carbon atoms, a cycloalkyl group having 3 to 30 carbon atoms, an aryl group having 6 to 30 carbon atoms, and a heteroaryl group having 2 to 30 carbon atoms, or being substituted with a substituent linking two or more substituents among the substituents illustrated above, or having no substituents.

In the present specification, the halogen group can be fluorine, chlorine, bromine or iodine.

In the present specification, the alkyl group can be linear or branched, and although not particularly limited thereto, the number of carbon atoms is preferably from 1 to 30. Specific examples thereof can include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methylhexyl and the like, but are not limited thereto.

In the present specification, the cycloalkyl group is not particularly limited, but preferably has 3 to 30 carbon atoms. Specific examples thereof can include cyclopropyl, cyclobutyl, cyclopentyl, cycloheptyl, cyclooctyl and the like, but are not limited thereto.

In the present specification, the heterocycloalkyl group is a cycloalkyl group including one or more heteroatoms, and specifically, the heteroatom can include one or more atoms selected from the group consisting of O, N, S, P and the like.

In the present specification, the alkoxy group can be linear, branched or cyclic. The number of carbon atoms of the alkoxy group is not particularly limited, but is preferably from 1 to 30. Specific examples thereof can include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy and the like, but are not limited thereto.

In the present specification, the silyl group can be an alkylsilyl group or an arylsilyl group, and furthermore, can be a trialkylsilyl group or a triarylsilyl group. The number of carbon atoms of the silyl group is not particularly limited, but is preferably from 1 to 30, and the number of carbon atoms of the alkylsilyl group can be from 1 to 30 and the number of carbon atoms of the arylsilyl group can be from 6 to 30. Specific examples thereof can include a trimethylsilyl group, a triethylsilyl group, a tert-butyldimethylsilyl group, a vinyldimethylsilyl group, a propyldimethylsilyl group, a triphenylsilyl group, a diphenylsilyl group, a phenylsilyl group and the like, but are not limited thereto.

In the present specification, the boron group can be $-BR_{100}R_{101}$. $R_{100}$ and $R_{101}$ are the same as or different from each other, and can be each independently selected from the group consisting of hydrogen, deuterium, halogen, a nitrile group, a substituted or unsubstituted monocyclic or polycyclic cycloalkyl group having 3 to 30 carbon atoms, a substituted or unsubstituted linear or branched alkyl group having 1 to 30 carbon atoms, a substituted or unsubstituted monocyclic or polycyclic aryl group having 6 to 30 carbon atoms, and a substituted or unsubstituted monocyclic or polycyclic heteroaryl group having 2 to 30 carbon atoms.

In the present specification, the aryl group is not particularly limited, but preferably has 6 to 30 carbon atoms, and the aryl group can be monocyclic or polycyclic.

When the aryl group is a monocyclic aryl group, the number of carbon atoms is not particularly limited, but is preferably from 6 to 30. Specific examples of the monocyclic aryl group can include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group can include a naphthyl group, an anthracenyl group, a phenanthrenyl group, a triphenylenyl group, a pyrenyl group, a phenalenyl group, a perylenyl group, a chrysenyl group, a fluorenyl group, a fluoranthenyl group and the like, but are not limited thereto.

In the present specification, the fluorenyl group can be substituted, and adjacent groups can bond to each other to form a ring.

When the fluorenyl group is substituted,

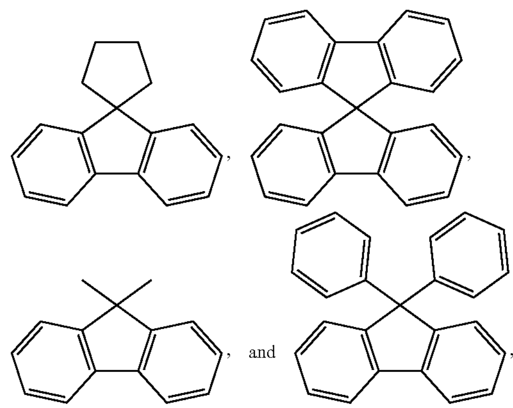

, , and , and the like can be included, however, the structure is not limited thereto.

The number of carbon atoms of the aryloxy group is not particularly limited, but is preferably from 6 to 30. Specific examples thereof can include a phenoxy group, a naphthyloxy group, an anthryloxy group and the like.

In the present specification, the descriptions on the aryl group provided above can be applied to the aromatic hydrocarbon ring except that the aromatic hydrocarbon ring is divalent.

In the present specification, the heterocyclic group is a group including one or more atoms that are not carbon, that is, heteroatoms, and specifically, the heteroatom can include one or more atoms selected from the group consisting of O, N, S, P and the like. Although not particularly limited thereto, the number of carbon atoms is preferably from 2 to 50, and furthermore, from 2 to 30, and the heterocyclic group can be monocyclic or polycyclic. The heterocyclic group can be an aromatic ring, an aliphatic ring and a fused ring thereof. Examples of the heterocyclic group can include a thiophene group, a furan group, a pyrrole group, a benzothiophene group, a dibenzothiophene group, a benzofuran group, a dibenzofuran group, a carbazole group and the like, but are not limited thereto.

The heteroaryl group means a monovalent aromatic heterocyclic group, and the heteroarylene group means a divalent aromatic heterocyclic group. The descriptions on the heterocyclic group provided above can be applied to the heteroaryl group and the heteroarylene group except that these are an aromatic heterocyclic group.

In the present specification, the descriptions on the aryl group provided above can be applied to the arylene group except that the arylene group is divalent.

In the present specification, N % deuterated means N % of available hydrogens in the corresponding structure being substituted with deuterium. For example, being substituted with deuterium by 25% in dibenzofuran means two of eight hydrogens of dibenzofuran being substituted with deuterium.

A compound including deuterium can be prepared using known deuteration reactions. According to one embodiment of the present specification, the compound of Chemical Formula 1 or 2 can be formed using a deuterated compound as a precursor, or can also be obtained by introducing deuterium to the compound through a hydrogen-deuterium exchange reaction using a deuterated solvent under an acid catalyst.

Hereinafter, Chemical Formula 1 will be described.

According to one embodiment of the present specification, Ar1 bonds to R1 or R2 of the following Chemical Formula A. When R1 or R2 of the following Chemical Formula A is linked to anthracene, electron injection and transfer abilities become strong, which improves a driving voltage.

[Chemical Formula A]

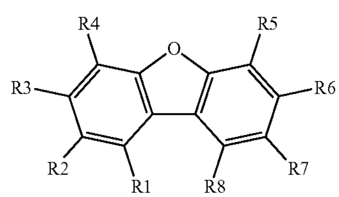

In Chemical Formula A, a substituent among R1 and R2 not bonding to Ar1, and substituents R3 to R8 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

In another embodiment, Ar1 is a bond to R1 of Chemical Formula A.

In another embodiment, Ar1 is a bond to R2 of Chemical Formula A.

According to one embodiment of the present specification, Chemical Formula 1 is the following Chemical Formula 1-1 or 1-2:

[Chemical Formula 1-1]

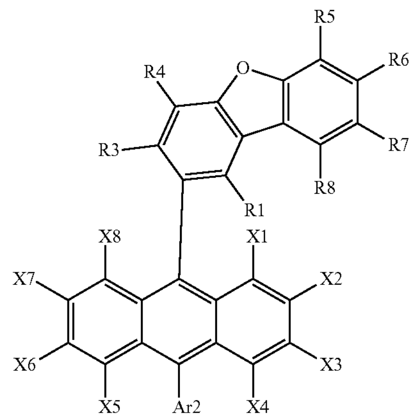

[Chemical Formula 1-2]

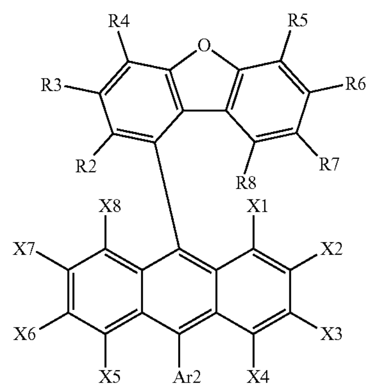

wherein in Chemical Formulae 1-1 and 1-2:

R1 to R8, X1 to X8 and Ar2 have the same definitions as in Chemical Formula 1 and Chemical Formula A.

According to one embodiment of the present specification, the substituent among R1 and R2 not bonding to Ar1, and substituents R3 to R8 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms, or bond to adjacent groups to form a substituted or unsubstituted aromatic hydrocarbon ring having 6 to 30 carbon atoms.

In another embodiment, the substituent among R1 and R2 not bonding to Ar1, and substituents R3 to R8 are the same as or different from each other, and each independently is hydrogen, deuterium, a substituted or unsubstituted phenyl group, a substituted or unsubstituted naphthyl group, a substituted or unsubstituted dibenzofuran group, or a substituted or unsubstituted dibenzothiophene group, or bond to adjacent groups to form a substituted or unsubstituted benzene ring.

According to one embodiment of the present specification, one or more of the substituent among R1 and R2 not bonding to Ar1 and substituents R3 to R8 are a substituted or unsubstituted aryl group, or a substituted or unsubstituted heteroaryl group, and the rest are the same as or different from each other and each independently hydrogen or deuterium, or bond to adjacent groups to form a substituted or unsubstituted ring. When Chemical Formula A is substituted with one or more aryl groups or heteroaryl groups, an effect of reducing a driving voltage is obtained due to changes in the electron distribution of the substituents bonding to Chemical Formula A.

According to another embodiment, one or more of the substituent among R1 and R2 not bonding to Ar1 and substituents R3 to R8 are a substituted or unsubstituted aryl group having 6 to 30 carbon atoms, or a substituted or unsubstituted heteroaryl group having 2 to 30 carbon atoms, and the rest are the same as or different from each other and each independently is hydrogen or deuterium, or bond to adjacent groups to form a substituted or unsubstituted aromatic hydrocarbon ring having 6 to 30 carbon atoms.

In another embodiment, one or more of the substituent among R1 and R2 not bonding to Ar1 and substituents R3 to R8 are a substituted or unsubstituted phenyl group, a substituted or unsubstituted naphthyl group, a substituted or unsubstituted dibenzofuran group, or a substituted or unsubstituted dibenzothiophene group, or bond to adjacent groups to form a substituted or unsubstituted benzene ring.

According to one embodiment of the present specification, in Chemical Formula A, R3 and R4 bond to each other to form a substituted or unsubstituted benzene ring.

According to one embodiment of the present specification, in Chemical Formula A, R5 and R6 bond to each other to form a substituted or unsubstituted benzene ring.

According to one embodiment of the present specification, in Chemical Formula A, R6 and R7 bond to each other to form a substituted or unsubstituted benzene ring.

According to one embodiment of the present specification, in Chemical Formula A, R7 and R8 bond to each other to form a substituted or unsubstituted benzene ring.

In one embodiment of the present specification, Chemical Formula A is any one of the following Chemical Formulae A-1 to A-4:

[Chemical Formula A-1]

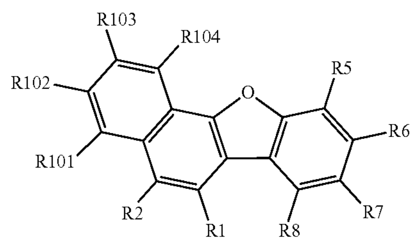

[Chemical Formula A-2]

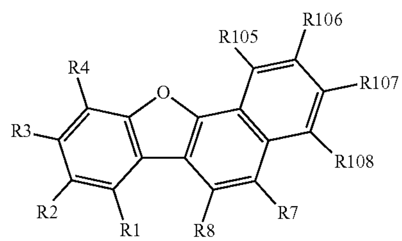

[Chemical Formula A-3]

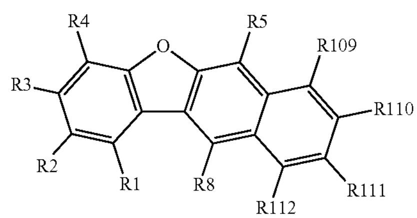

-continued

[Chemical Formula A-4]

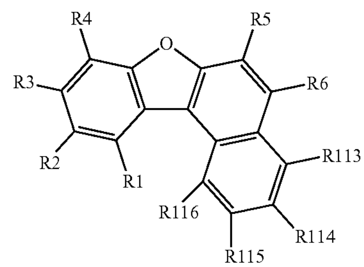

wherein in Chemical Formulae A-1 to A-4:

R1 to R8 have the same definitions as in Chemical Formula A;

R101 to R116 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

Chemical Formula 1 is any one of the following Chemical Formulae 1-10 to 1-17:

[Chemical Formula 1-10]

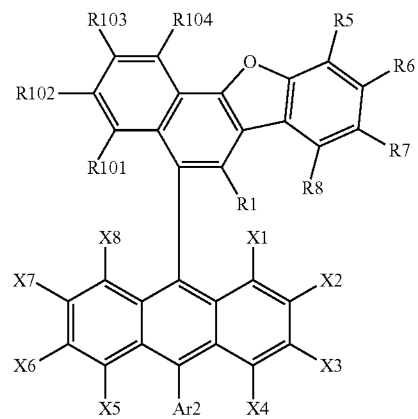

[Chemical Formula 1-11]

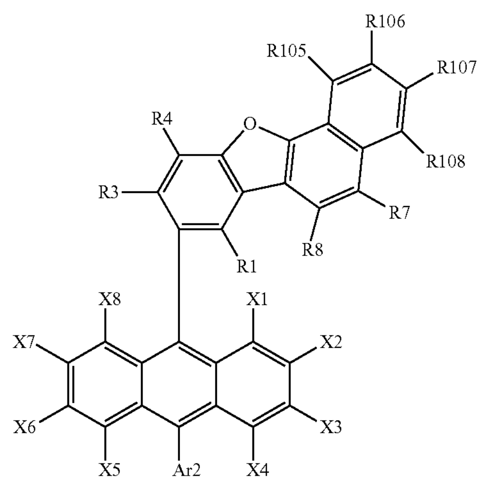

-continued

[Chemical Formula 1-12]

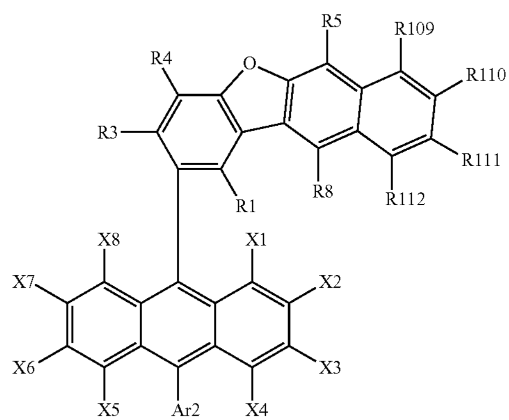

[Chemical Formua 1-13]

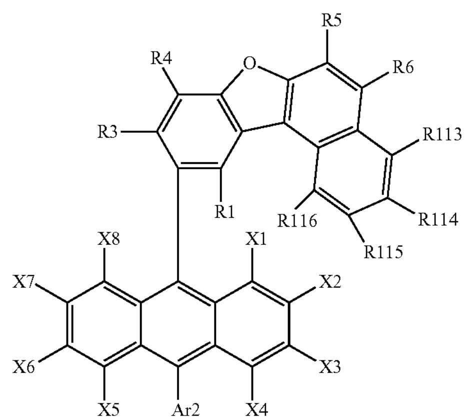

[Chemical Formula 1-14]

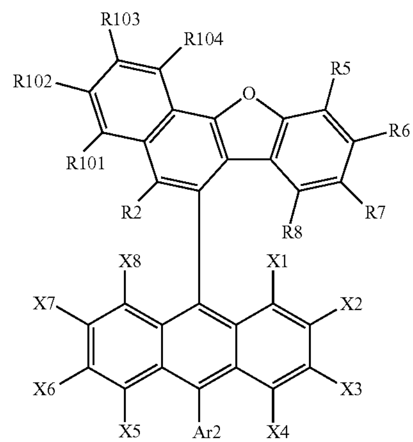

-continued

[Chemical Formula 1-15]

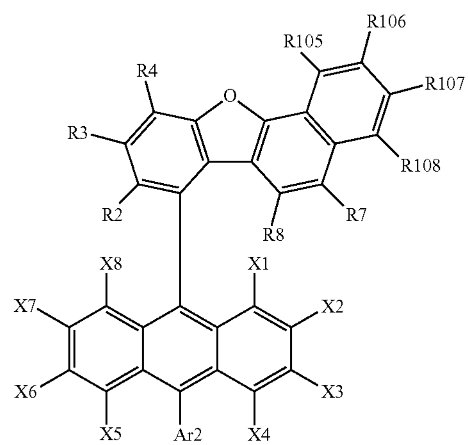

[Chemical Formula 1-16]

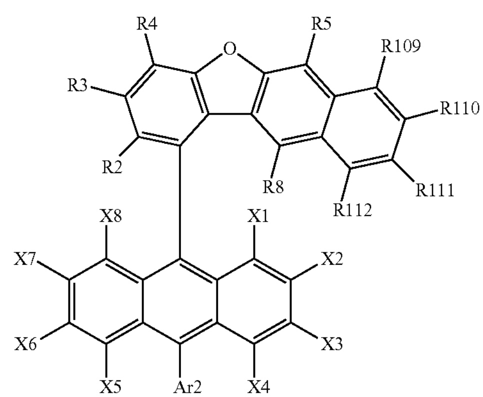

[Chemical Formula 1-17]

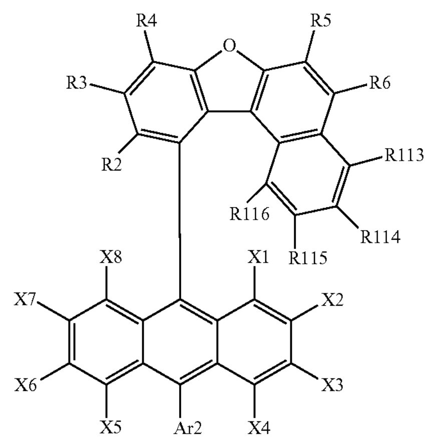

wherein in Chemical Formulae 1-10 to 1-17:

R1 to R8, X1 to X8 and Ar2 have the same definitions as in Chemical Formula 1 and Chemical Formula A; and R101 to R116 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

According to one embodiment of the present specification, R101 to R116 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms, or bond to adjacent groups to form a substituted or unsubstituted aromatic hydrocarbon ring having 6 to 30 carbon atoms.

According to another embodiment, R101 to R116 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms.

In another embodiment, R101 to R116 are hydrogen.

According to one embodiment of the present specification, X1 to X8 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms.

According to another embodiment, X1 to X8 are the same as or different from each other, and each independently is hydrogen or deuterium.

In another embodiment, X1 to X8 are each hydrogen.

According to another embodiment, X1 to X8 are each deuterium.

According to one embodiment of the present specification, Ar2 is a phenyl group that is unsubstituted or substituted with an aryl group having 6 to 30 carbon atoms. When Ar2 is a phenyl or higher fused ring or heteroaryl group, substituents of Ar2 can inhibit ET (electron transporting) properties of the dibenzofuran group of Chemical Formula A. However, when Ar2 is a phenyl group, low voltage/long lifetime/low efficiency properties of Chemical Formula A can be maximized.

In another embodiment, Ar2 is a phenyl group that is unsubstituted or substituted with a phenyl group or a naphthyl group.

In one embodiment of the present specification, Chemical Formula 1 is deuterated by 50% or greater. In another embodiment, Chemical Formula 1 is deuterated by 60% or greater. In another embodiment, Chemical Formula 1 is deuterated by 70% or greater. In another embodiment, Chemical Formula 1 is deuterated by 80% or greater. In another embodiment, Chemical Formula 1 is deuterated by 90% or greater. In another embodiment, Chemical Formula 1 is 100% deuterated.

In one embodiment of the present specification, the compound of Chemical Formula 1 can be selected from among the following compounds, but is not limited thereto:

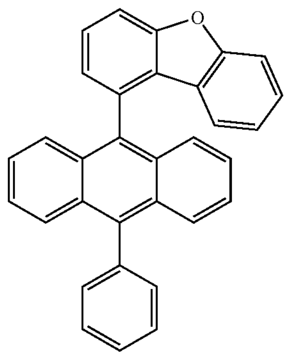

-continued

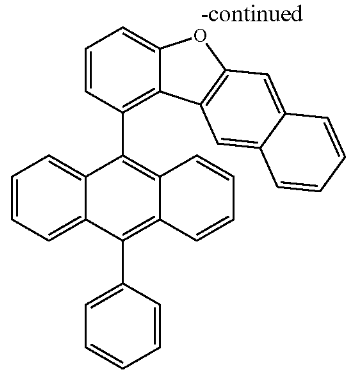

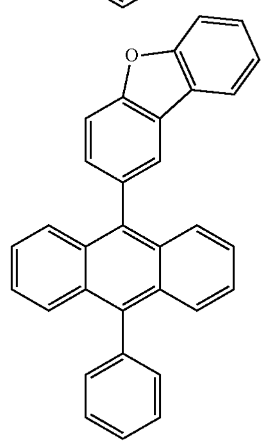

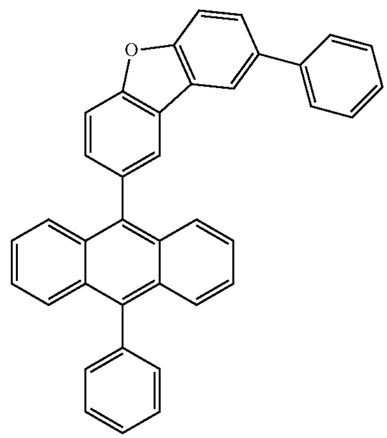

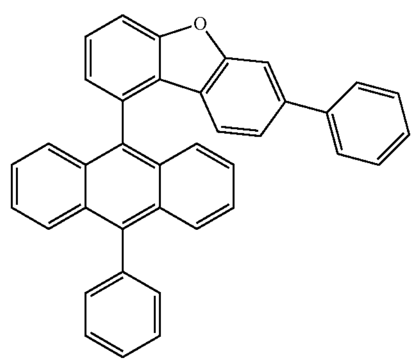

-continued
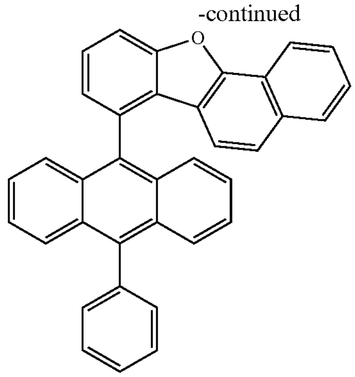
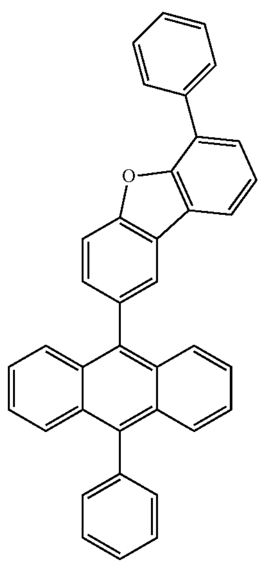
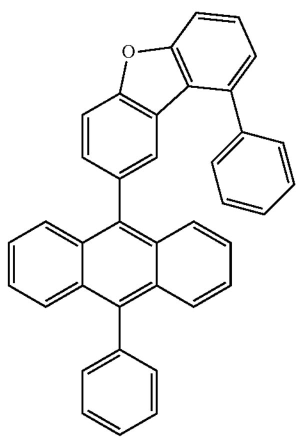
-continued
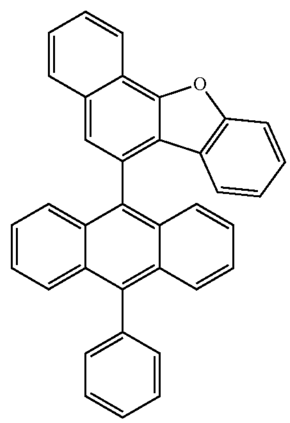
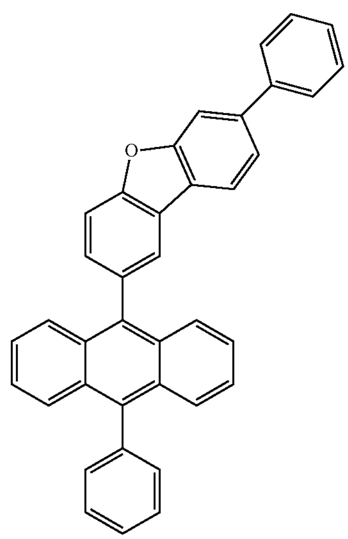
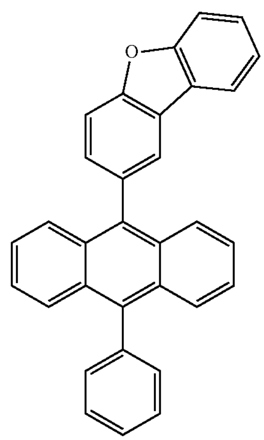

-continued
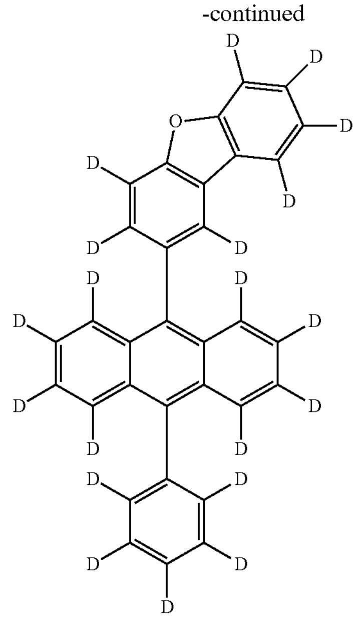
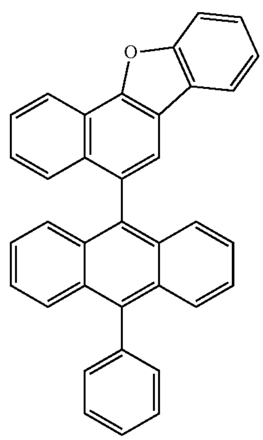
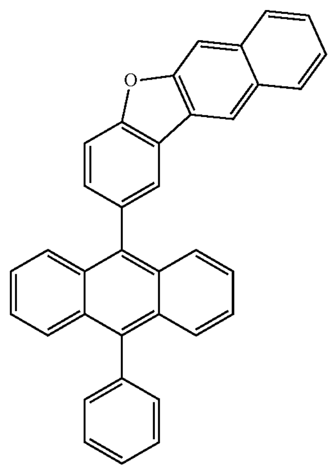
-continued
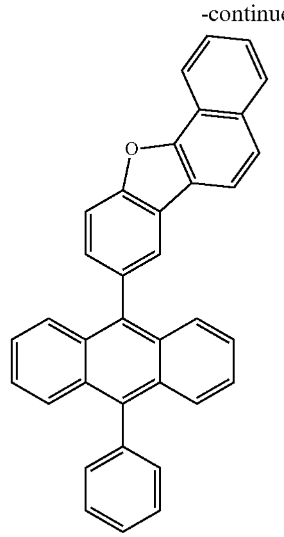
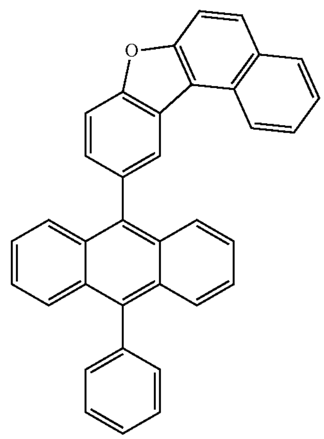
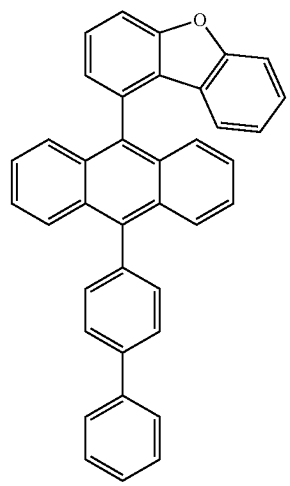

-continued
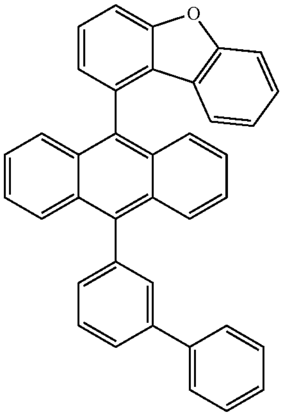
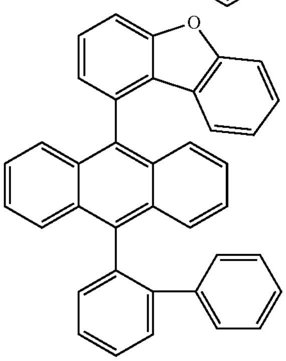
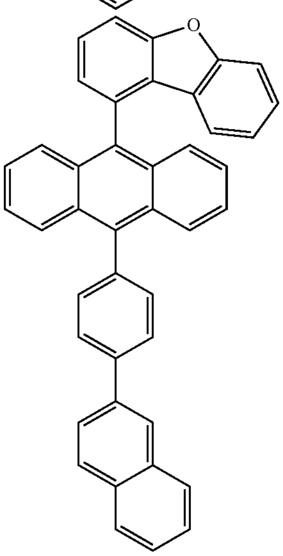
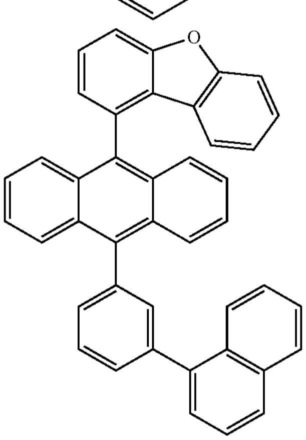
-continued
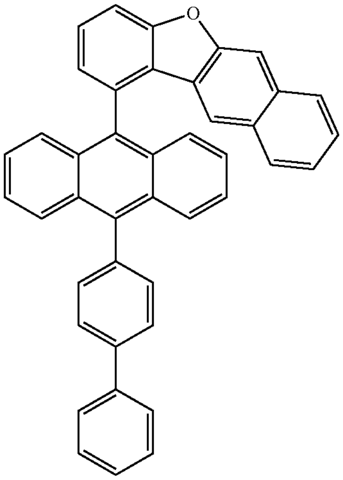
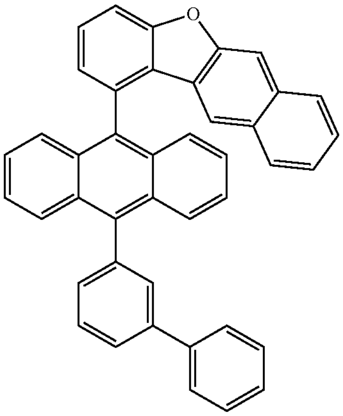
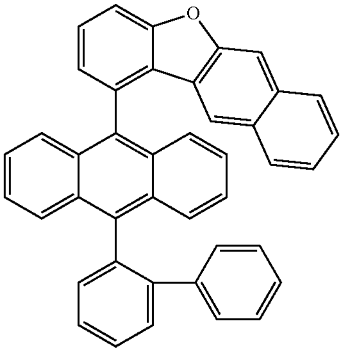

-continued
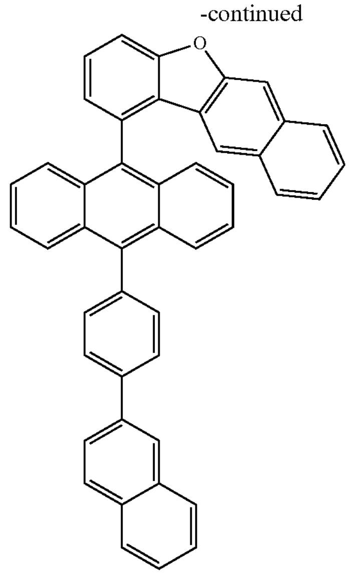
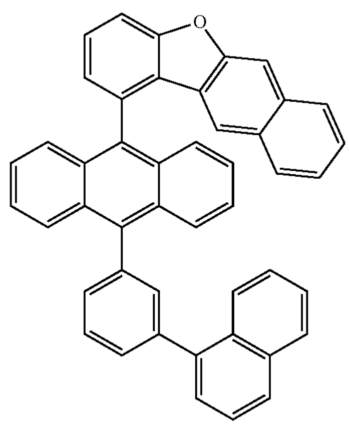
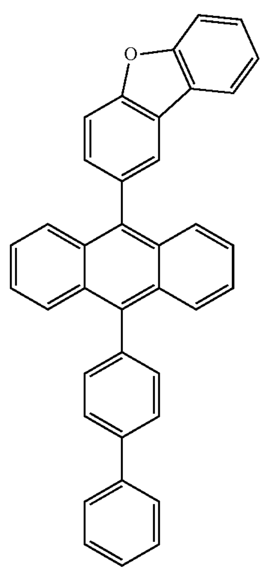
-continued
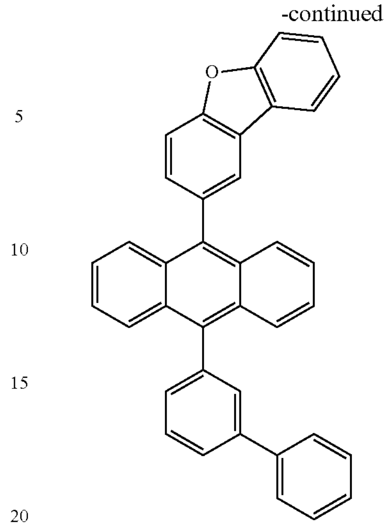
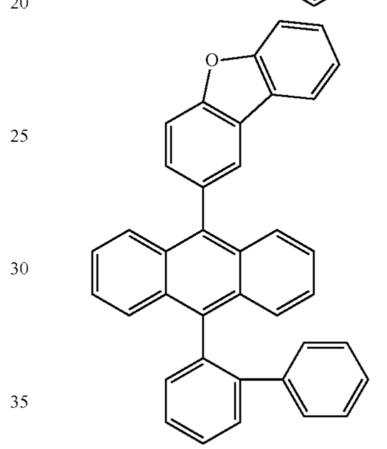
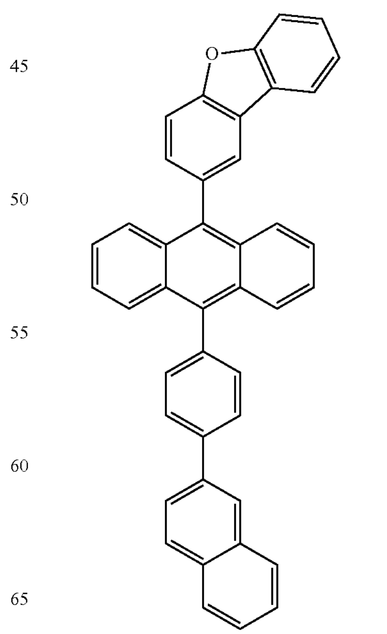

-continued
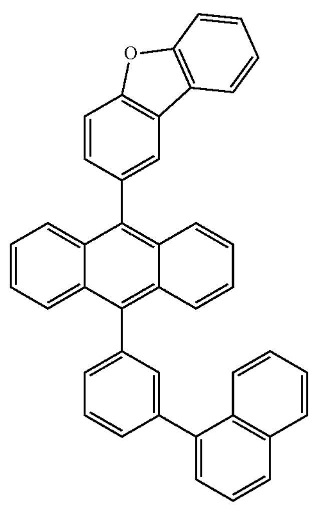
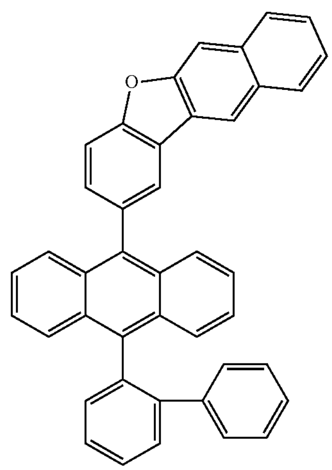
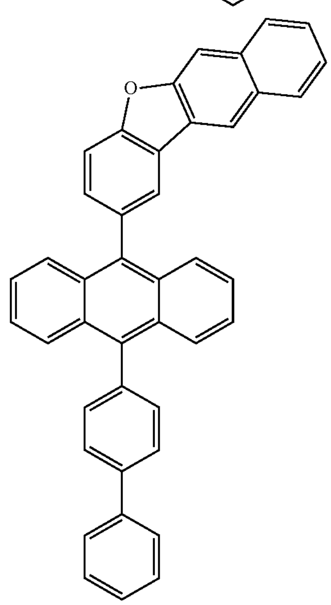
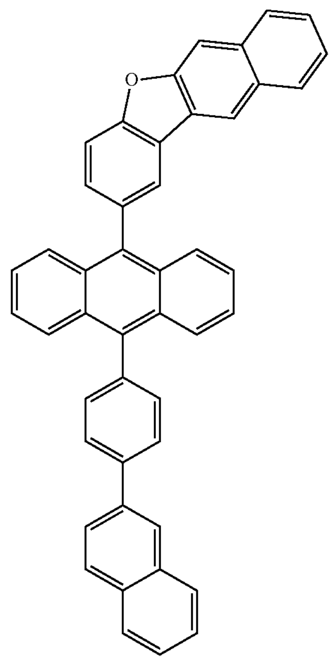
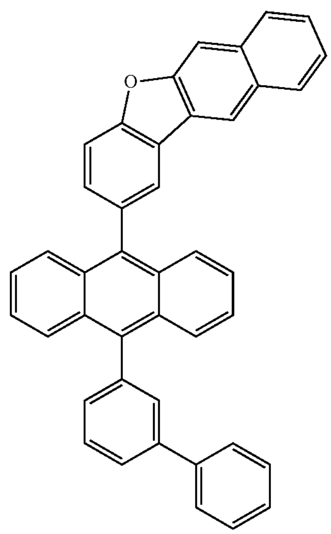
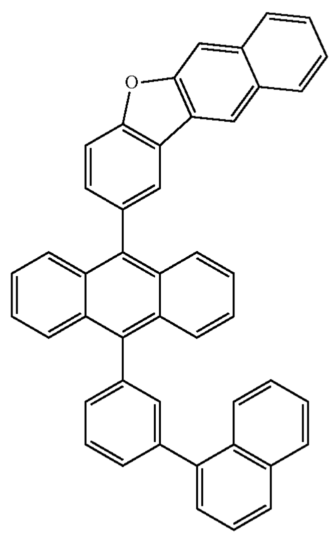
-continued -continued
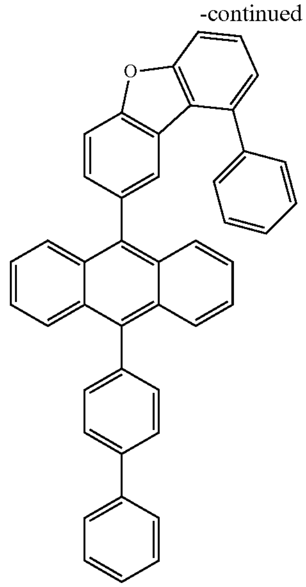
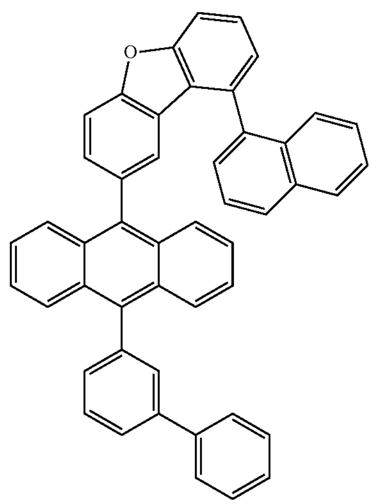
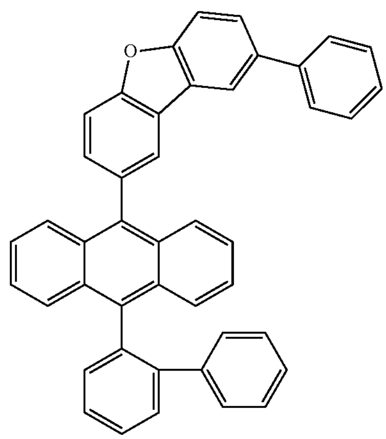
-continued
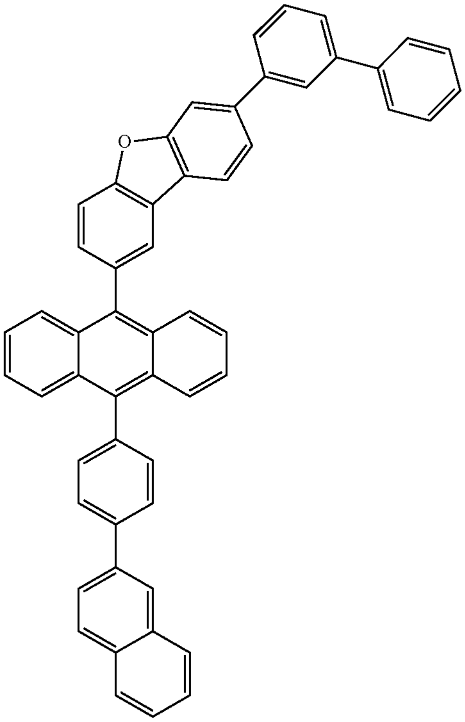
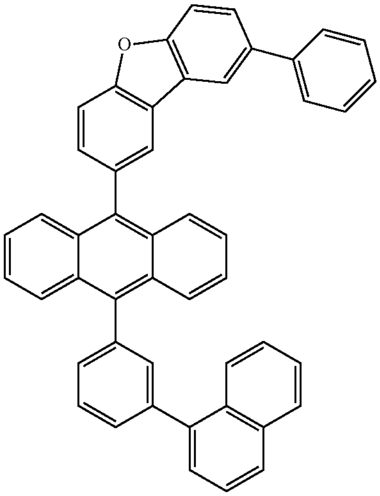
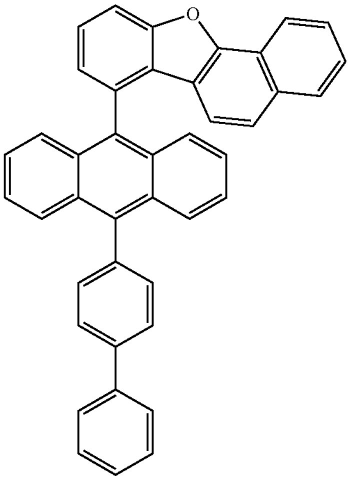

-continued
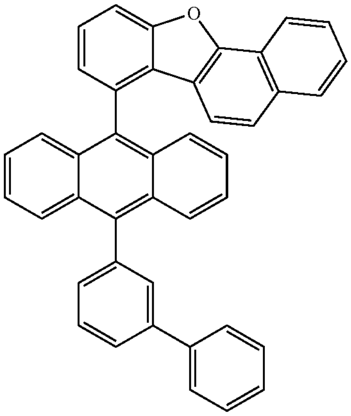
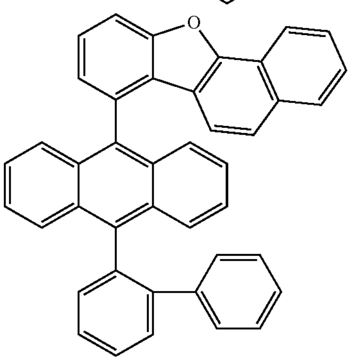
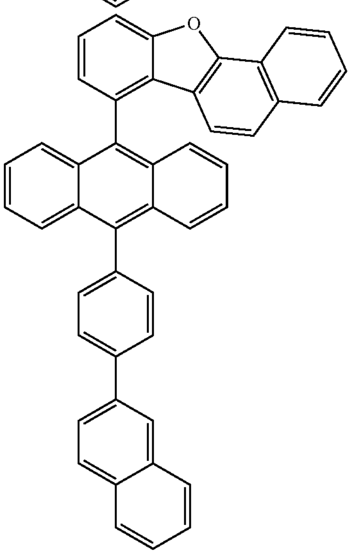
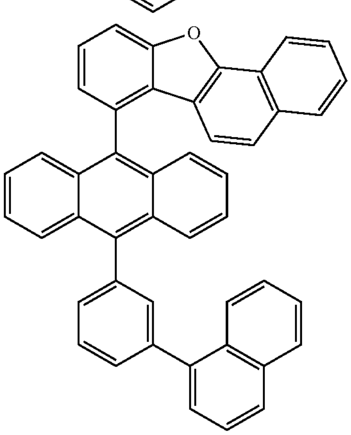
-continued
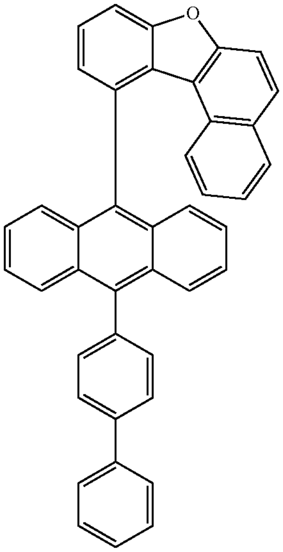
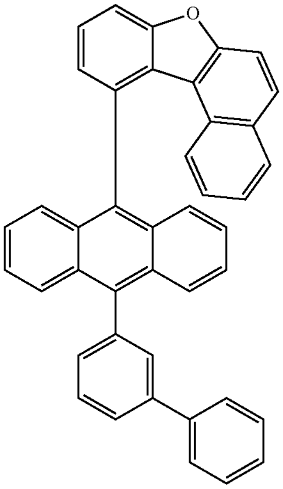
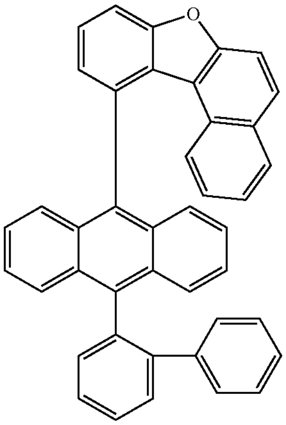

-continued
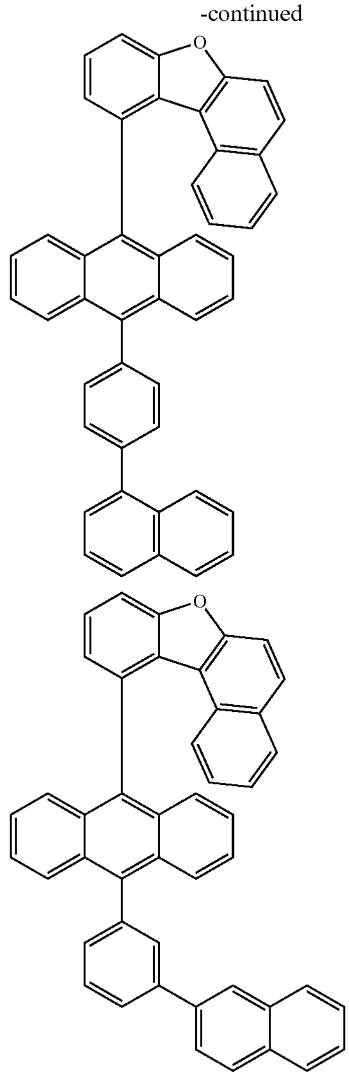
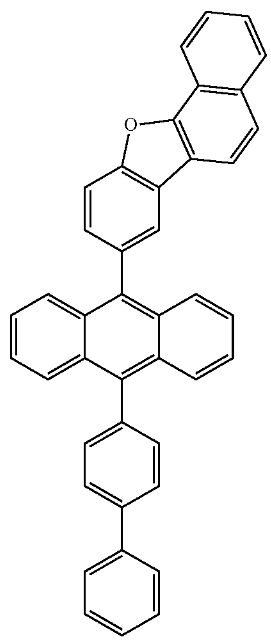
-continued
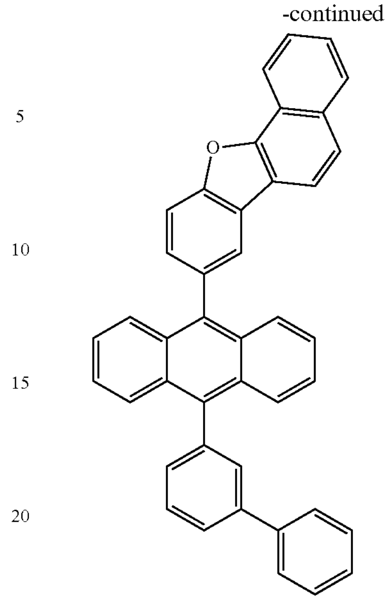
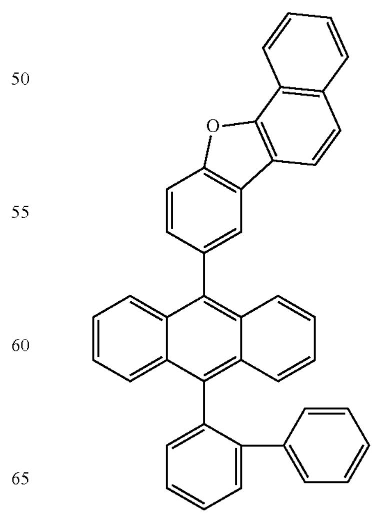

-continued
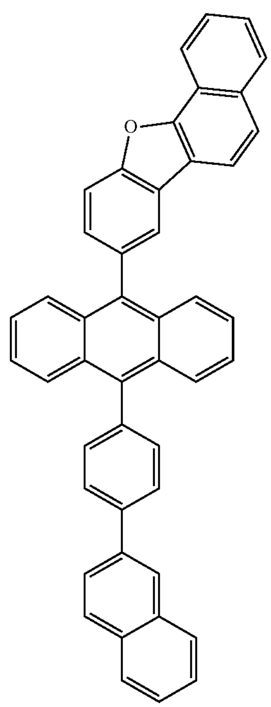
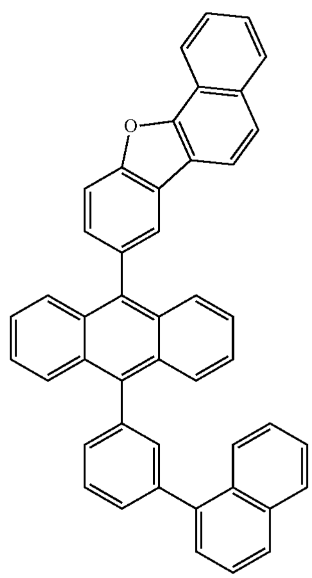
-continued
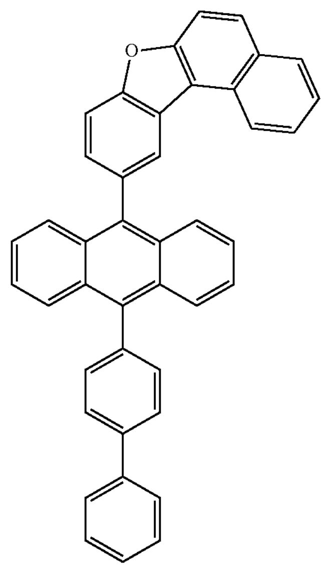
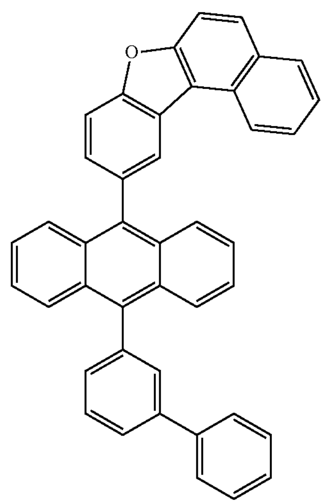
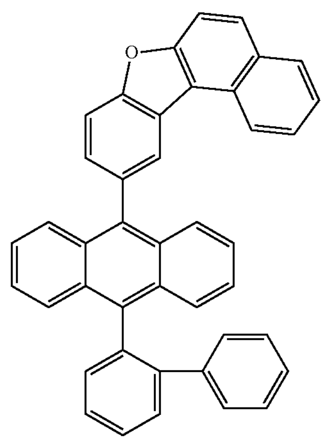

-continued
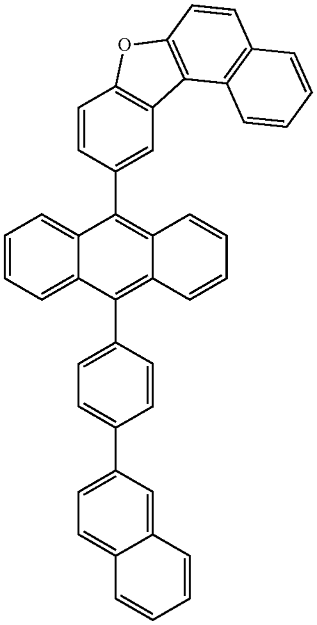
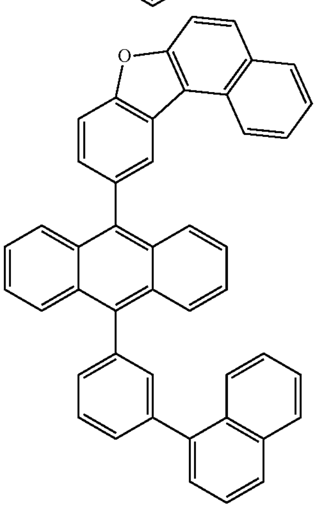
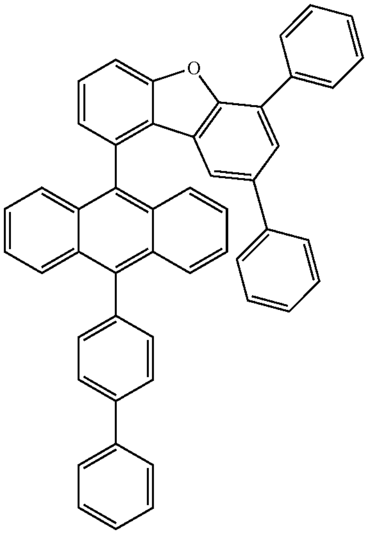
-continued
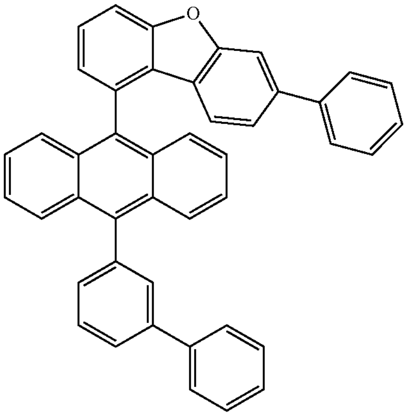
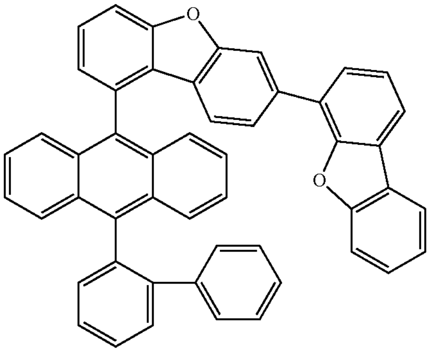
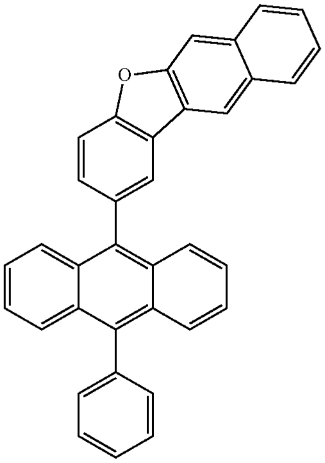
Hereinafter, Chemical Formula 2 will be described.
According to one embodiment of the present specification, Cy1 is a bond to R11 or R12 of the following Chemical Formula B. When R11 or R12 of the following Chemical Formula B is linked to anthracene, electron injection and transfer abilities become strong, which improves a driving voltage.

[Chemical Formula B]

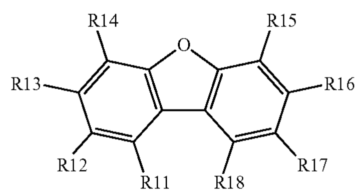

In Chemical Formula B:

a substituent among R11 and R12 not bonding to Cy1, and substituents R13 to R18 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

In another embodiment, Cy1 is a bond to R11 of Chemical Formula B.

In another embodiment, Cy1 is a bond to R12 of Chemical Formula B.

According to one embodiment of the present specification, Chemical Formula 2 is Chemical Formula 2-1 or 2-2:

[Chemical Formula 2-1]

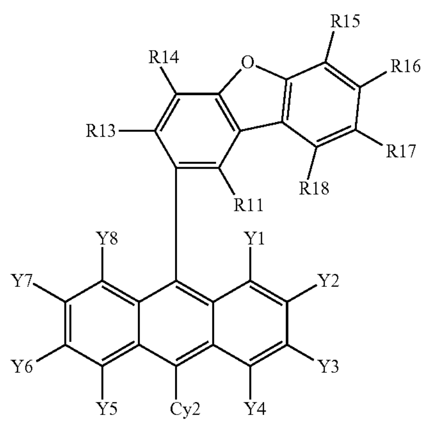

[Chemical Formula 2-2]

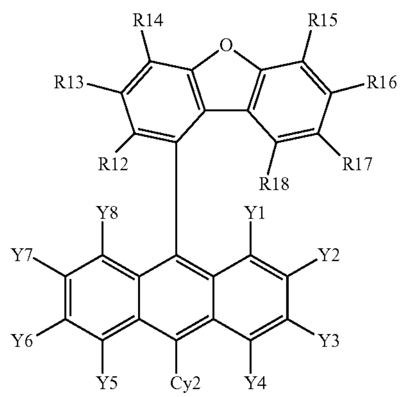

wherein in Chemical Formulae 2-1 and 2-2:

R11 to R18, Y1 to Y8 and Cy2 have the same definitions as in Chemical Formula 2 and Chemical Formula B.

According to one embodiment of the present specification, the substituent among R11 and R12 not bonding to Cy1, and substituents R13 to R18 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms, or bond to adjacent groups to form a substituted or unsubstituted aromatic hydrocarbon ring having 6 to 30 carbon atoms.

In another embodiment, the substituent among R11 and R12 not bonding to Cy1, and substituents R13 to R18 are the same as or different from each other, and each independently is hydrogen, deuterium, a substituted or unsubstituted phenyl group, a substituted or unsubstituted naphthyl group, a substituted or unsubstituted dibenzofuran group, or a substituted or unsubstituted dibenzothiophene group, or bond to adjacent groups to form a substituted or unsubstituted benzene ring.

According to one embodiment of the present specification, one or more of the substituent among R11 and R12 not bonding to Cy1 and substituents R13 to R18 are a substituted or unsubstituted aryl group, or a substituted or unsubstituted heteroaryl group, and the rest are the same as or different from each other and each independently is hydrogen or deuterium, or bond to adjacent groups to form a substituted or unsubstituted ring. When Chemical Formula B is substituted with one or more aryl groups or heteroaryl groups, an effect of reducing a driving voltage is obtained due to changes in the electron distribution of the substituents bonding to Chemical Formula B.

According to another embodiment, one or more of the substituent among R11 and R12 not bonding to Cy1 and substituents R13 to R18 are a substituted or unsubstituted aryl group having 6 to 30 carbon atoms, or a substituted or unsubstituted heteroaryl group having 2 to 30 carbon atoms, and the rest are the same as or different from each other and each independently is hydrogen or deuterium, or a substituted or unsubstituted heteroaryl group having 2 to 30 carbon atoms, or bond to adjacent groups to form a substituted or unsubstituted aromatic hydrocarbon ring having 6 to 30 carbon atoms.

In another embodiment, one or more of the substituent among R11 and R12 not bonding to Cy1 and substituents R13 to R18 are a substituted or unsubstituted phenyl group, a substituted or unsubstituted naphthyl group, a substituted or unsubstituted dibenzofuran group, or a substituted or unsubstituted dibenzothiophene group, or bond to each other to form a substituted or unsubstituted benzene ring.

According to one embodiment of the present specification, in Chemical Formula B, R13 and R14 bond to each other to form a substituted or unsubstituted benzene ring.

According to one embodiment of the present specification, in Chemical Formula B, R15 and R16 bond to each other to form a substituted or unsubstituted benzene ring.

According to one embodiment of the present specification, in Chemical Formula B, R16 and R17 bond to each other to form a substituted or unsubstituted benzene ring.

According to one embodiment of the present specification, in Chemical Formula B, R17 and R18 bond to each other to form a substituted or unsubstituted benzene ring.

According to one embodiment of the present specification, Chemical Formula B is any one of the following Chemical Formulae B-1 to B-4:

[Chemical Formula B-1]

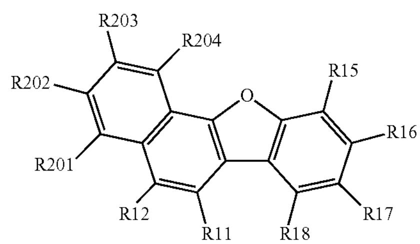

[Chemical Formula B-2]

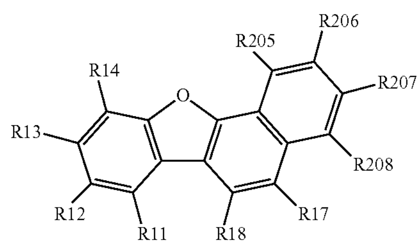

[Chemical Formula B-3]

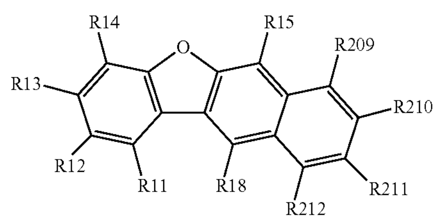

[Chemical Formula B-4]

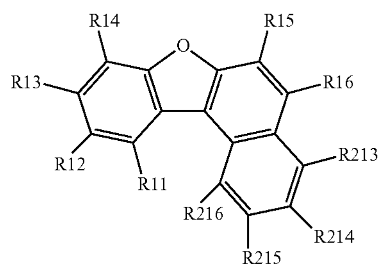

wherein in Chemical Formulae B-1 to B-4:

R11 to R18 have the same definitions as in Chemical Formula B;

R201 to R216 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

According to one embodiment of the present specification, Chemical Formula 2 is any one of the following Chemical Formulae 2-10 to 2-17:

[Chemical Formula 2-10]

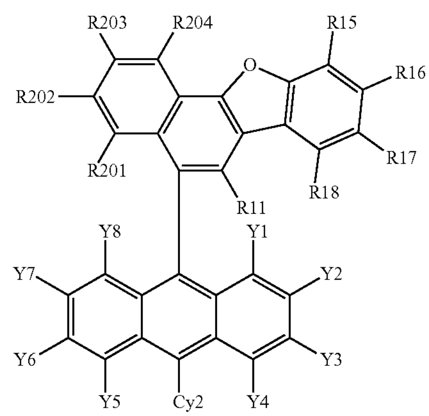

[Chemical Formula 2-11]

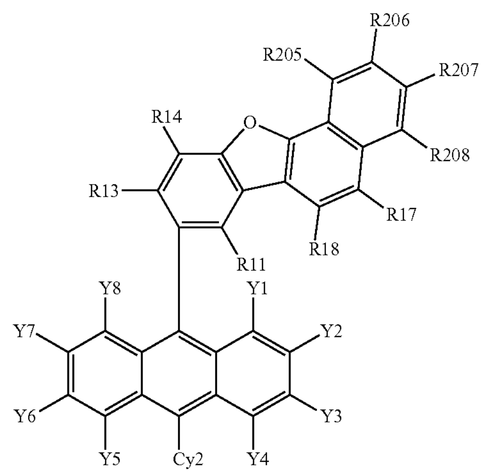

[Chemical Formula 2-12]

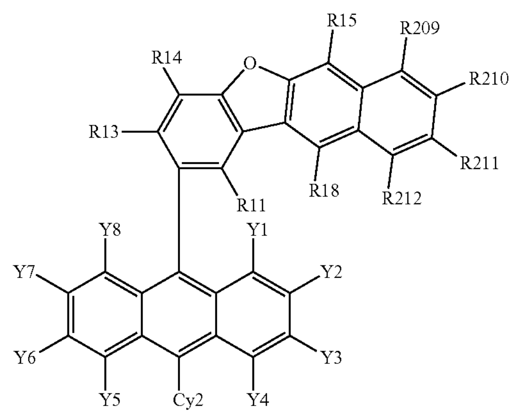

-continued

[Chemical Formula 2-13]

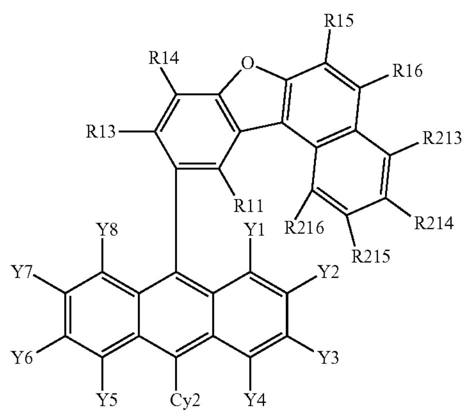

[Chemical Formula 2-14]

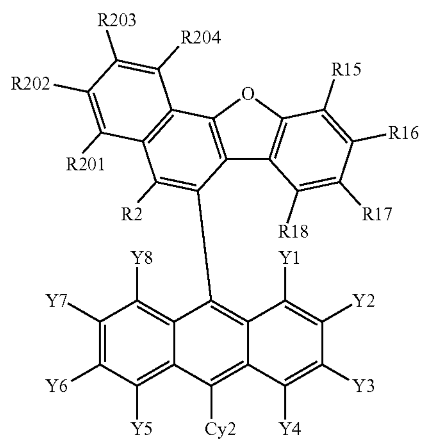

[Chemical Formula 2-15]

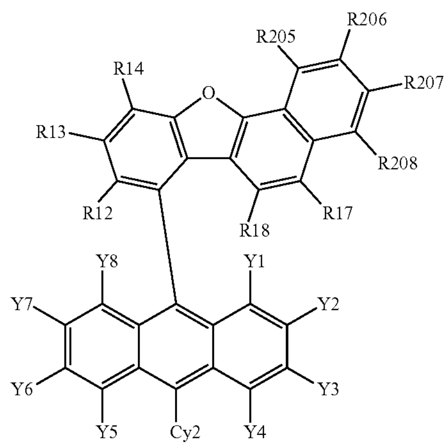

-continued

[Chemical Formula 2-16]

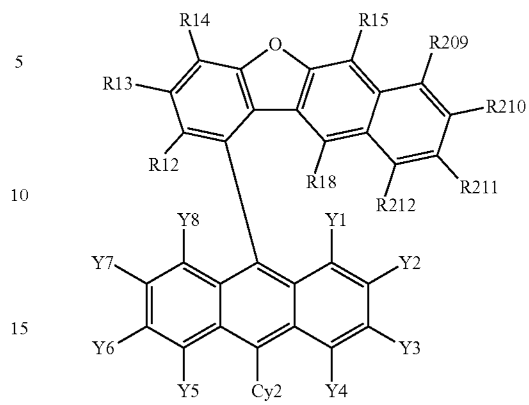

[Chemical Formula 2-17]

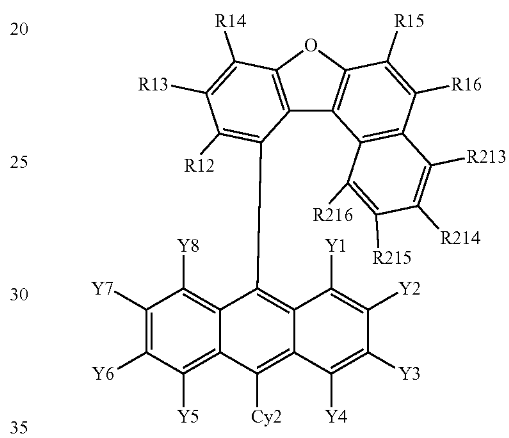

wherein in Chemical Formulae 2-10 to 2-17:

R11 to R18, Y1 to Y8 and Cy2 have the same definitions as in Chemical Formula 2 and Chemical Formula B; and R201 to R216 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

According to one embodiment of the present specification, R201 to R216 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms, or bond to adjacent groups to form a substituted or unsubstituted aromatic hydrocarbon ring having 6 to 30 carbon atoms.

According to another embodiment, R201 to R216 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms.

In another embodiment, R201 to R216 are hydrogen.

According to one embodiment of the present specification, Y1 to Y8 are the same as or different from each other, and each independently is hydrogen, deuterium, a substituted or unsubstituted aryl group having 6 to 30 carbon atoms, or a substituted or unsubstituted heteroaryl group having 2 to 30 carbon atoms.

According to another embodiment, Y1 to Y8 are the same as or different from each other, and each independently is hydrogen or deuterium.

In another embodiment, Y1 to Y8 are each hydrogen.

According to another embodiment, Y1 to Y8 are each deuterium.

According to one embodiment of the present specification, Cy2 is a substituted or unsubstituted fused aryl group having 10 to 20 carbon atoms. Herein, the fused aryl group means an aryl group in which two or more rings are fused. When Cy2 is a fused aryl group, a hole transfer ability is enhanced increasing device efficiency. In addition, Chemical Formula 2 can also have an excellent electron transfer ability by having a dibenzofuran-based substituent of Chemical Formula B. When the compound of Chemical Formula 1 is used therewith, low voltage/long lifetime properties can be recovered.

In one embodiment of the present specification, Cy2 is a substituted or unsubstituted naphthyl group, or a substituted or unsubstituted phenanthrenyl group.

According to another embodiment, Cy2 is a naphthyl group or a phenanthrenyl group.

In one embodiment of the present specification, Chemical Formula 2 is deuterated by 50% or greater. In another embodiment, Chemical Formula 2 is deuterated by 60% or greater. In another embodiment, Chemical Formula 2 is deuterated by 70% or greater. In another embodiment, Chemical Formula 2 is deuterated by 80% or greater. In another embodiment, Chemical Formula 2 is deuterated by 90% or greater. In another embodiment, Chemical Formula 2 is 100% deuterated.

In one embodiment of the present specification, a compound of Chemical Formula 2 can be selected from among the following compounds, but is not limited thereto:

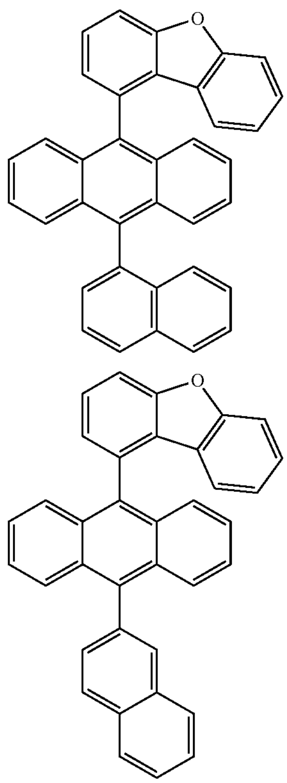

-continued

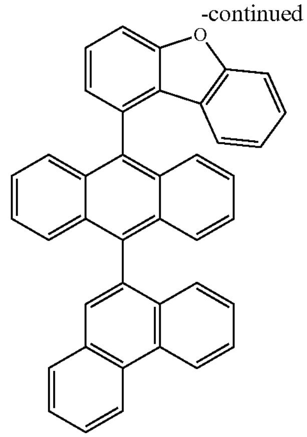

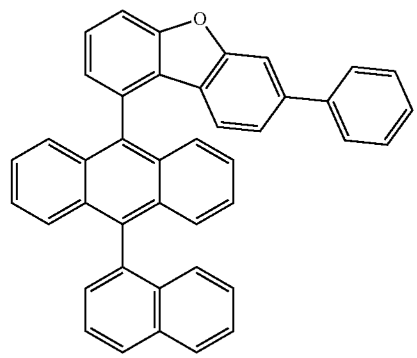

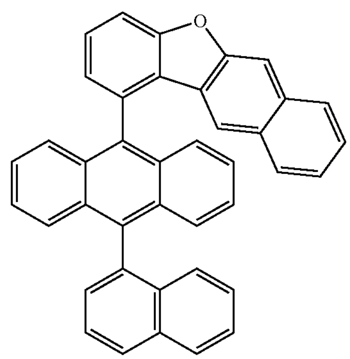

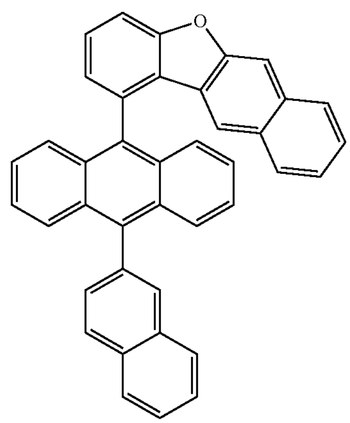

-continued
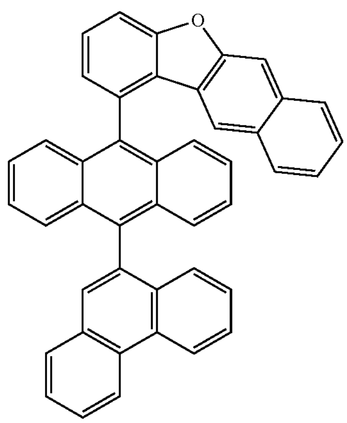
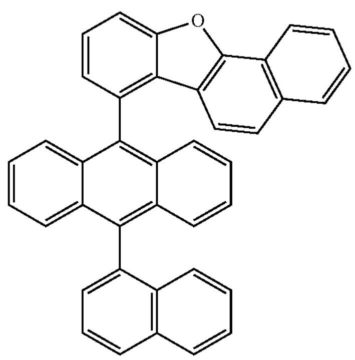
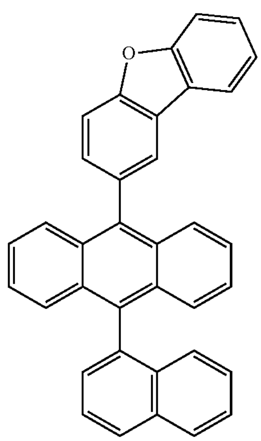
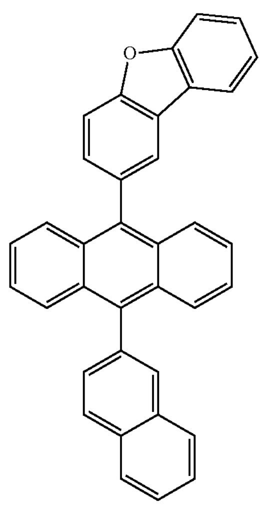
-continued
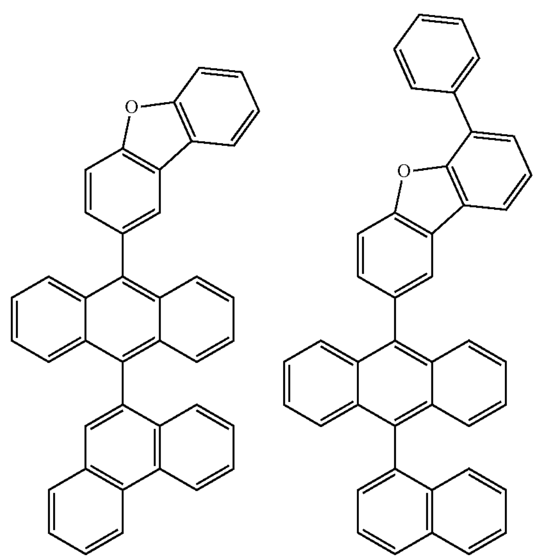
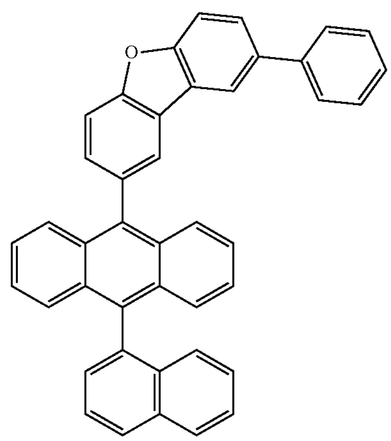
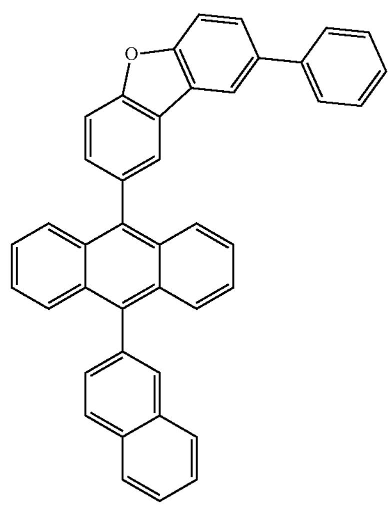

-continued
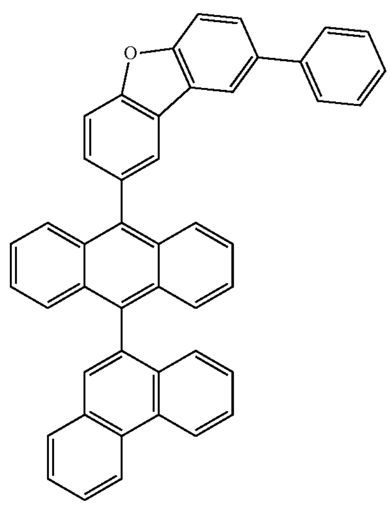
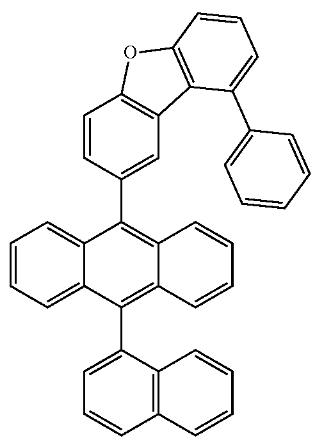
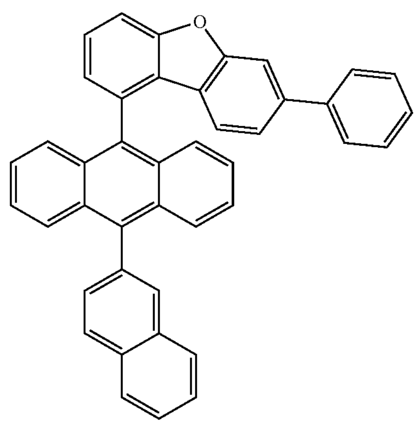
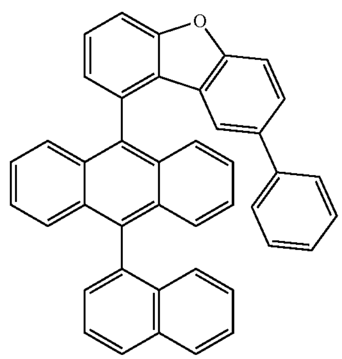
-continued
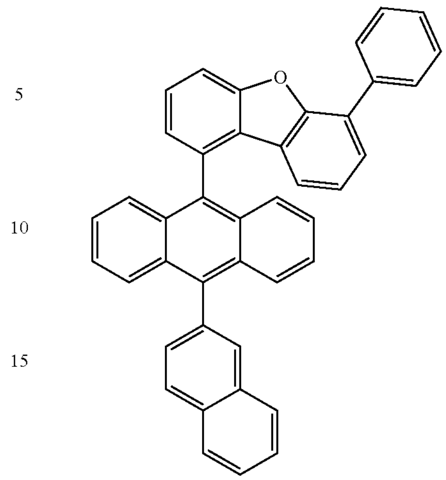
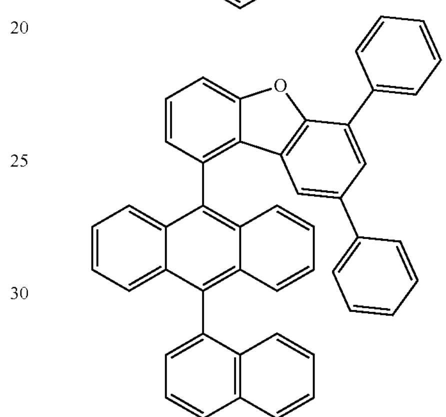
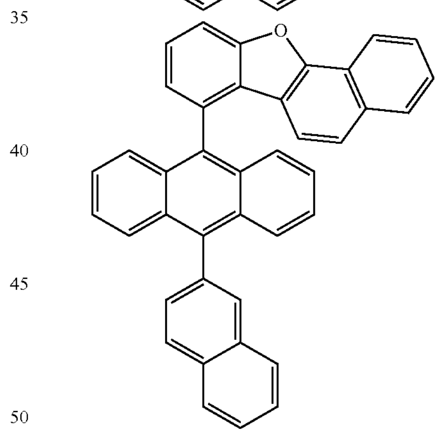
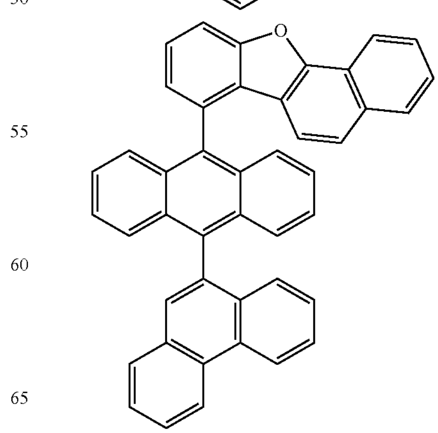

-continued
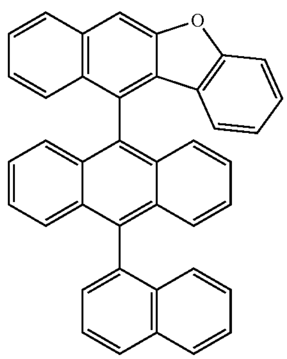
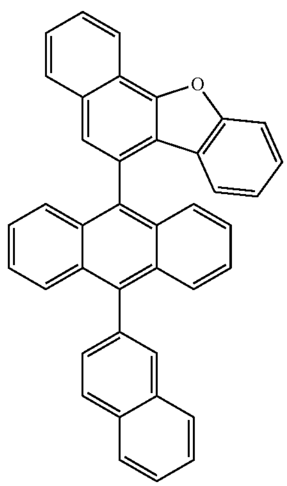
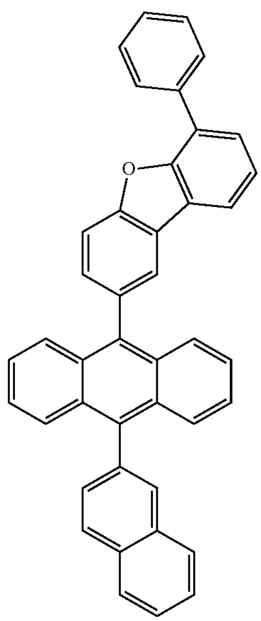
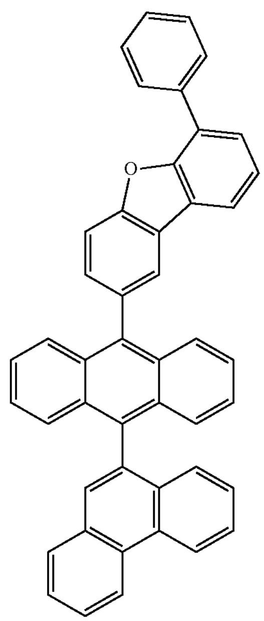
-continued
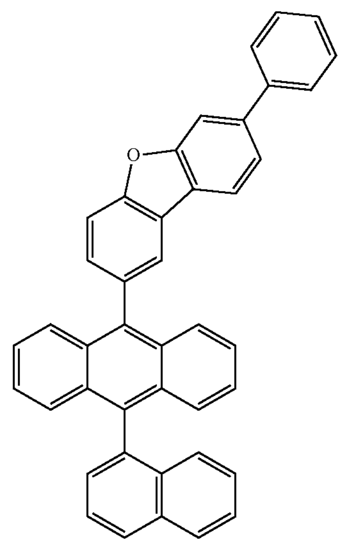
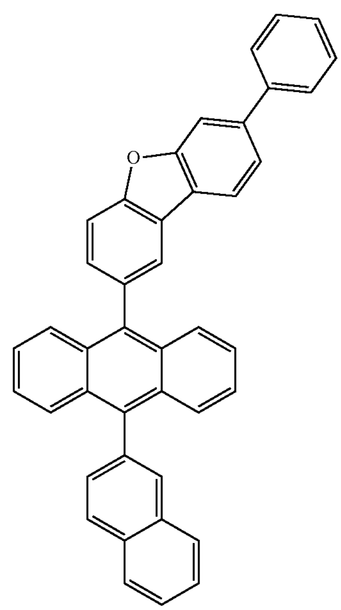
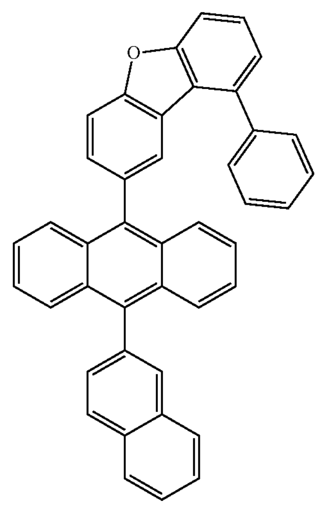

-continued
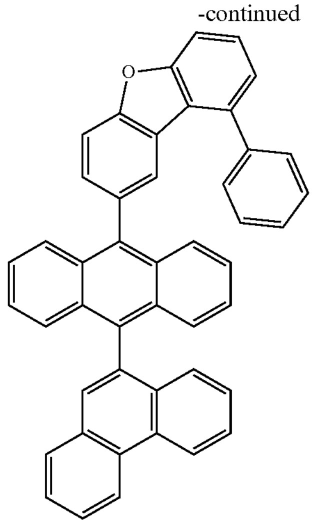
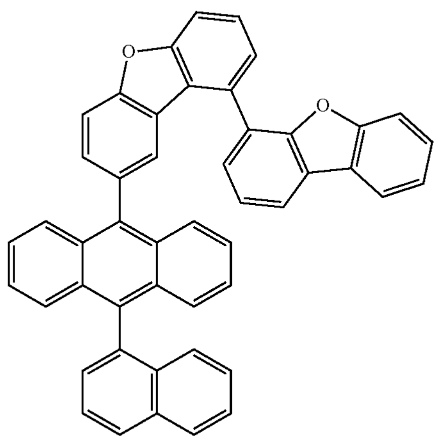
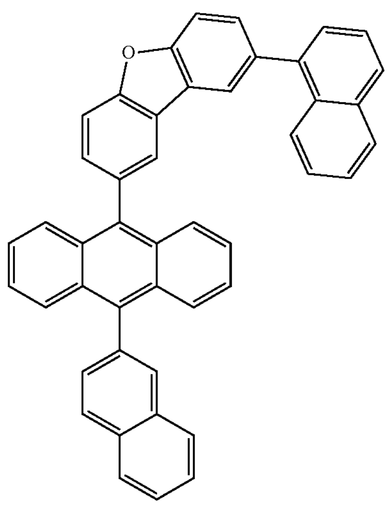
-continued
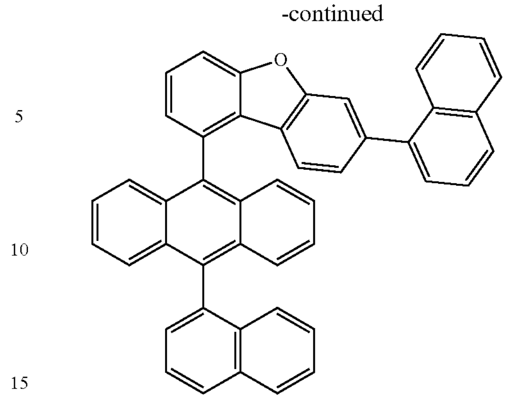
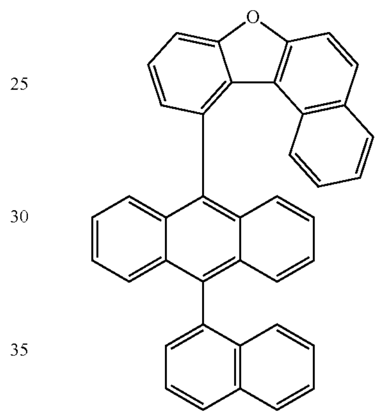
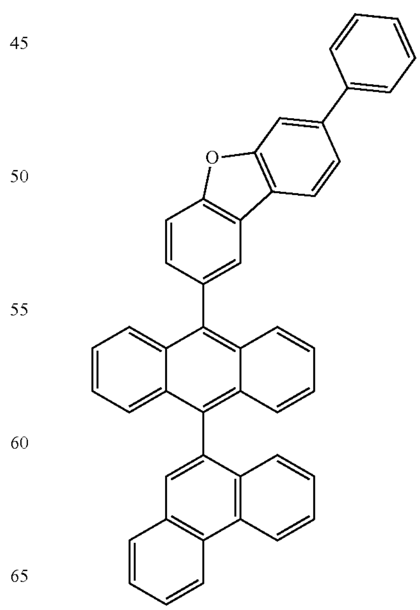

-continued
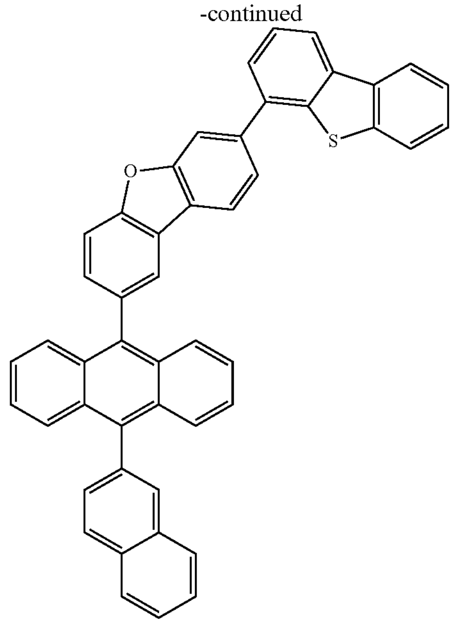
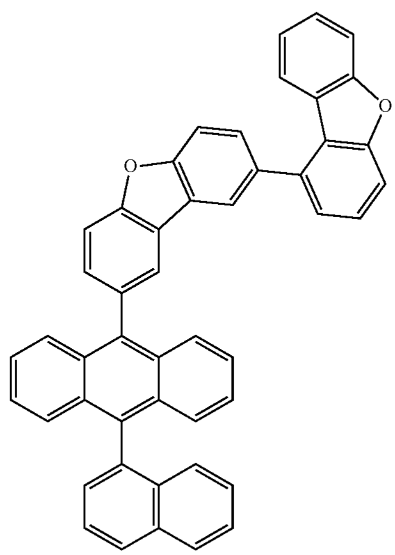
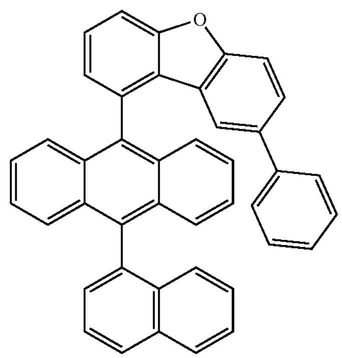
-continued
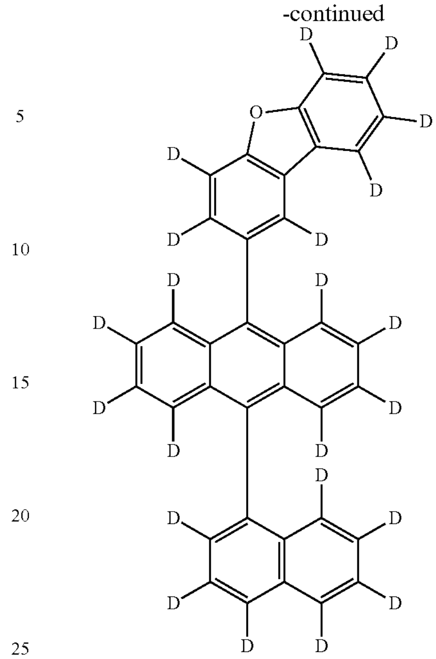
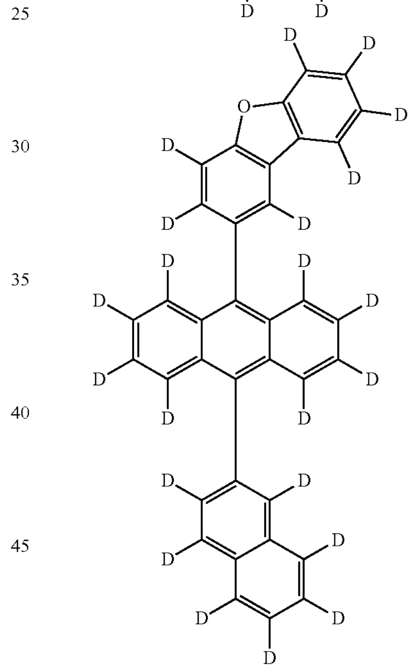
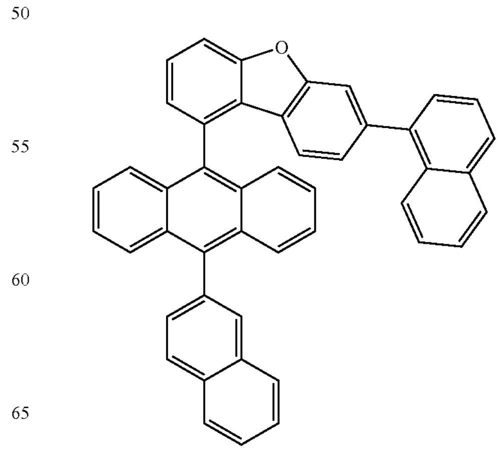

-continued
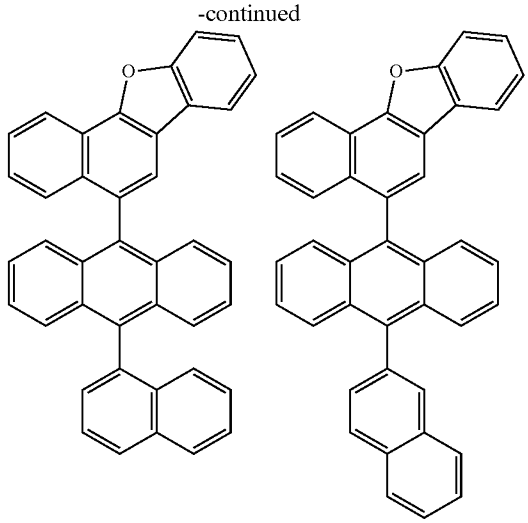
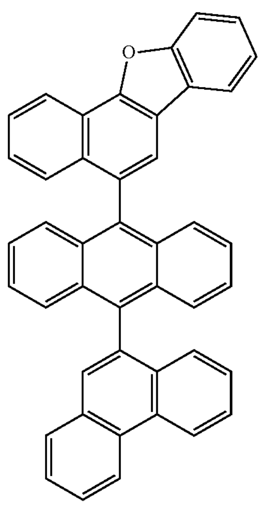
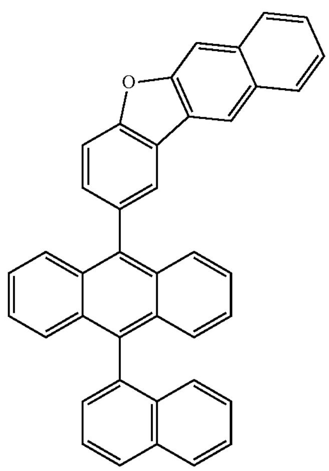
-continued
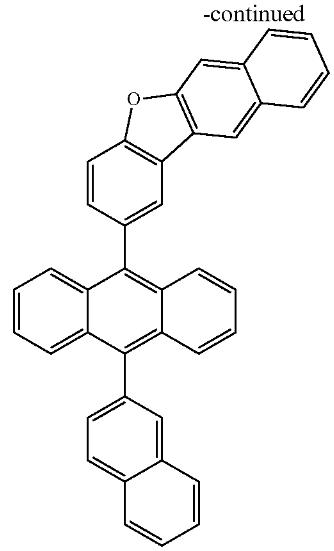
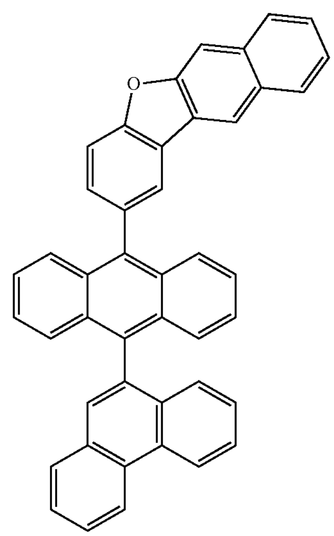
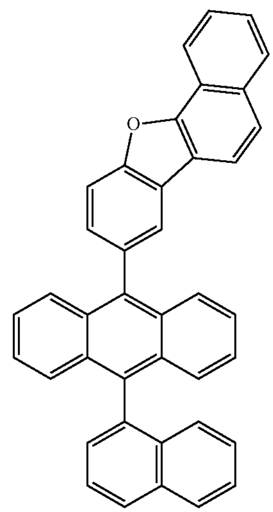

-continued

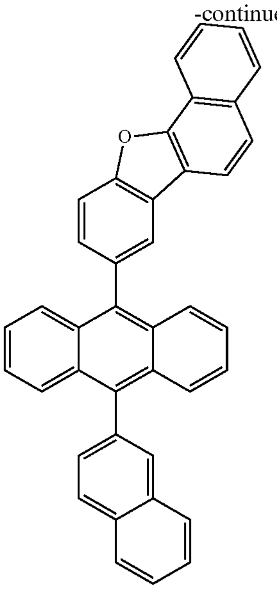

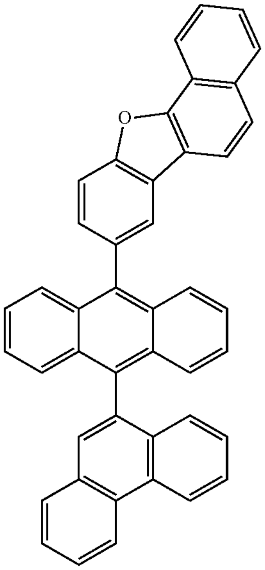

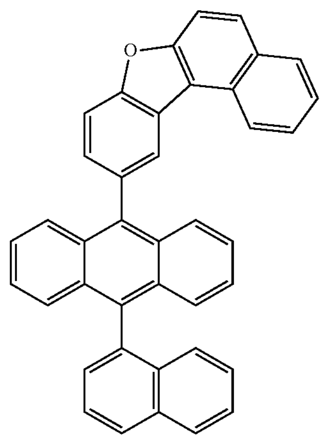

-continued

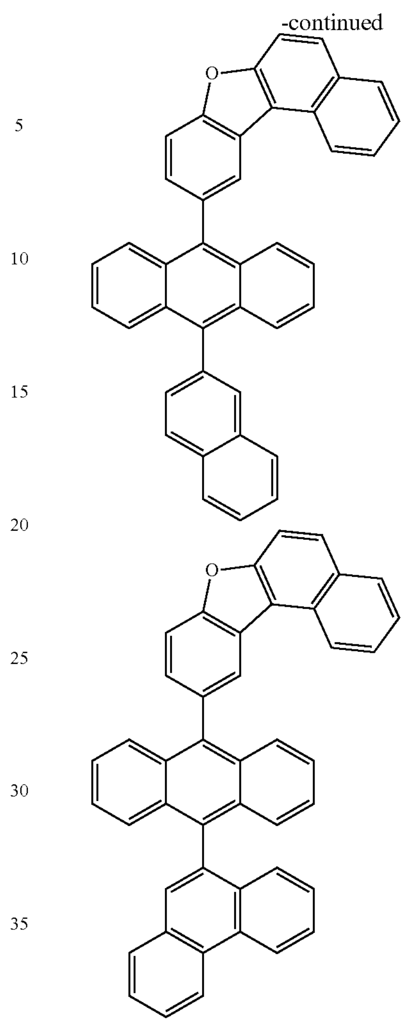

According to one embodiment of the present specification, the compound of Chemical Formula 1 and the compound of Chemical Formula 2 are included in a mass ratio (mass of Chemical Formula 1:mass of Chemical Formula 2) of 1:9 to 9:1 in a light emitting layer. According to another embodiment, the mass ratio is from 2:8 to 8:2, and is preferably from 4:6 to 6:4. When satisfying the above-mentioned range, efficiency can be maximized by the compound of Chemical Formula 2 while electron injection and migration smoothly occur by the compound of Chemical Formula 1. However, when the compounds are present in only a certain ratio or less, all advantages of Chemical Formulae 1 and 2 cannot be obtained.

In order to form a light emitting layer including the compound of Chemical Formula 1 and the compound of Chemical Formula 2, co-deposition of depositing the compound of Chemical Formula 1 and the compound of Chemical Formula 2 each through a different deposition source can be used, or a method of mixing the compound of Chemical Formula 1 and the compound of Chemical Formula 2 in advance (pre-mixing) and depositing with one deposition source can be used.

According to one embodiment of the present specification, as a material of the light emitting layer, the compound of Chemical Formula 1 and the compound of Chemical Formula 2 can be included as a blue fluorescent host, and an additional dopant material can be included. When using co-deposition to prepare a blue fluorescent light emitting layer having such a mixed host material, three deposition sources are generally required, which makes the process very complicated and expensive. Accordingly, by forming an organic material layer through pre-mixing two or more types of the materials among the three or more types of the compounds and evaporating from one deposition source, complexity of the manufacturing process can be reduced, and stable deposition resulting from simultaneous evaporation can be accomplished.

The two types of hosts (compounds of Chemical Formula 1 and Chemical Formula 2) exhibit stable miscibility, and can be simultaneously deposited from one deposition source since changes in the composition are within a certain range or less after mixing. Uniform simultaneous evaporation of the two types of hosts is important for performance continuity of a manufactured organic light emitting device.

According to one embodiment of the present specification, the compound of Chemical Formula 1 and the compound of Chemical Formula 2 satisfy the following Equation 1. When forming an organic material layer through one deposition source by pre-mixing the compound of Chemical Formula 1 and the compound of Chemical Formula 2, a mixture having excellent uniformity can be obtained by satisfying the following Equation 1, and a uniform film can be obtained in a step of manufacturing a device as well.

$$|T_{sub1} - T_{sub2}| \leq 30° \text{ C.} \quad \text{[Equation 1]}$$

$T_{sub1}$ is an evaporation temperature of the compound of Chemical Formula 1, and $T_{sub2}$ is an evaporation temperature of the compound of Chemical Formula 2.

According to one embodiment of the present specification, the light emitting layer includes the compound of Chemical Formula 1 and the compound of Chemical Formula 2 as a host, and further includes a dopant material. Herein, the dopant material can be included in the light emitting layer in approximately 0.01% by mass to 20% by mass, or 0.01% by mass to 10% by mass with respect to a total mass sum of the compound of Chemical Formula 1 and the compound of Chemical Formula 2.

According to one embodiment of the present specification, the organic light emitting device is a multi-stack type, and one or two stacks thereof include the light emitting layer including the compound of Chemical Formula 1 and the compound of Chemical Formula 2.

According to one embodiment of the present specification, an emission spectrum of the light emitting layer including the compound of Chemical Formula 1 and the compound of Chemical Formula 2 has Amax in 400 nm to 470 nm.

According to one embodiment of the present specification, the light emitting layer further includes a phosphorescent dopant or a fluorescent dopant.

In one embodiment of the present specification, the light emitting layer further includes a dopant, and the dopant is a boron-based compound. The boron-based compound means a compound including a boron atom (B). When the dopant is a boron-based compound, device efficiency increases.

According to one embodiment of the present specification, the boron-based compound is a compound of the following Chemical Formula 3:

[Chemical Formula 3]

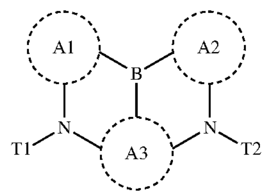

wherein in Chemical Formula 3:

A1 to A3 are the same as or different from each other, and each independently is a substituted or unsubstituted hydrocarbon ring or a substituted or unsubstituted heteroring, or bond to adjacent groups to form a substituted or unsubstituted ring, and T1 and T2 are the same as or different from each other, and each independently is a substituted or unsubstituted aryl group, or a substituted or unsubstituted heterocyclic group, or bond to adjacent groups to form a substituted or unsubstituted ring.

According to one embodiment of the present specification, when including the compound of Chemical Formula 1 and the compound of Chemical Formula 2 in the light emitting layer, and including the compound of Chemical Formula 3 at the same time as the dopant, a device with improved driving voltage, lifetime and efficiency properties can be obtained without a trade-off effect.

According to one embodiment of the present specification, A1 to A3 are the same as or different from each other, and each independently is a substituted or unsubstituted hydrocarbon ring having 6 to 60 carbon atoms or a substituted or unsubstituted heteroring having 2 to 60 carbon atoms, or bond to adjacent groups to form a substituted or unsubstituted ring having 8 to 60 carbon atoms.

In another embodiment, A1 to A3 are the same as or different from each other, and each independently is a substituted or unsubstituted benzene, substituted or unsubstituted hydroindene, substituted or unsubstituted tetrahydronaphthalene, substituted or unsubstituted tetrahydrobenzoindole, substituted or unsubstituted tetrahydronaphthofuran, substituted or unsubstituted tetrahydronaphthothiophene, substituted or unsubstituted indole, substituted or unsubstituted benzofuran, or substituted or unsubstituted benzothiophene, or bond to adjacent groups to form a substituted or unsubstituted ring having 8 to 60 carbon atoms. The "substituted or unsubstituted" means being substituted with one, two or more substituents selected from the group consisting of deuterium, a halogen group, a nitrile group, a silyl group having 3 to 20 carbon atoms, an amine group having 12 to 30 carbon atoms, an aryl group having 6 to 30 carbon atoms, a heteroring having 2 to 30 carbon atoms, and a substituent linking two or more substituents among the substituents illustrated above, or having no substituents.

According to one embodiment of the present specification, T1 and T2 are the same as or different from each other, and each independently a substituted or unsubstituted aryl group having 6 to 60 carbon atoms, or a substituted or unsubstituted heterocyclic group having 2 to 60 carbon atoms, or bond to adjacent groups to form a substituted or unsubstituted ring having 8 to 60 carbon atoms.

According to another embodiment, T1 and T2 are the same as or different from each other, and each independently is a substituted or unsubstituted phenyl group, a substituted or unsubstituted biphenyl group, or substituted or unsubstituted tetrahydronaphthalene, or bond to adjacent groups to form a substituted or unsubstituted ring having 8 to 60 carbon atoms. The "substituted or unsubstituted" means being substituted with one, two or more substituents selected from the group consisting of deuterium, a halogen group, a nitrile group, a silyl group having 3 to 20 carbon atoms, an amine group having 12 to 30 carbon atoms, an aryl group having 6 to 30 carbon atoms, a heteroring having 2 to 30 carbon atoms, and a substituent linking two or more substituents among the substituents illustrated above, or having no substituents.

According to another embodiment, at least one of T1 and T2 is a substituted or unsubstituted phenyl group.

In another embodiment, at least one of T1 and T2 is a phenyl group, and the phenyl group has a substituent at an ortho position with respect to carbon linked to nitrogen. Herein, the substituent can be an aryl group, a heteroaryl group or an alkyl group.

In another embodiment, at least one of T1 and T2 is a dihydroindene group; or a tetrahydronaphthalene group, and the dihydroindene group or the tetrahydronaphthalene group can include one or more methyl groups as a substituent.

According to one embodiment of the present specification, A1 and T1 can bond to each other to form a substituted or unsubstituted ring.

According to one embodiment of the present specification, A2 and T2 can bond to each other to form a substituted or unsubstituted ring.

In one embodiment of the present specification, Chemical Formula 3 is the following Chemical Formula 3-1:

[Chemical Formula 3-1]

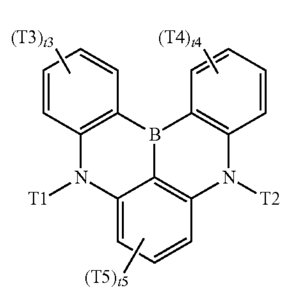

wherein in Chemical Formula 3-1:

T1 and T2 have the same definitions as in Chemical Formula 3;

T3 to T5 are the same as or different from each other, and each independently is hydrogen, deuterium, a halogen group, a substituted or unsubstituted alkyl group, a substituted or unsubstituted silyl group, a substituted or unsubstituted aryl group, a substituted or unsubstituted heteroaryl group, or a substituted or unsubstituted amine group, or bond to adjacent substituents to form a ring;

t3 and t4 are each an integer of 0 to 4, and t5 is an integer of 0 to 3; and when t3 to t5 are each 2 or greater, substituents in the parentheses are the same as each other.

In one embodiment of the present specification, T3 to T5 are the same as or different from each other, and each independently is hydrogen; deuterium; a halogen group; an alkyl group having 1 to 10 carbon atoms that is unsubstituted or substituted with deuterium; an alkylsilyl group having 1 to 30 carbon atoms that is unsubstituted or substituted with deuterium; an aryl group having 6 to 30 carbon atoms that is unsubstituted or substituted with deuterium, an alkyl group having 1 to 10 carbon atoms, or a deuterated alkyl group having 1 to 10 carbon atoms; a heteroaryl group that is unsubstituted or substituted with deuterium, an alkyl group having 1 to 10 carbon atoms, a deuterated alkyl group having 1 to 10 carbon atoms, an aryl group having 6 to 30 carbon atoms, or a deuterated aryl group having 6 to 30 carbon atoms; or an arylamine group having 6 to 60 carbon atoms that is unsubstituted or substituted with deuterium, an alkyl group having 1 to 10 carbon atoms, or a deuterated alkyl group having 1 to 10 carbon atoms, or bond to adjacent substituents to form an aromatic hydrocarbon ring or aliphatic hydrocarbon ring having 5 to 30 carbon atoms.

In one embodiment of the present specification, adjacent two T3s, adjacent two T4s or adjacent two T5s bond to each other to form a cyclopentene ring that is unsubstituted or substituted with a methyl group; or a cyclohexene ring that is unsubstituted or substituted with a methyl group.

In one embodiment of the present specification, the compound of Chemical Formula 3 can be any one of the following compounds:

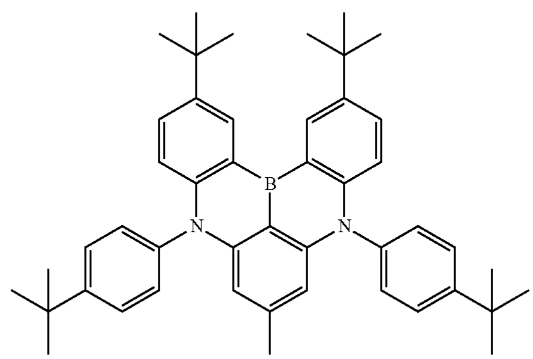

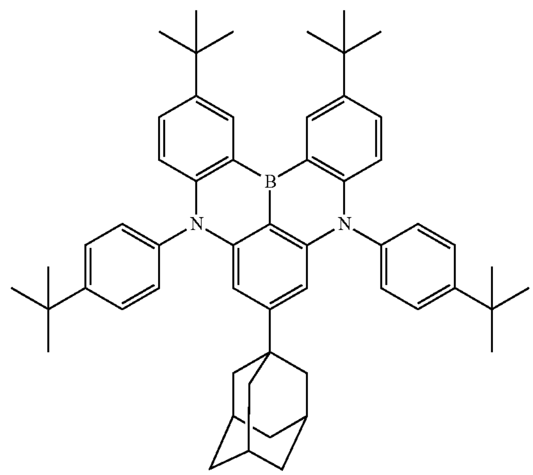

-continued
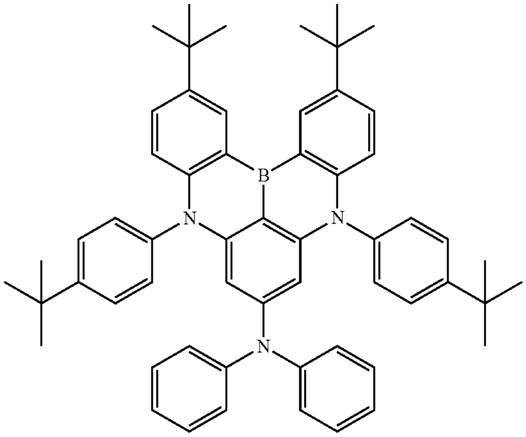
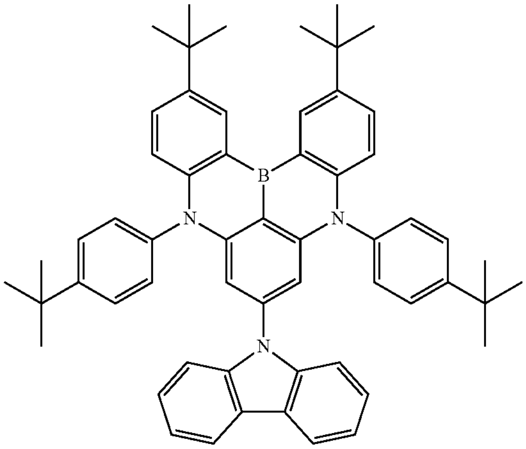
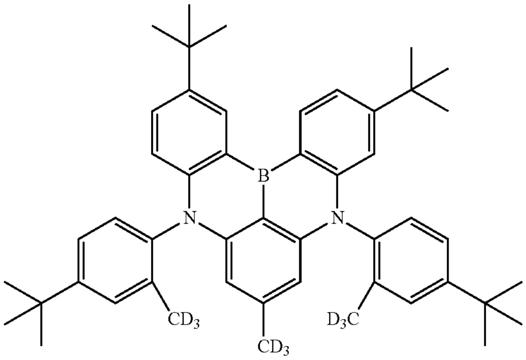
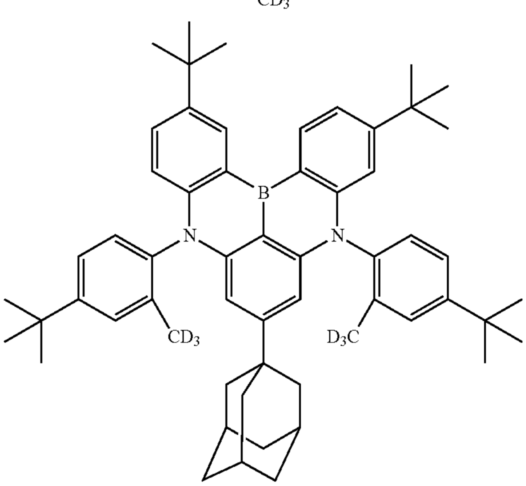
-continued
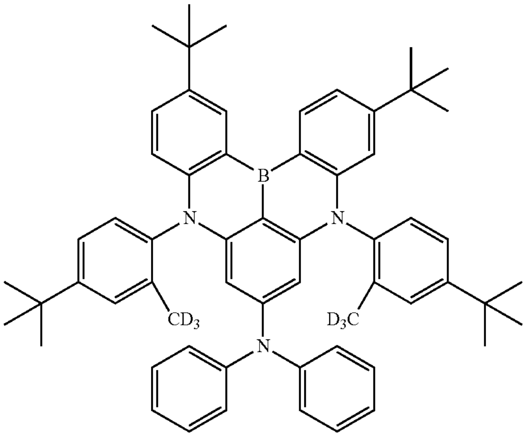
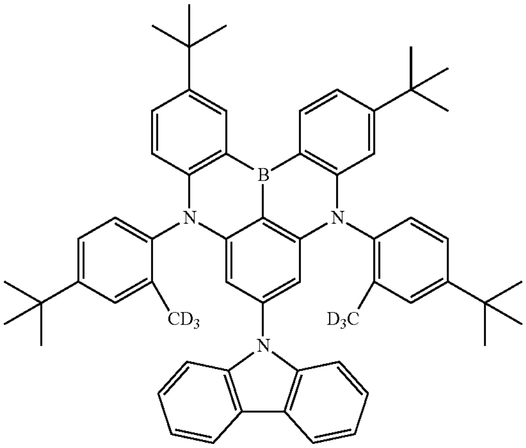
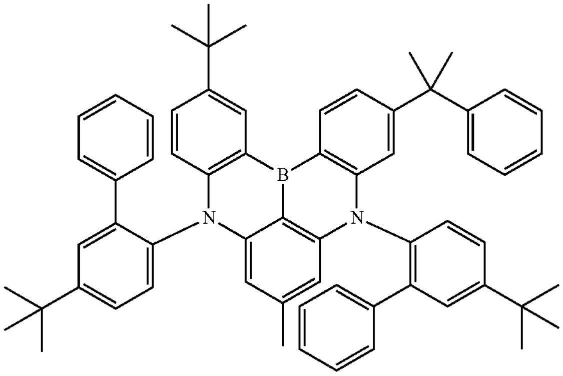
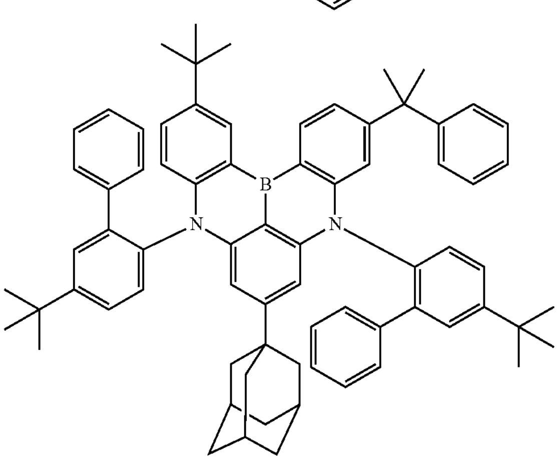

-continued
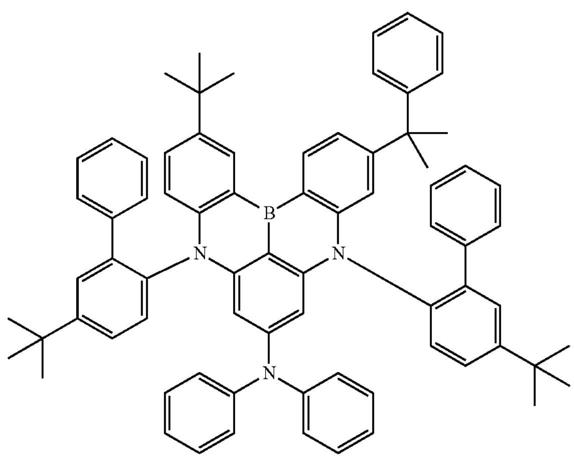
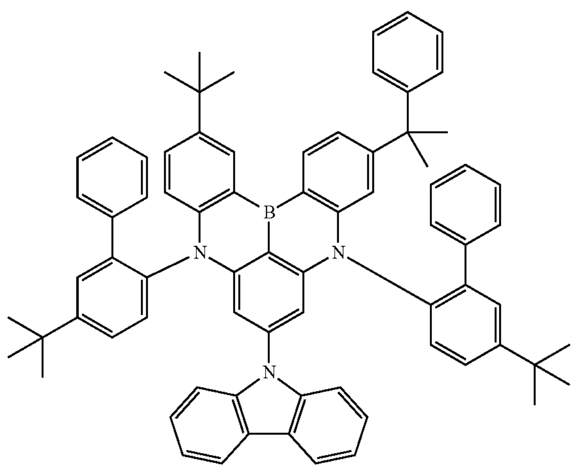
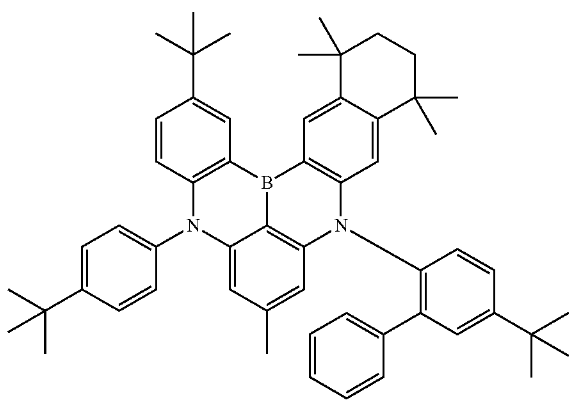
-continued
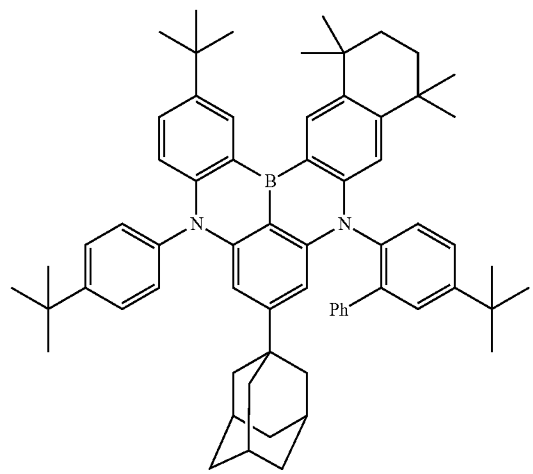
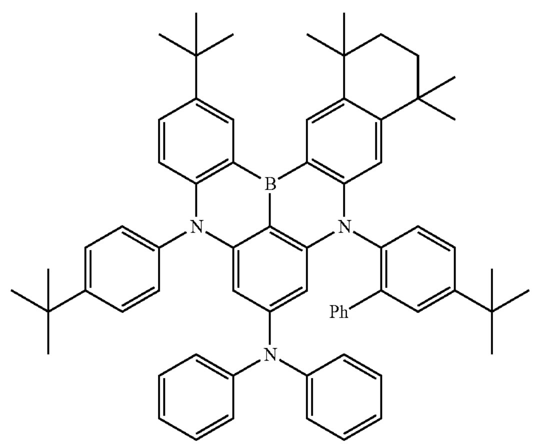
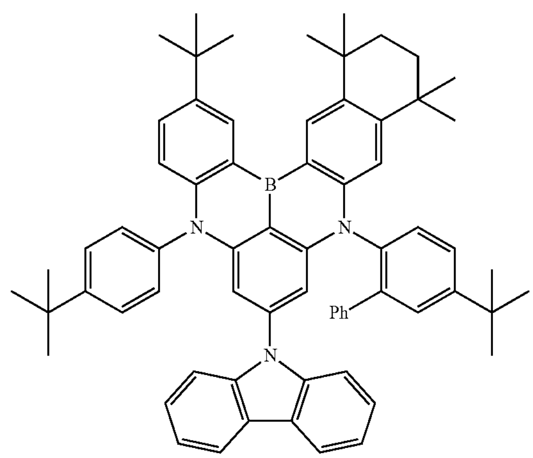

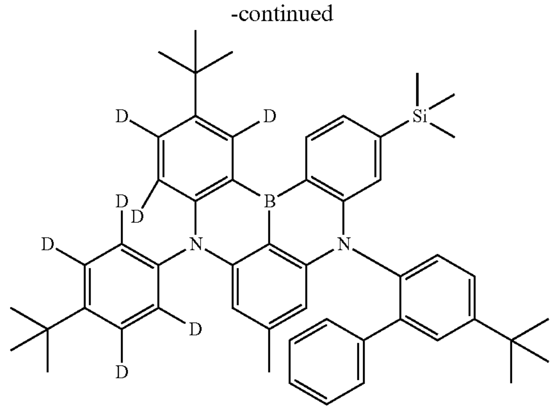
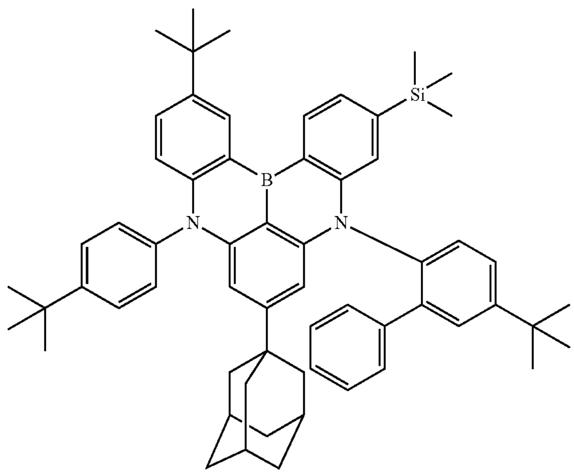
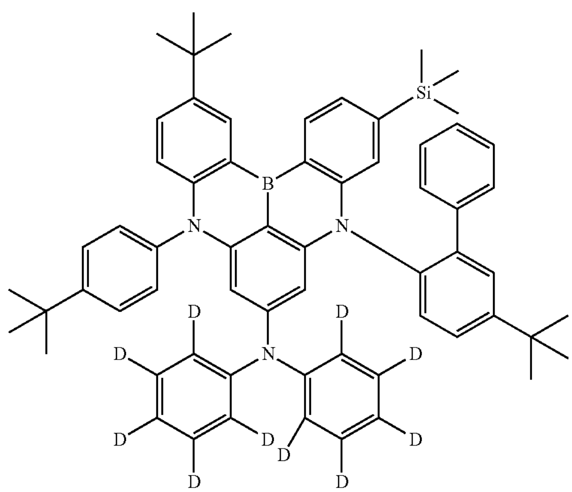
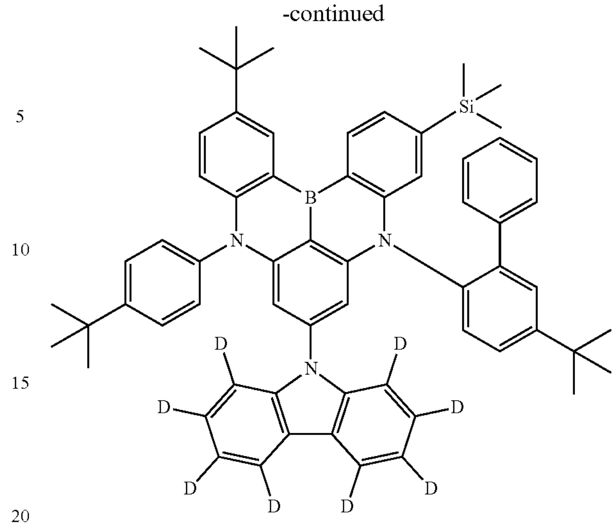
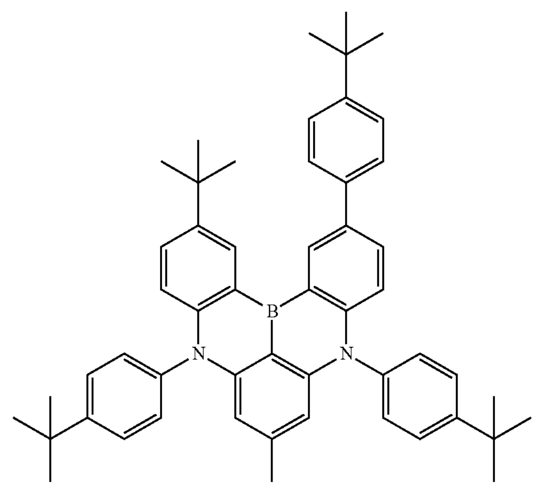
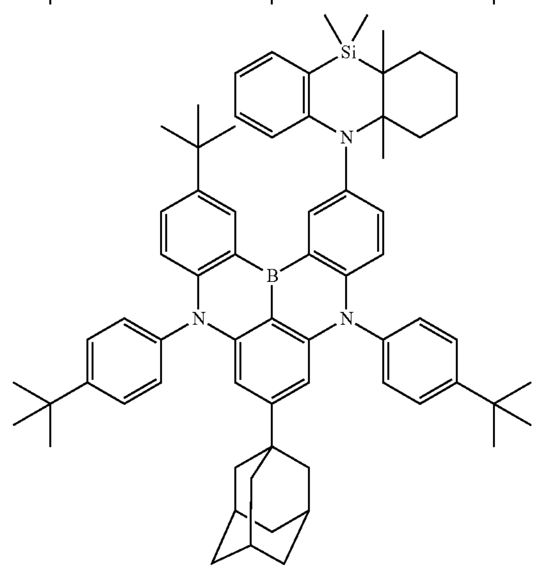

-continued
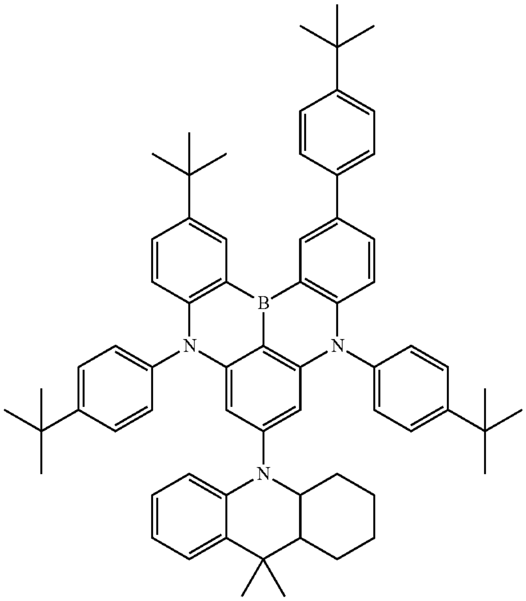
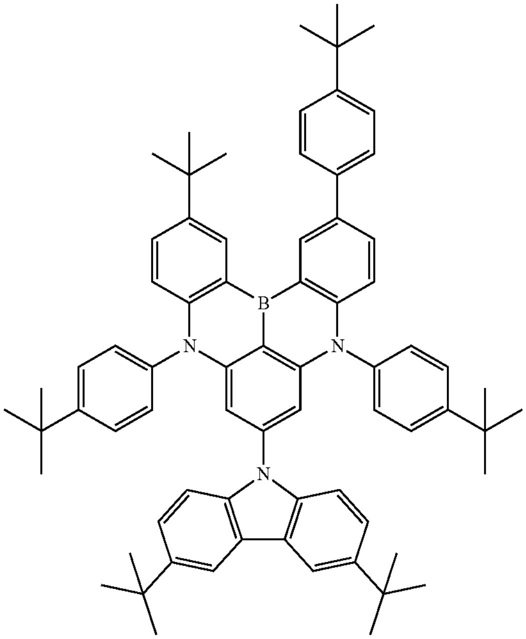
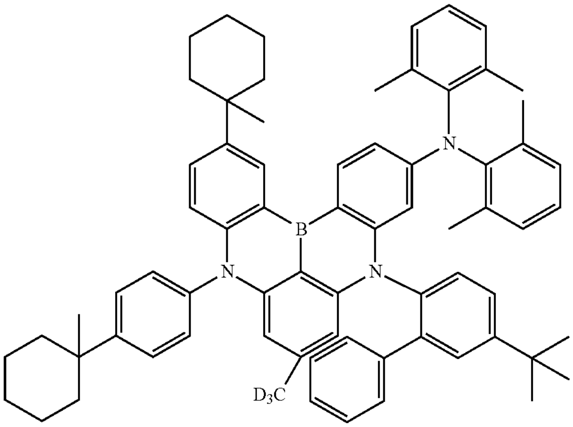
-continued
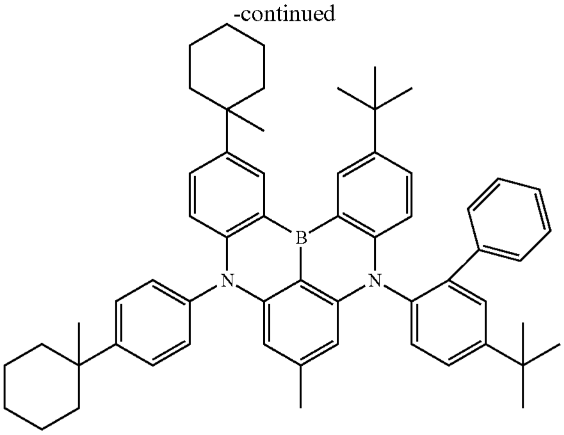
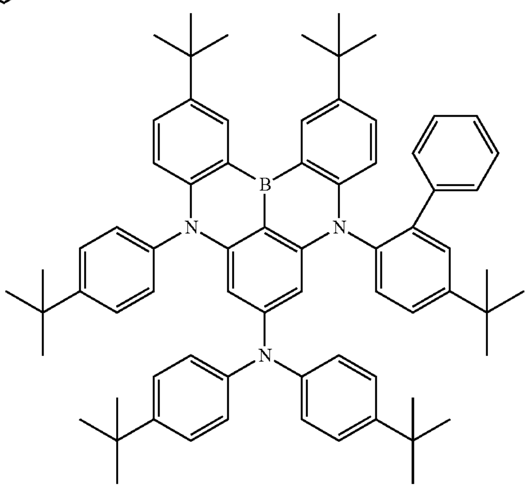
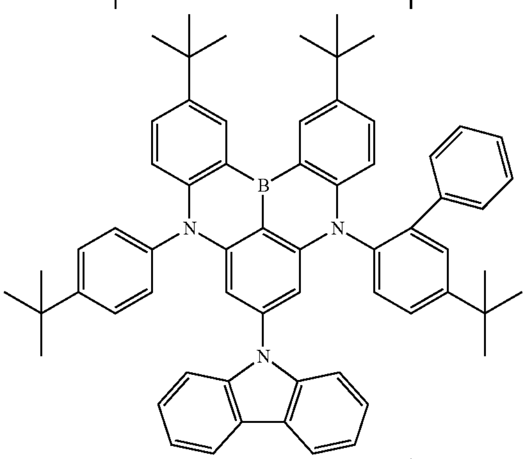
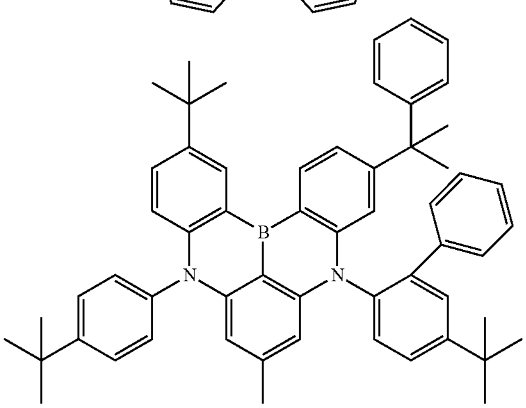

-continued
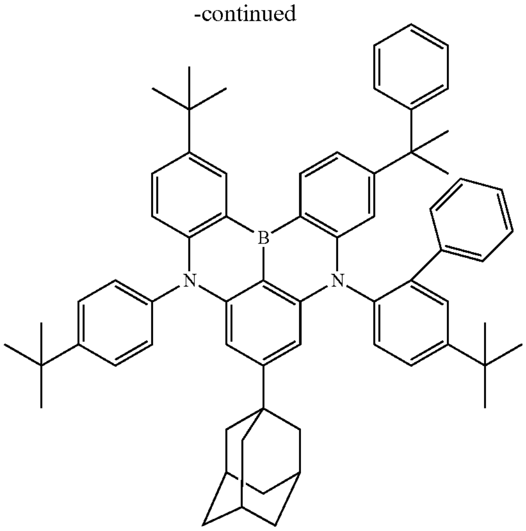
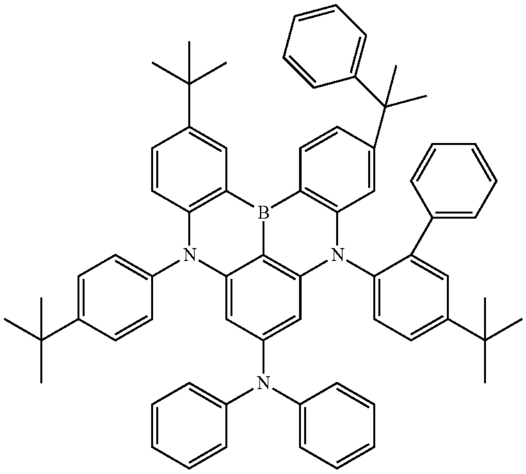
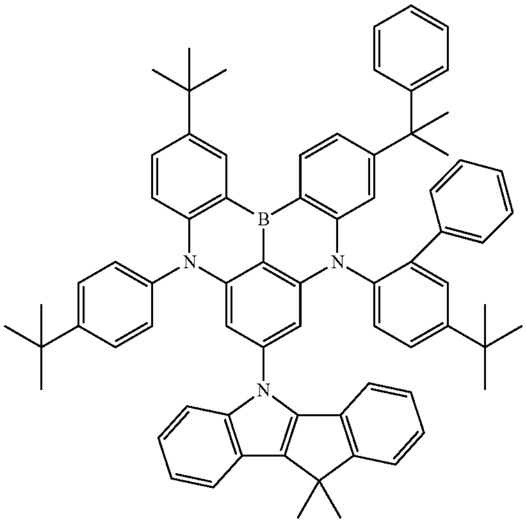
-continued
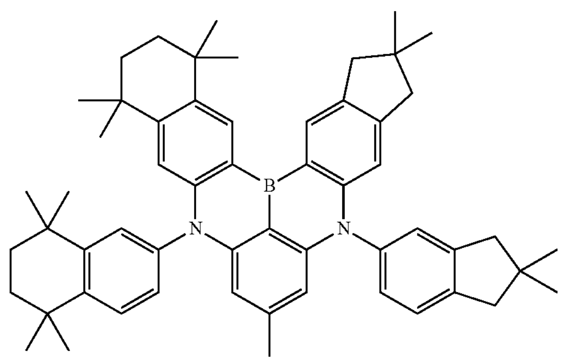
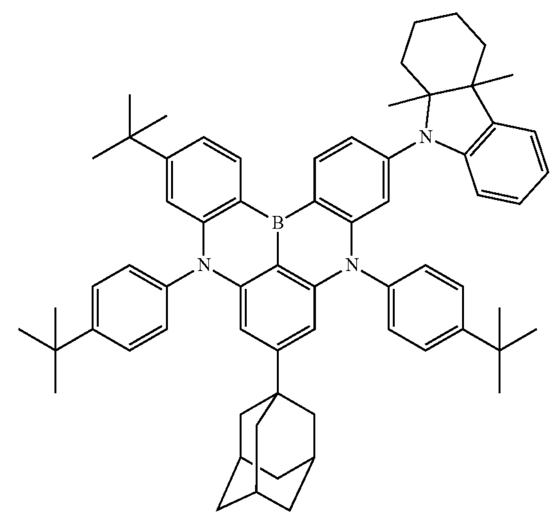
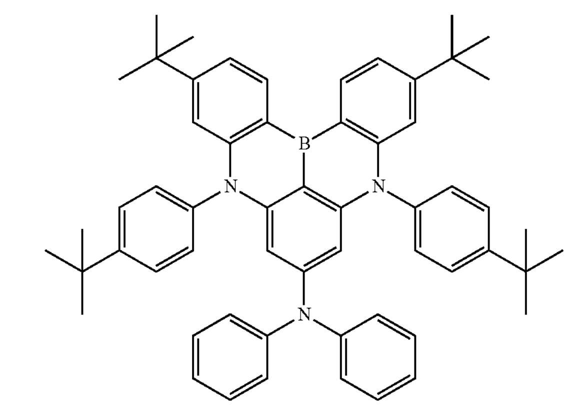
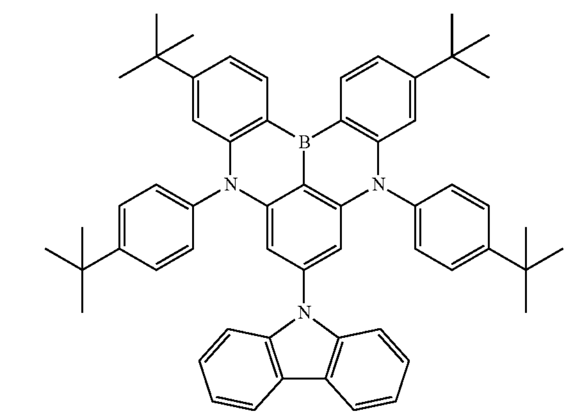

-continued
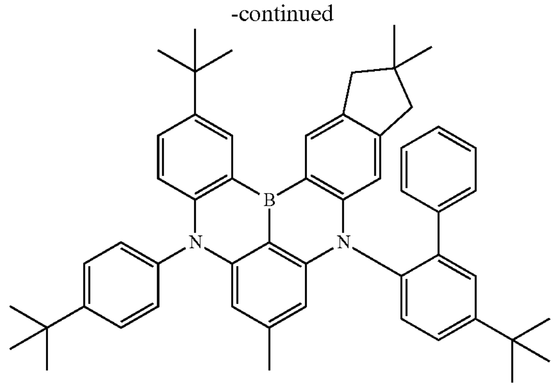
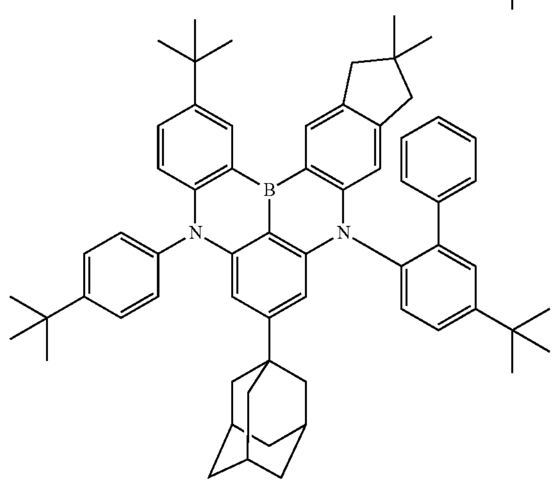
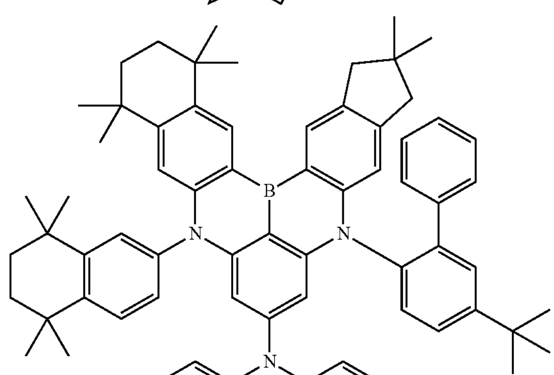
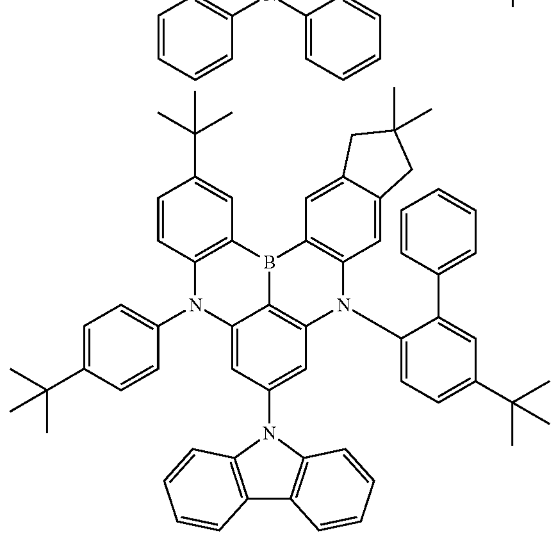
-continued
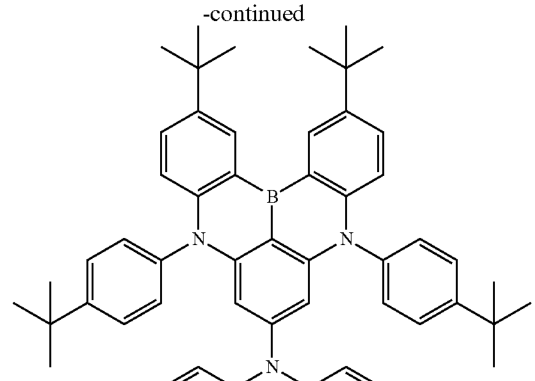
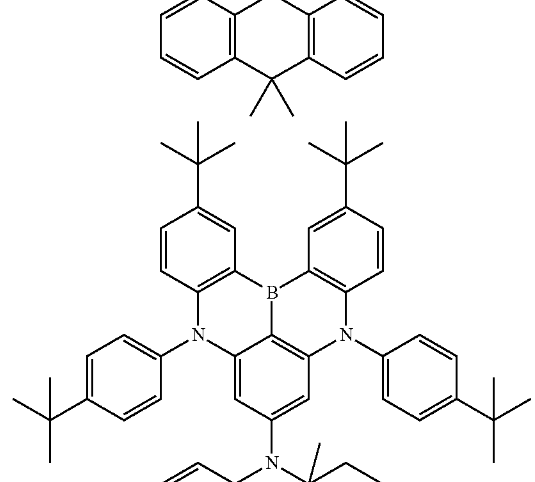
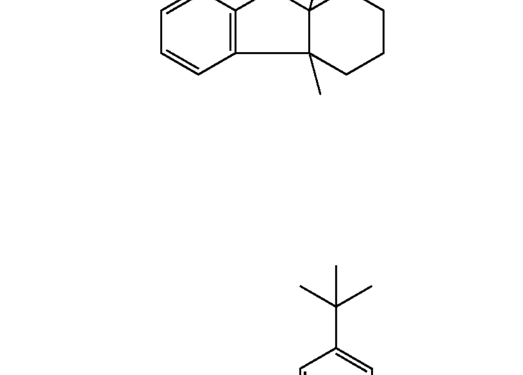
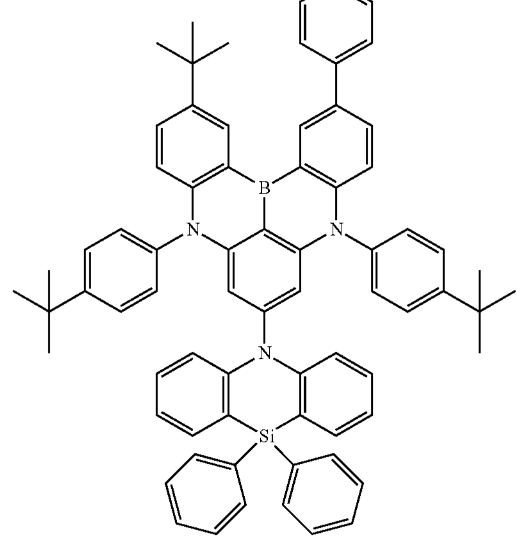

-continued
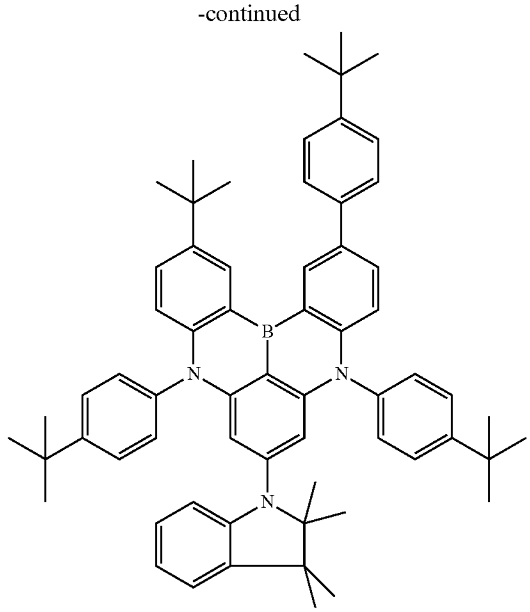
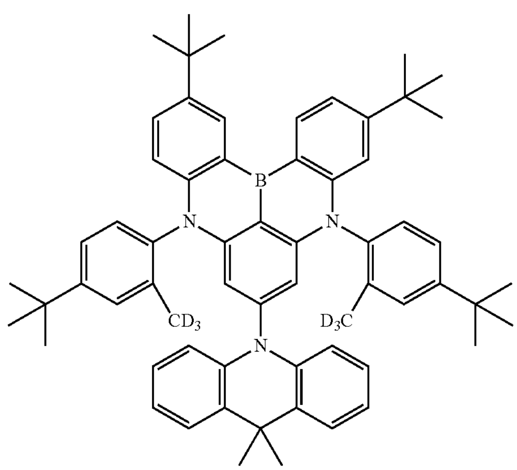
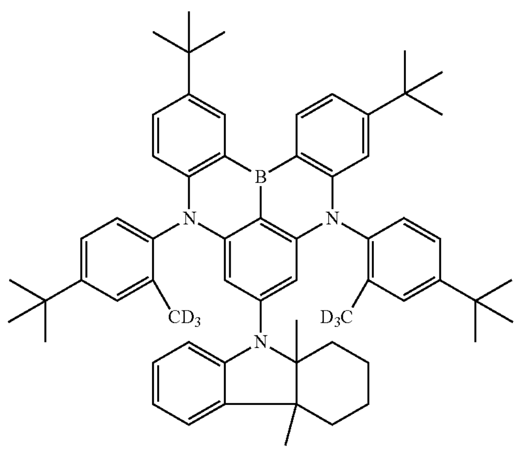
-continued
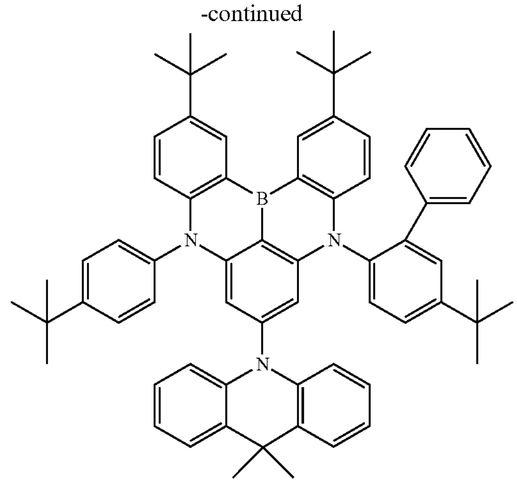
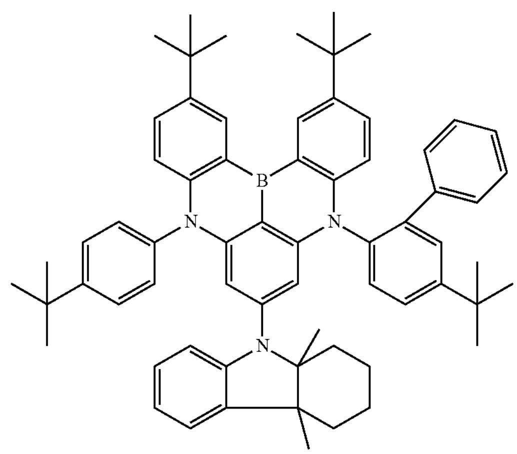
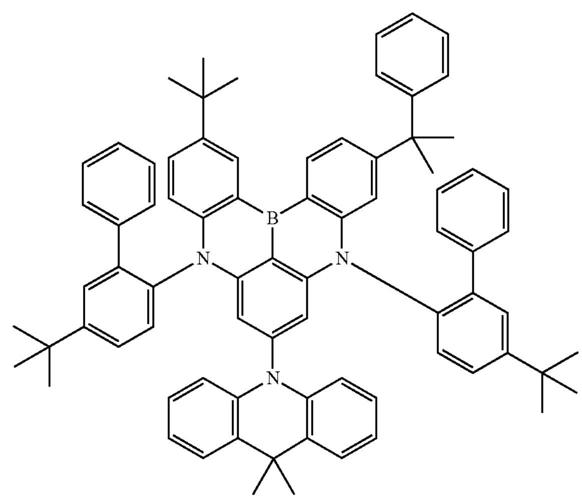

-continued
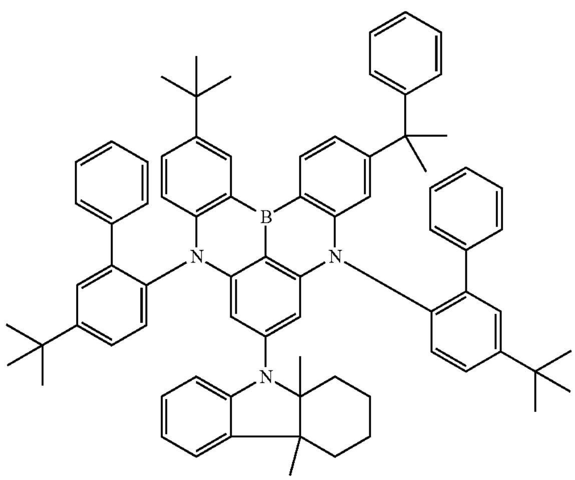
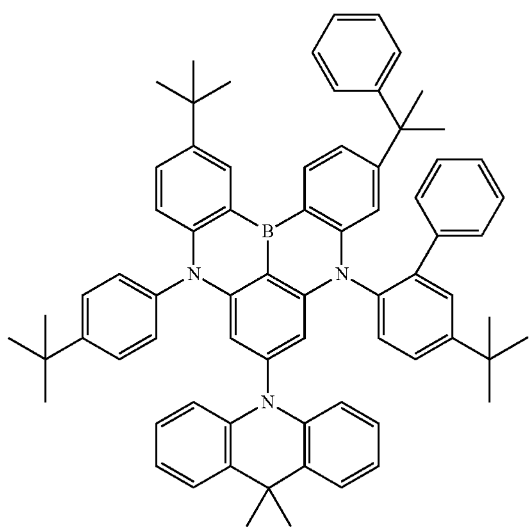
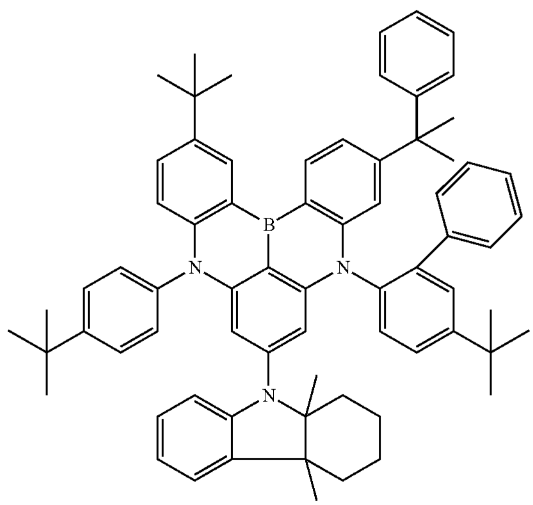
-continued
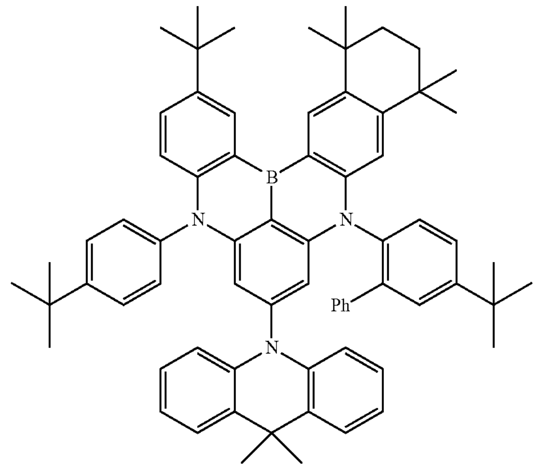
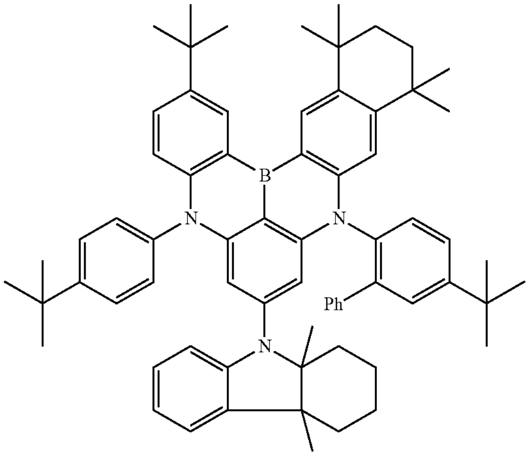
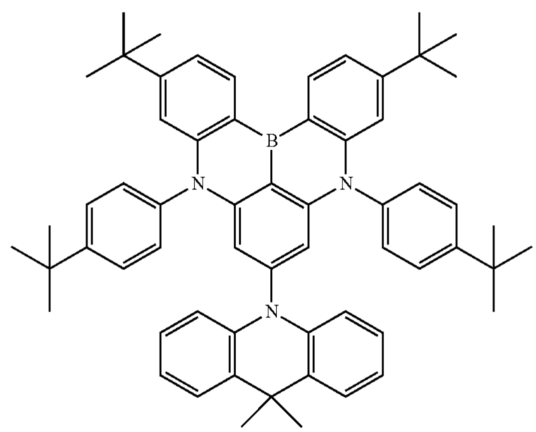

-continued
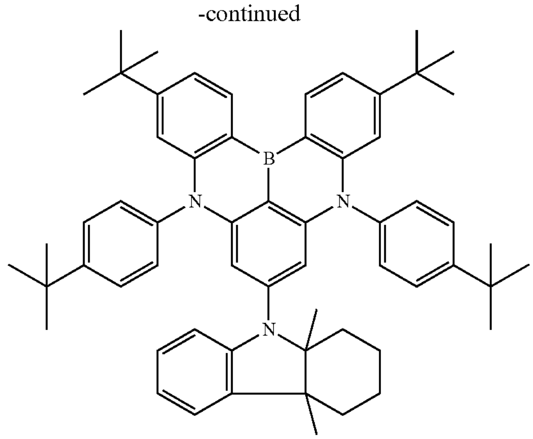
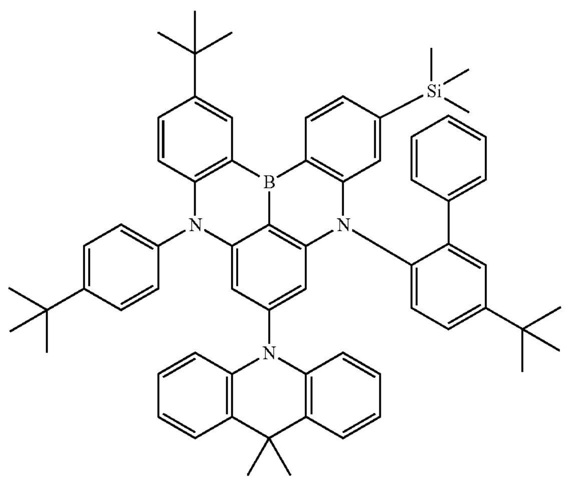
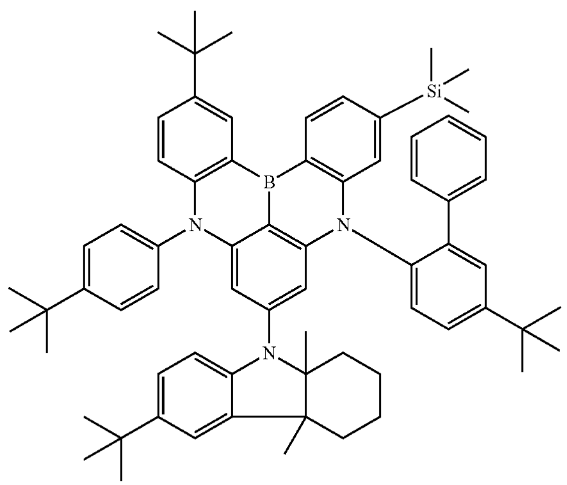
-continued
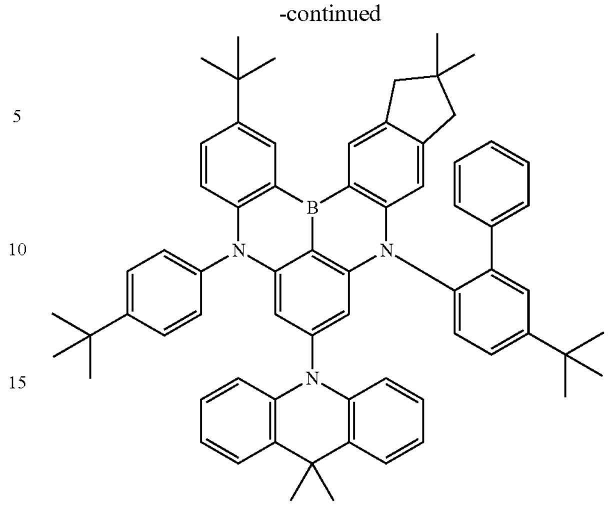
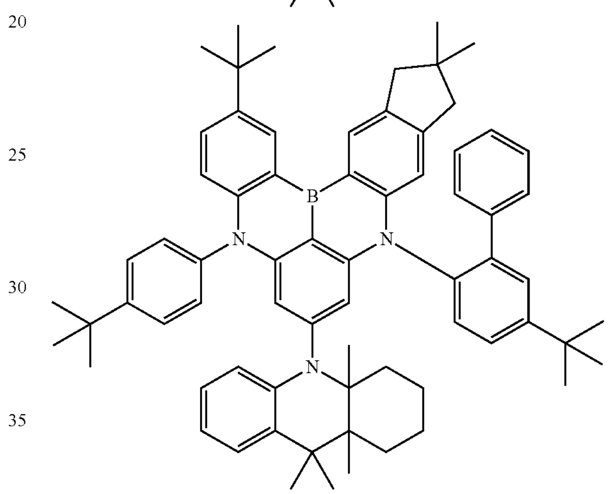
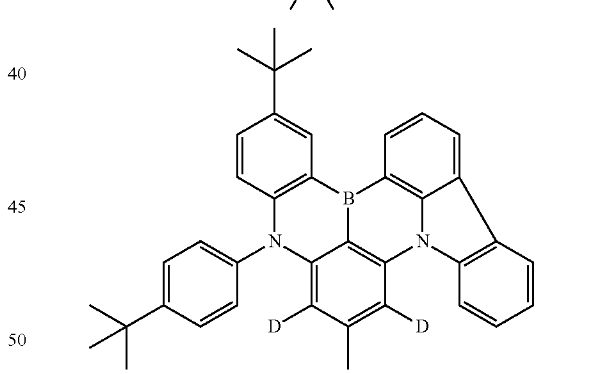
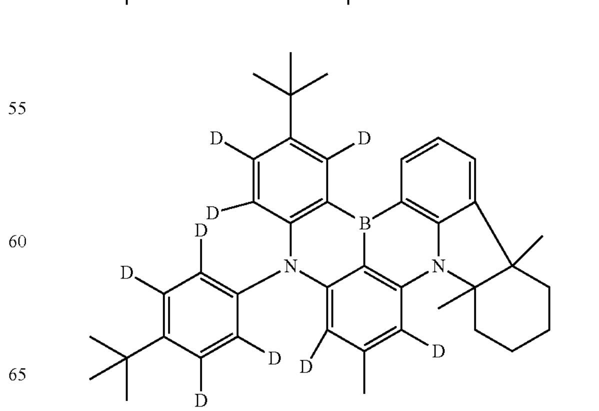

-continued
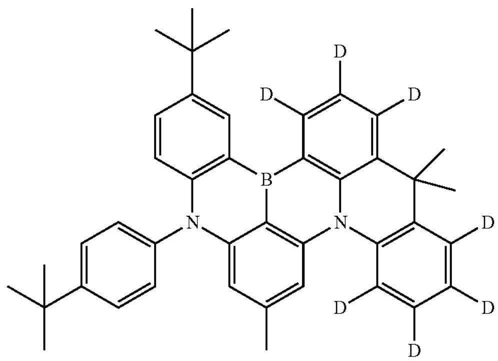
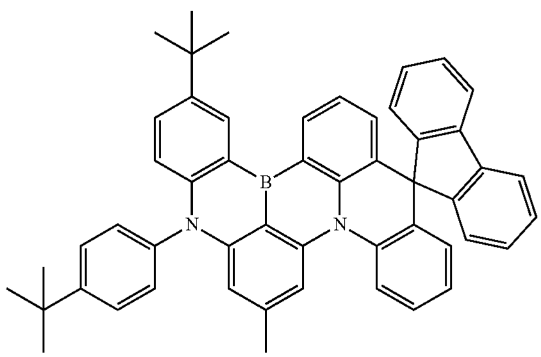
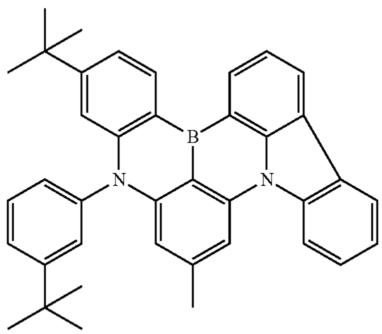
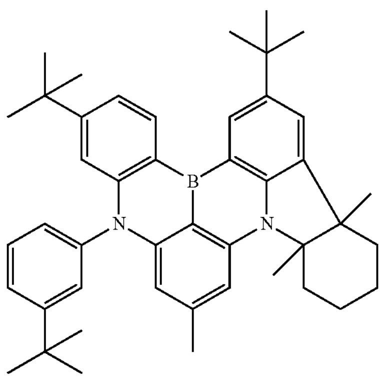 [SMILES: Cc1cc2c3c(c1)N1c4c(cc(C(C)(C)C)cc4C4(C)CCCCC14C)B3c1ccc(C(C)(C)C)cc1N2c1cccc(C(C)(C)C)c1]
-continued
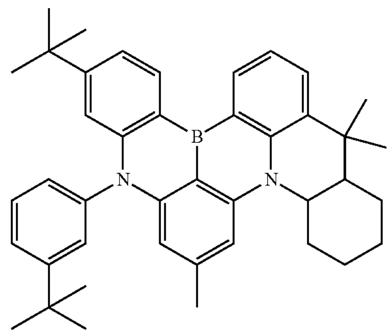
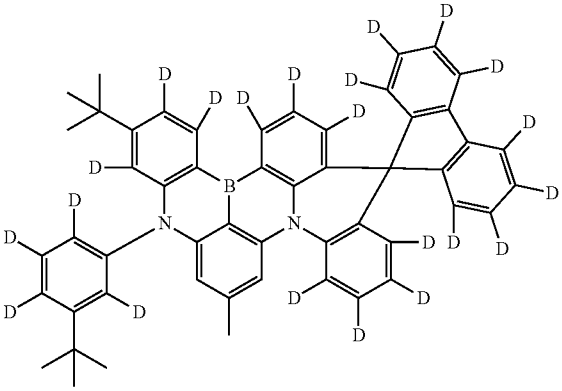
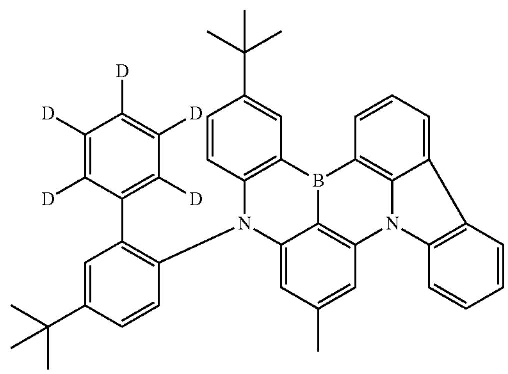
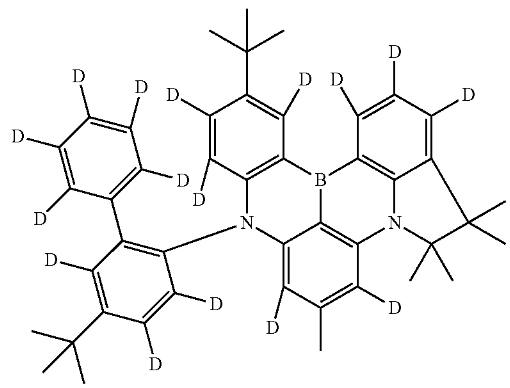

-continued
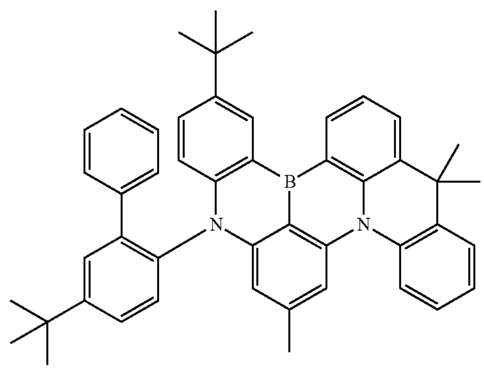
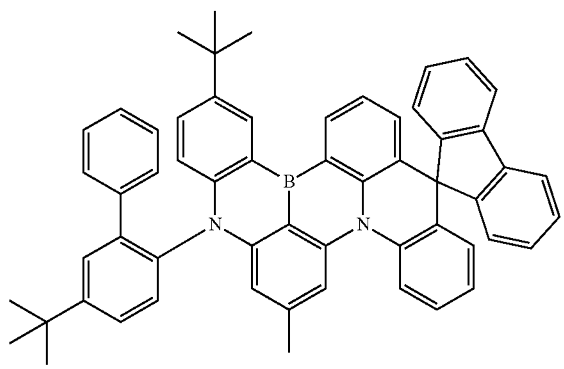
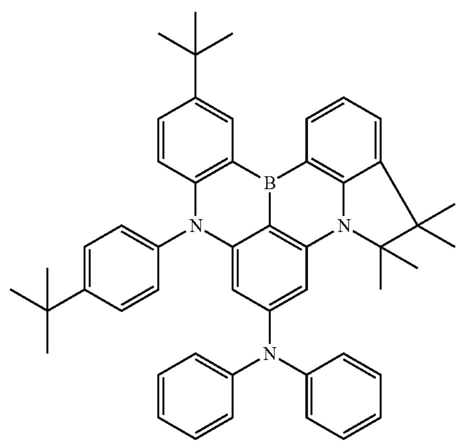
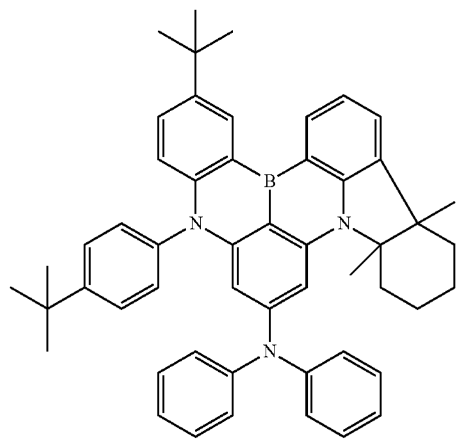
-continued
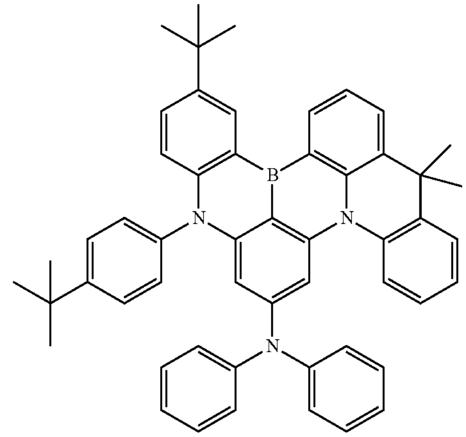
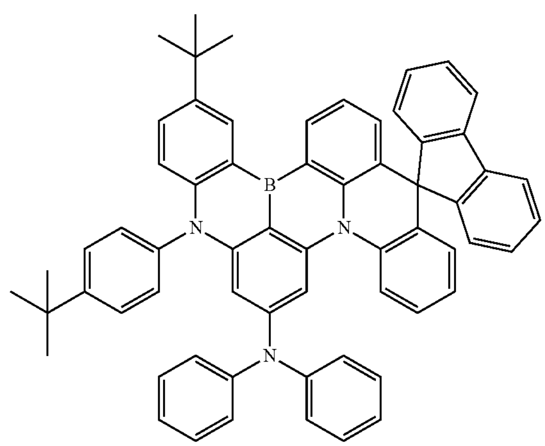
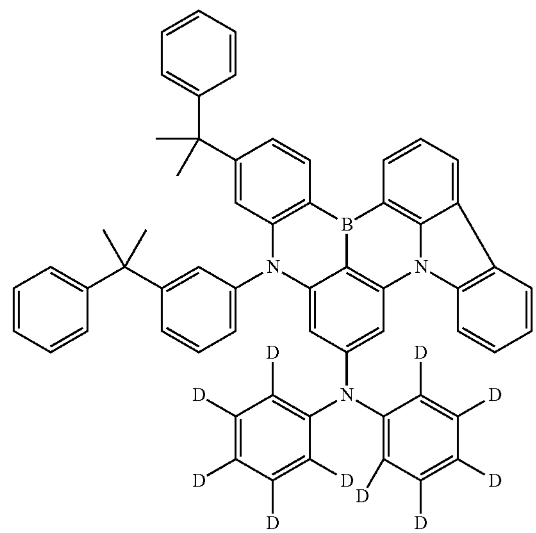

-continued
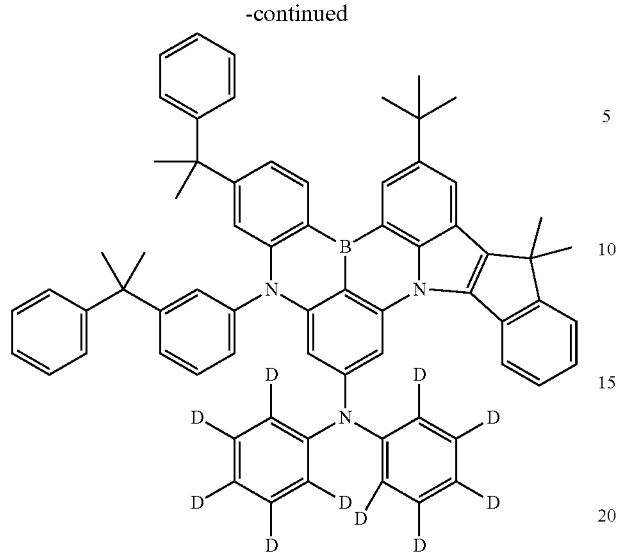
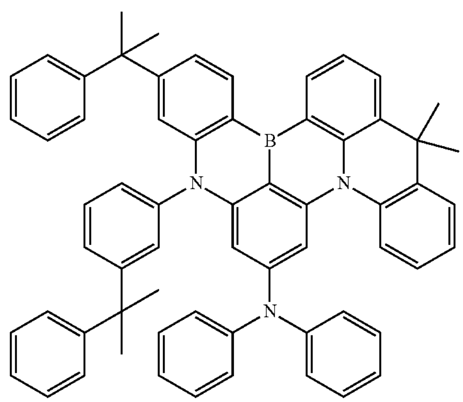
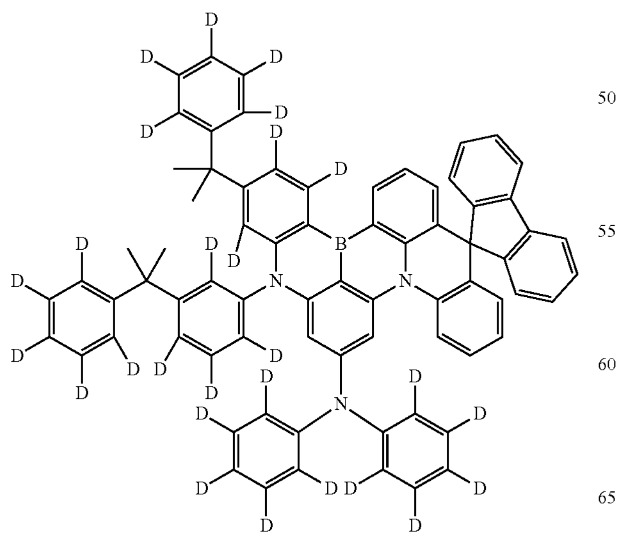
-continued
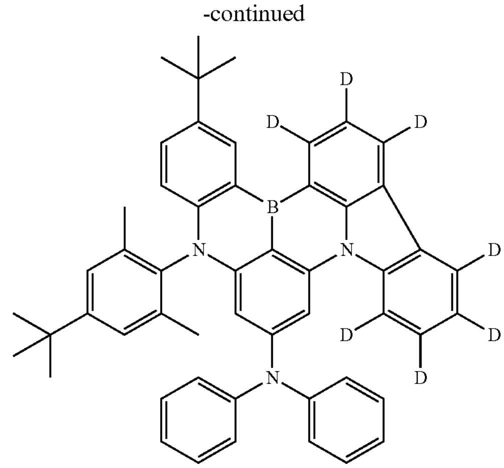
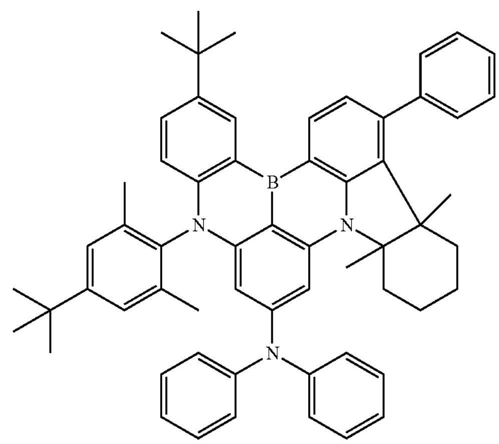
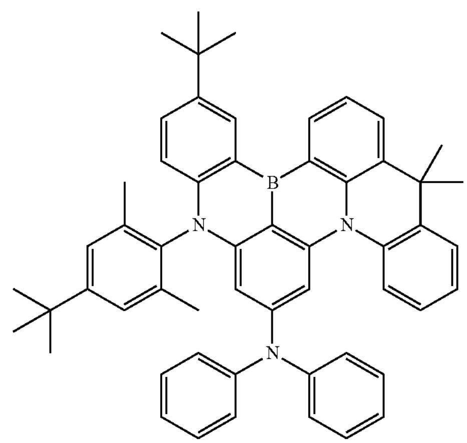

-continued
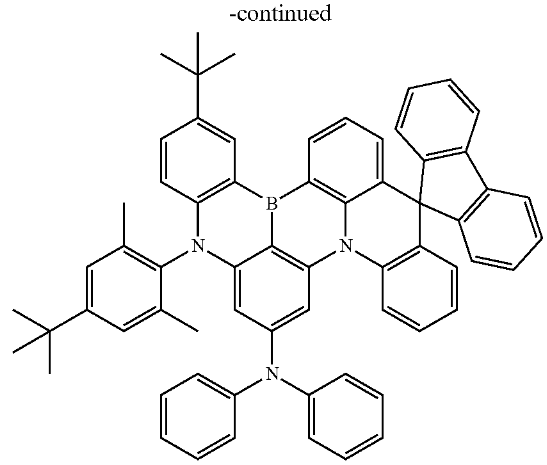
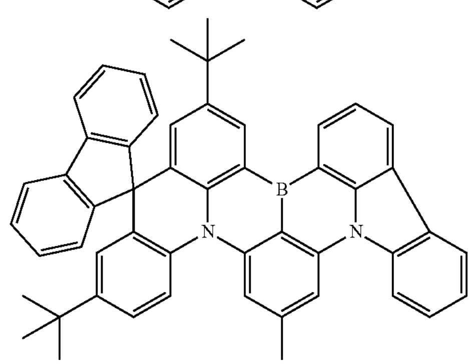
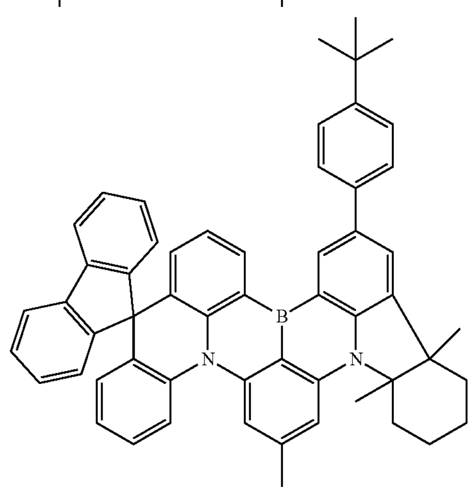
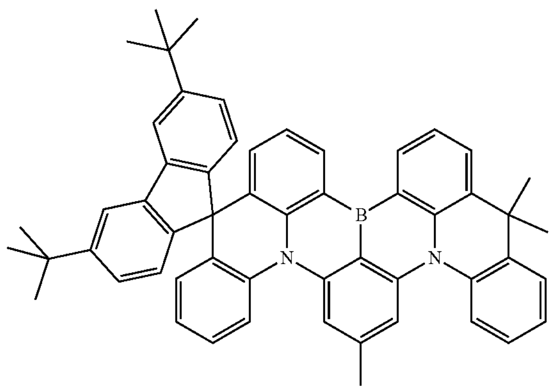
-continued
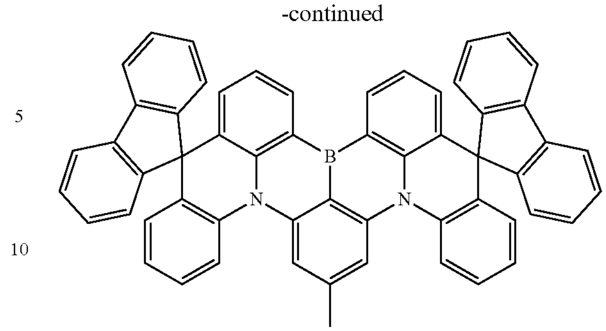
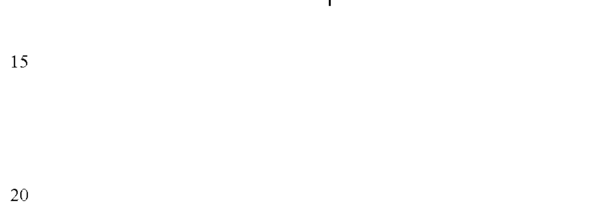
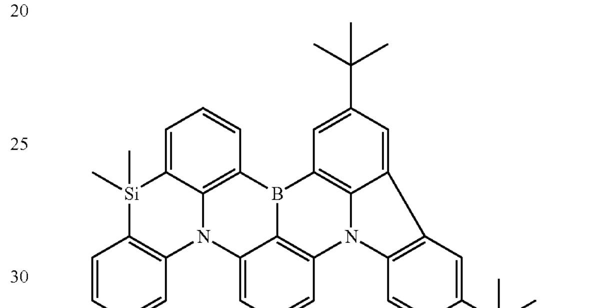
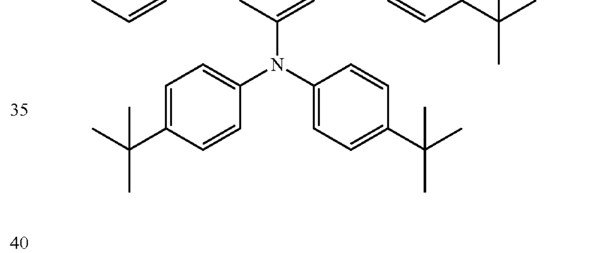
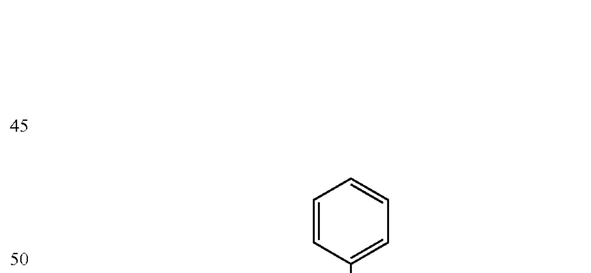
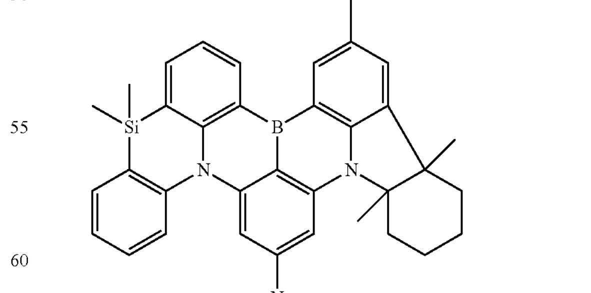
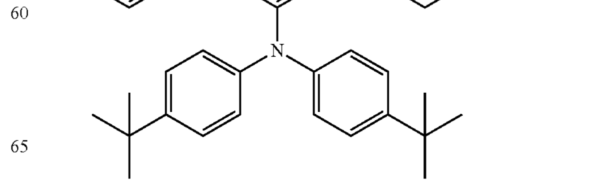

-continued
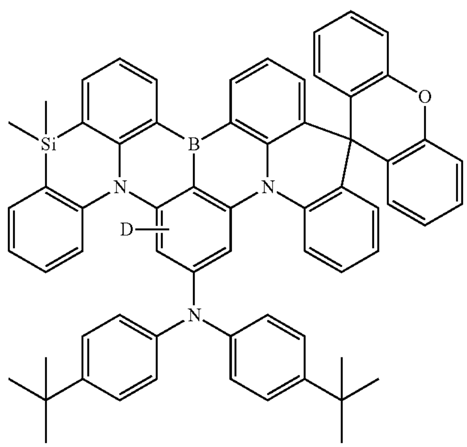
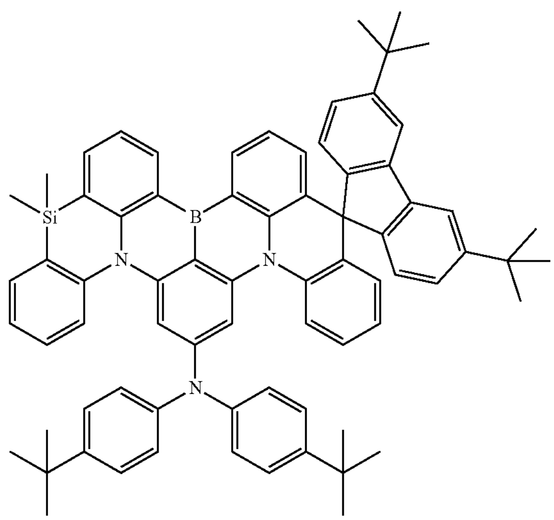
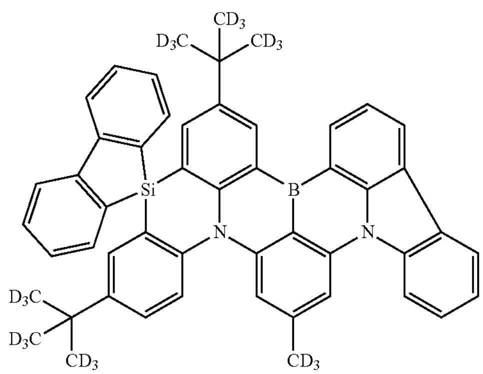
-continued
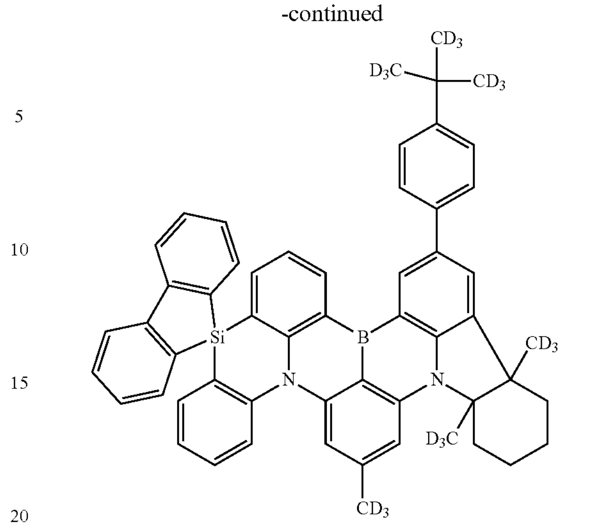
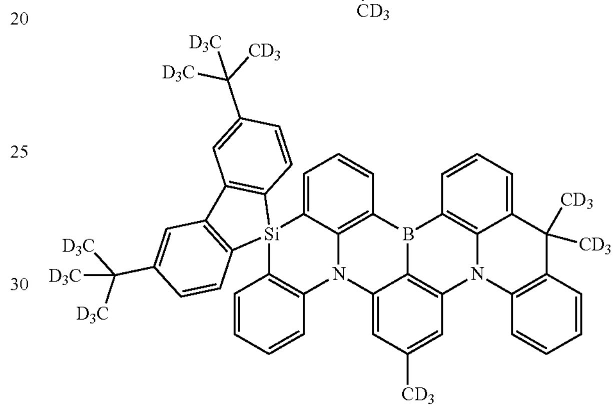
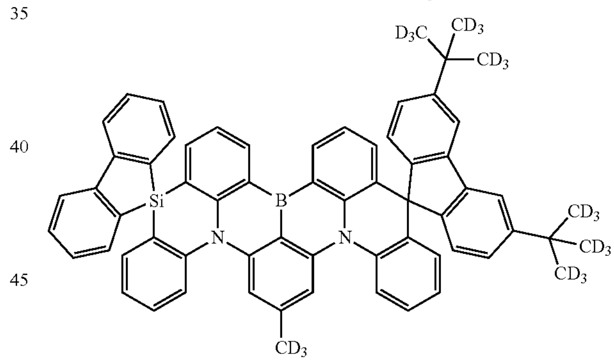
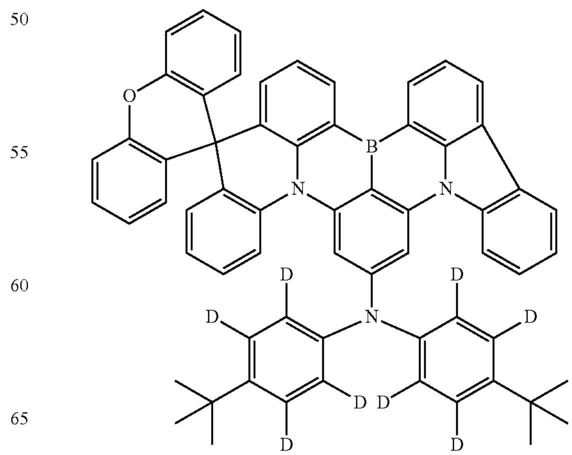

-continued
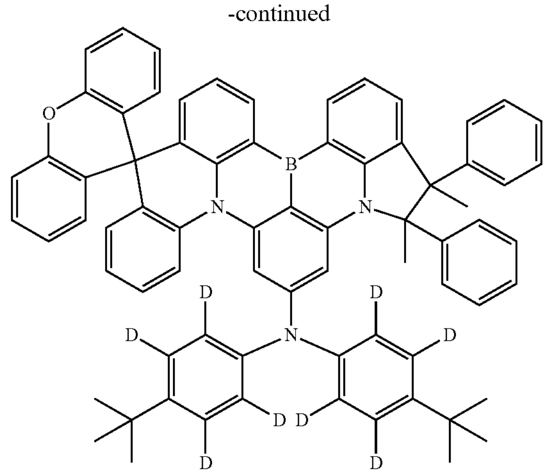
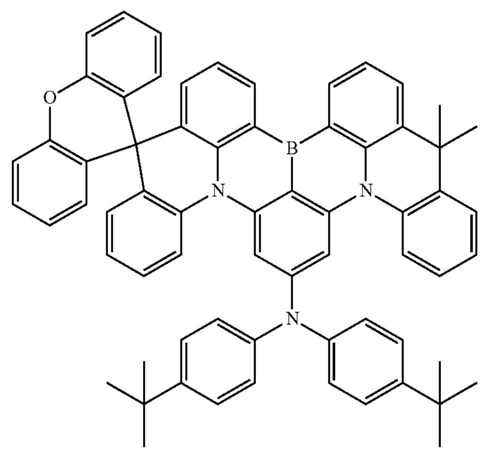
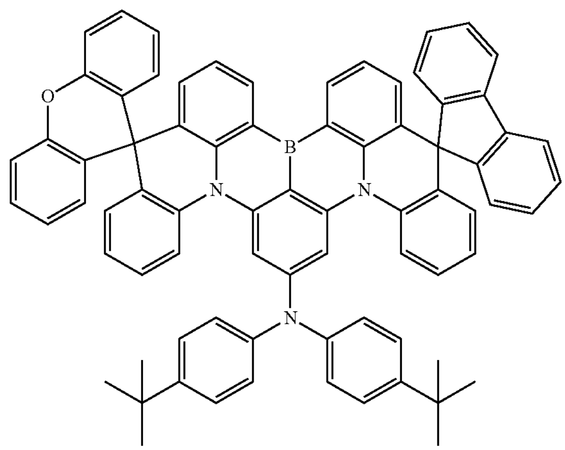
-continued
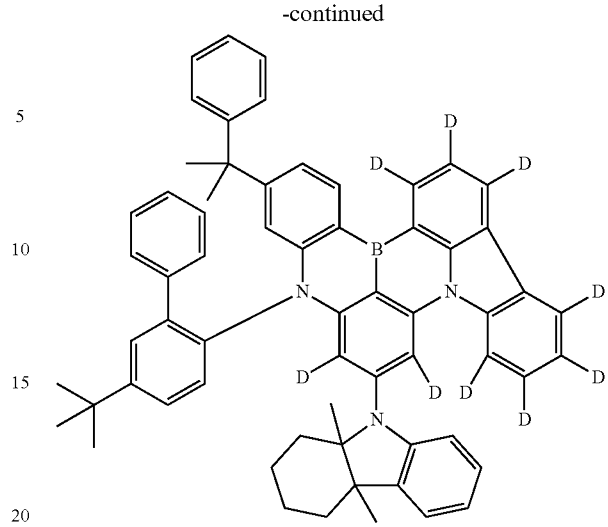
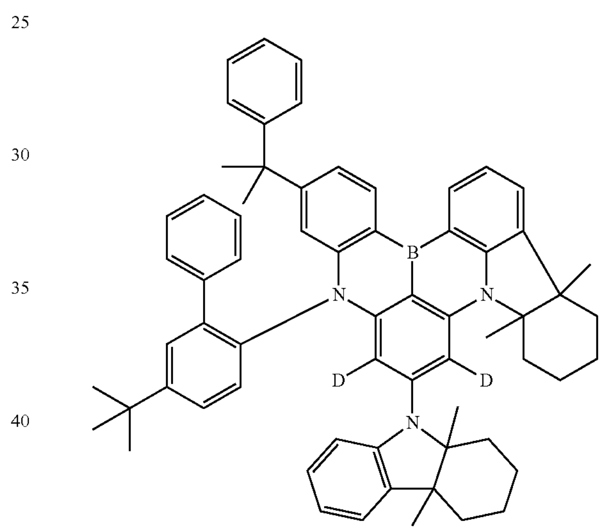
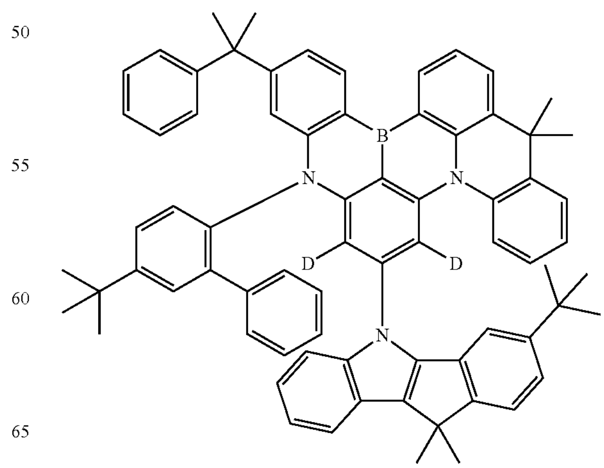

-continued
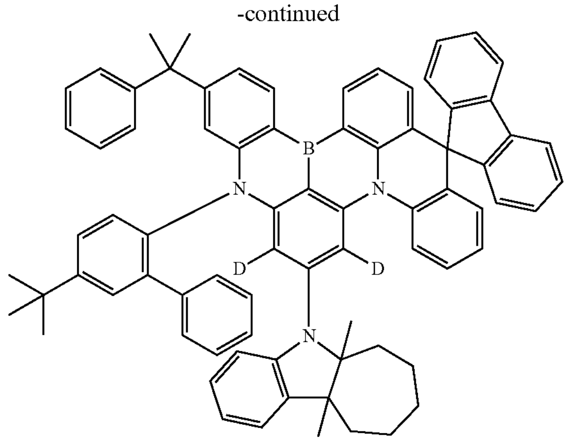
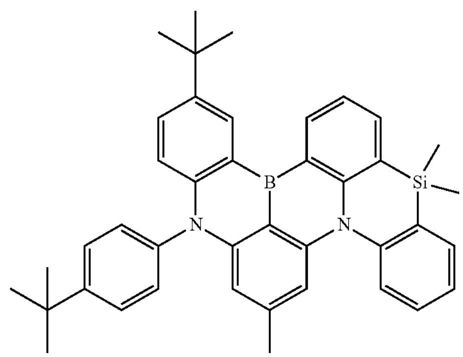
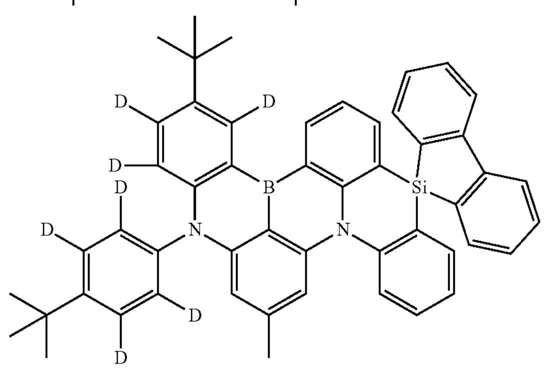
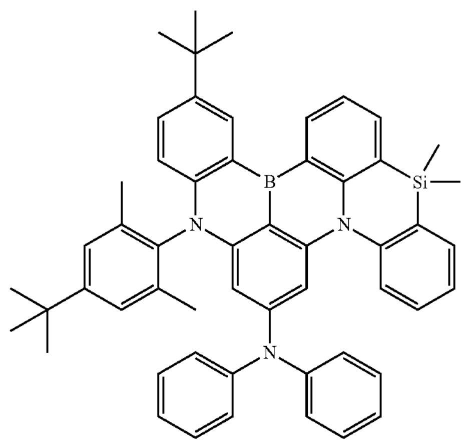
-continued
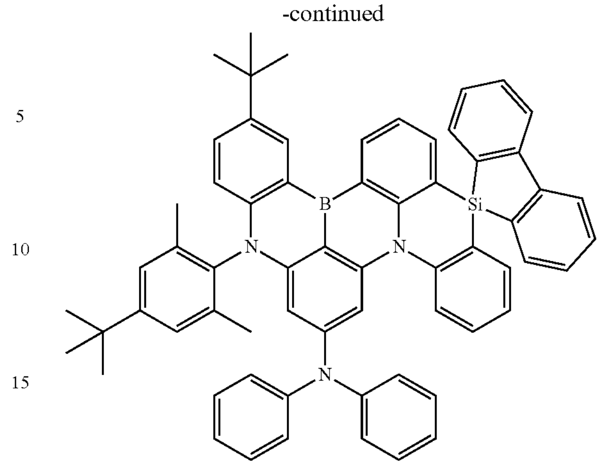
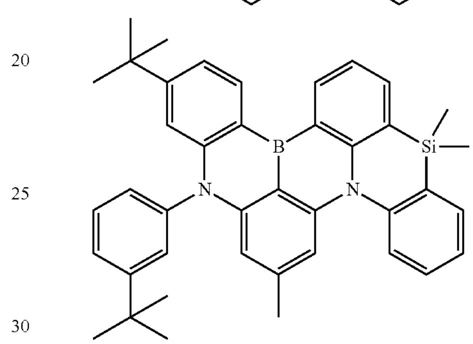
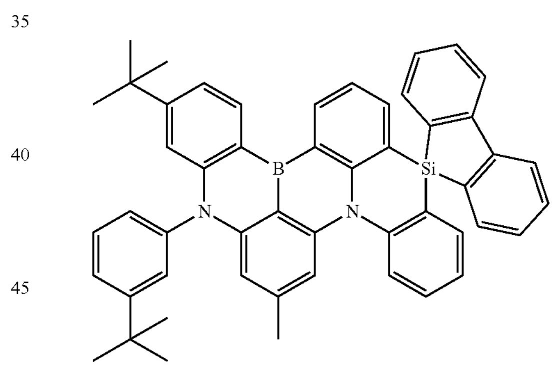
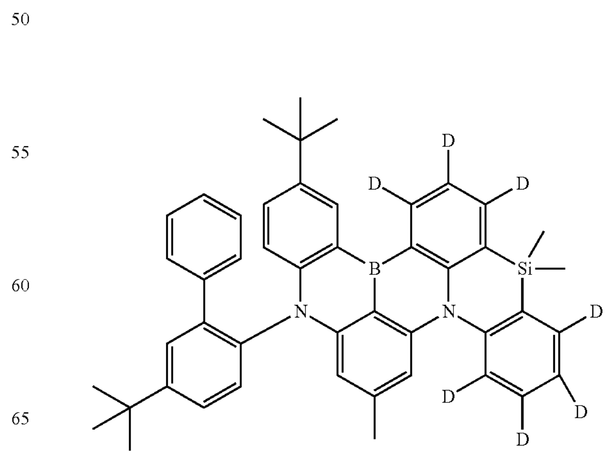

-continued
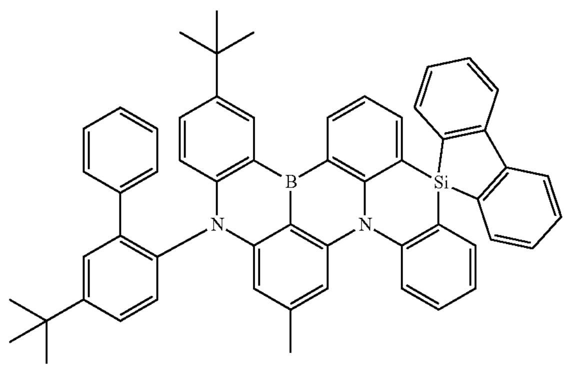
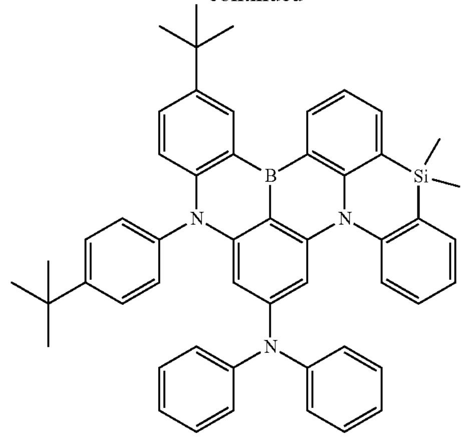
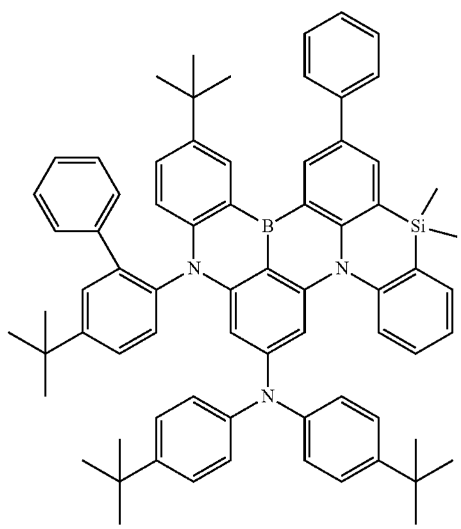
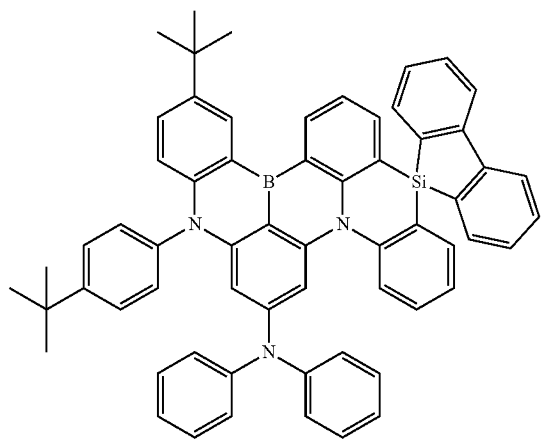
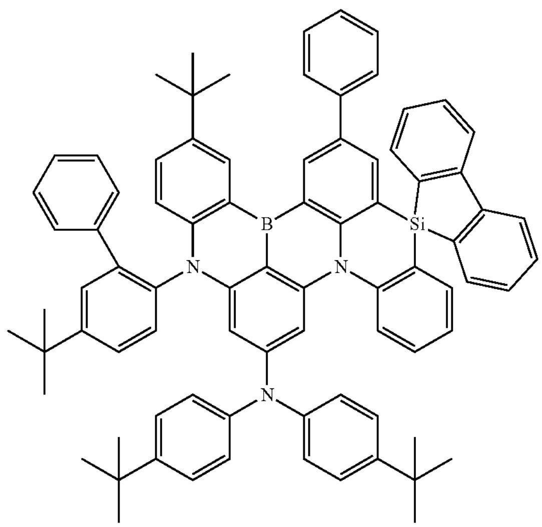
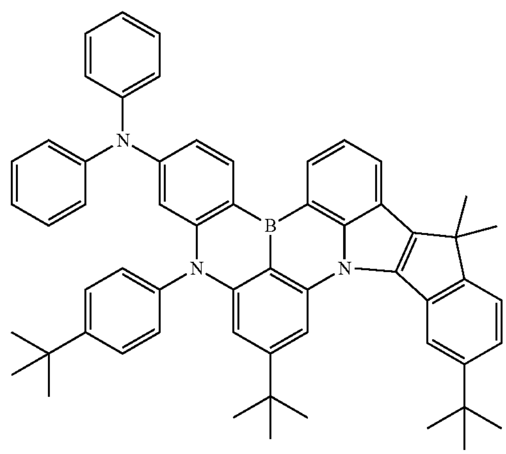
-continued -continued
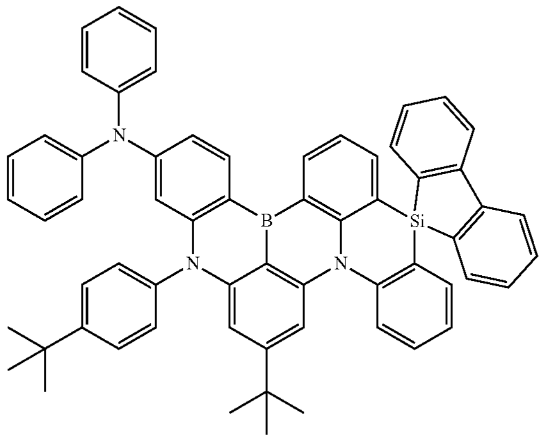
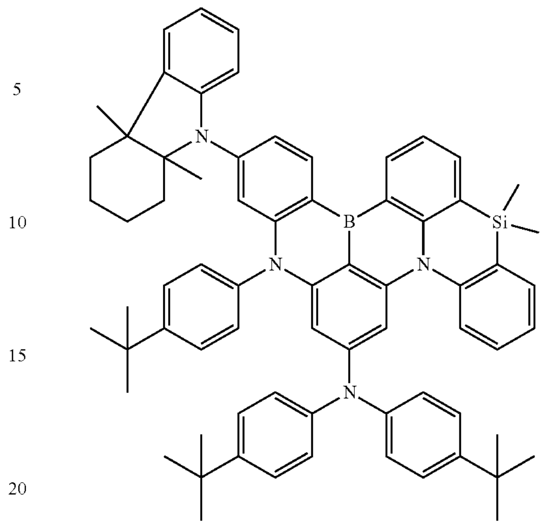
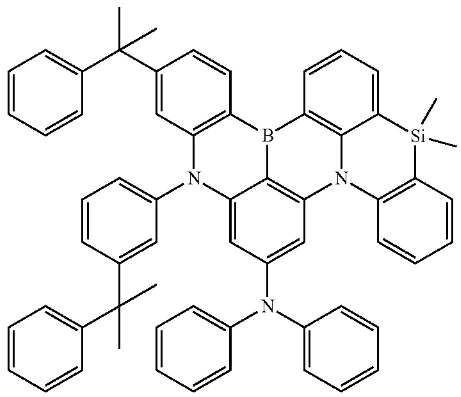
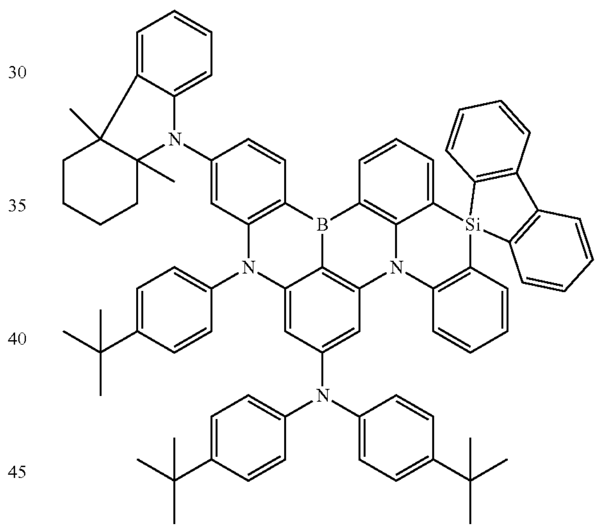
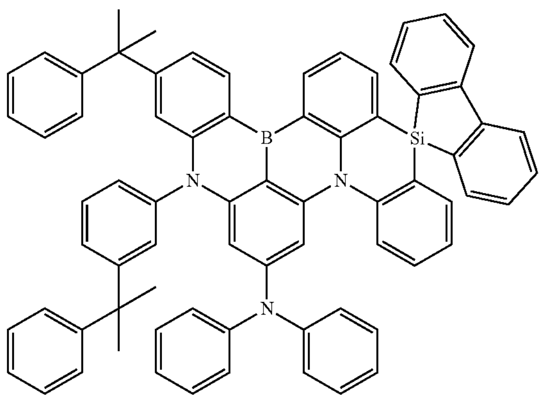
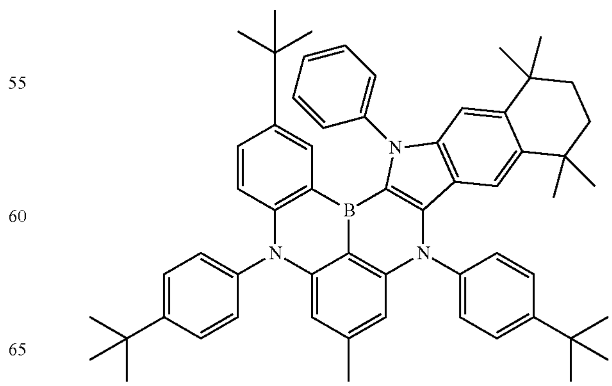

-continued
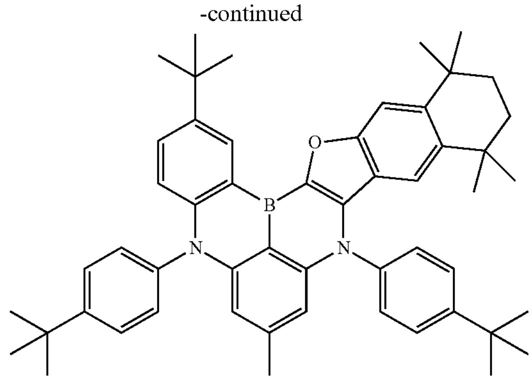
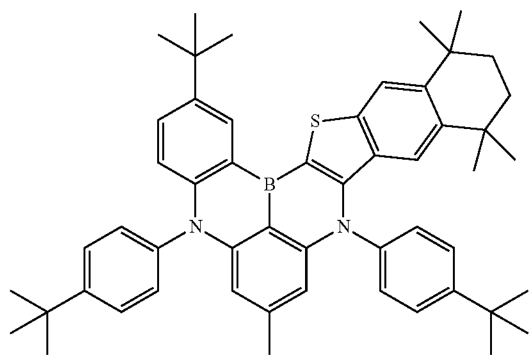
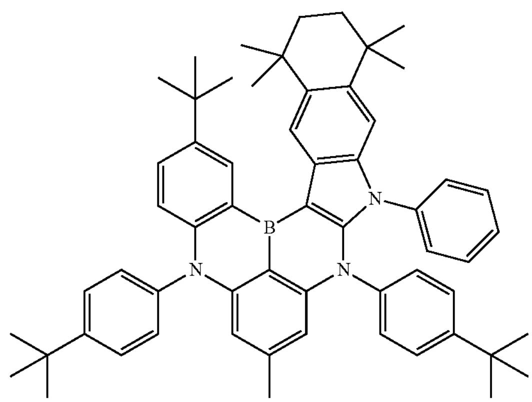
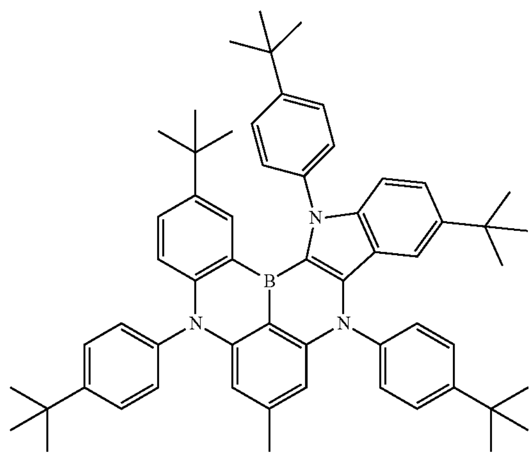
-continued
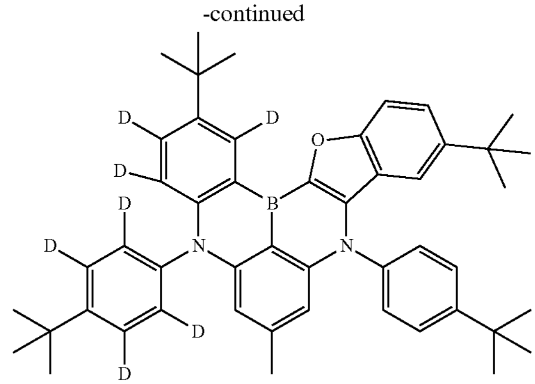
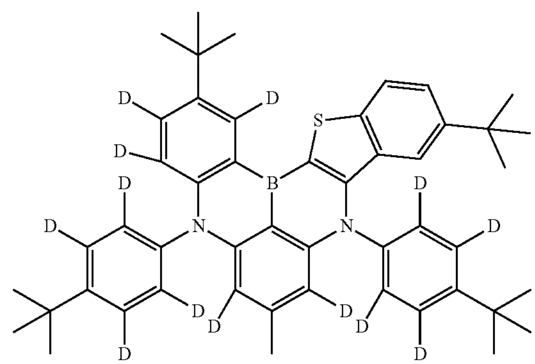
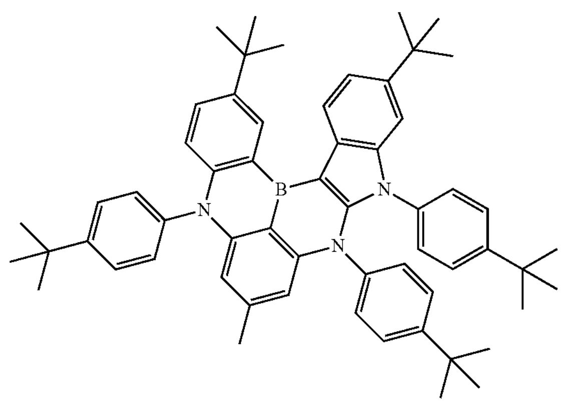
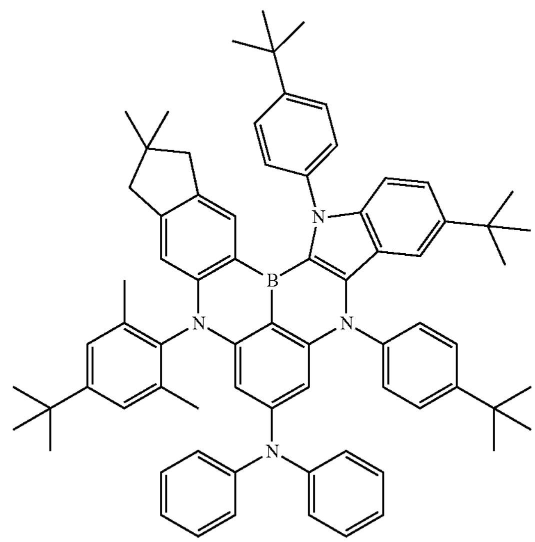

-continued
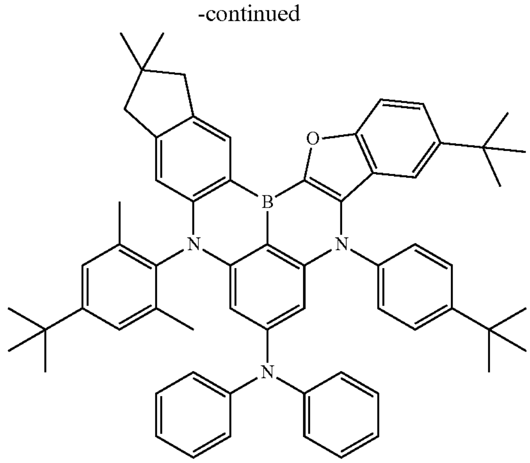
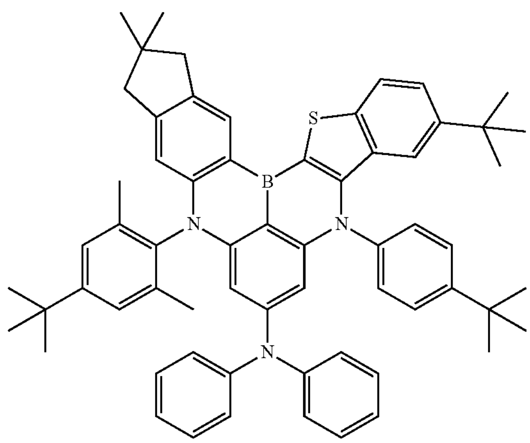
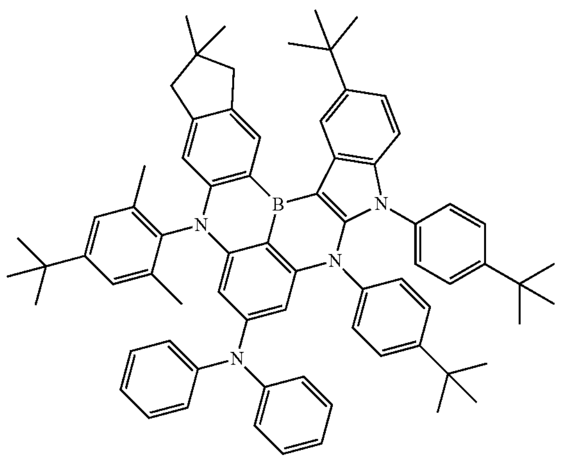
-continued
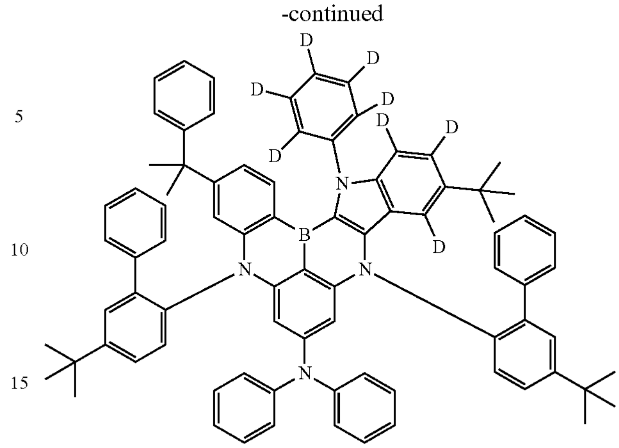
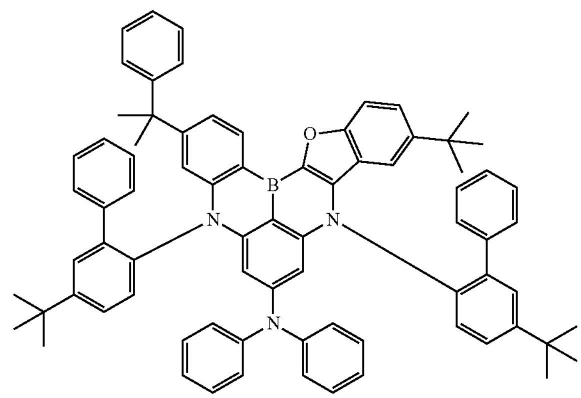
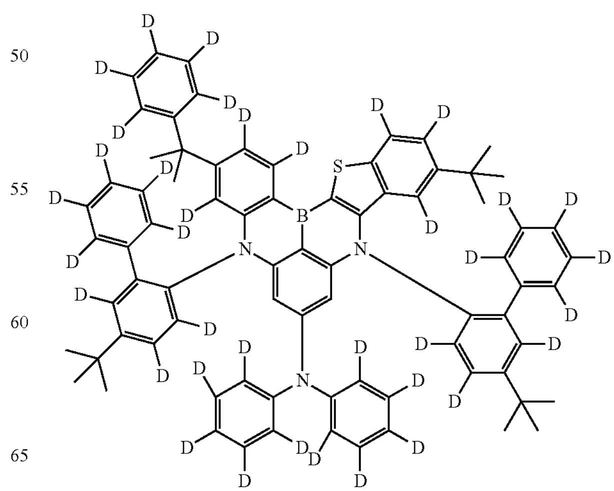

-continued
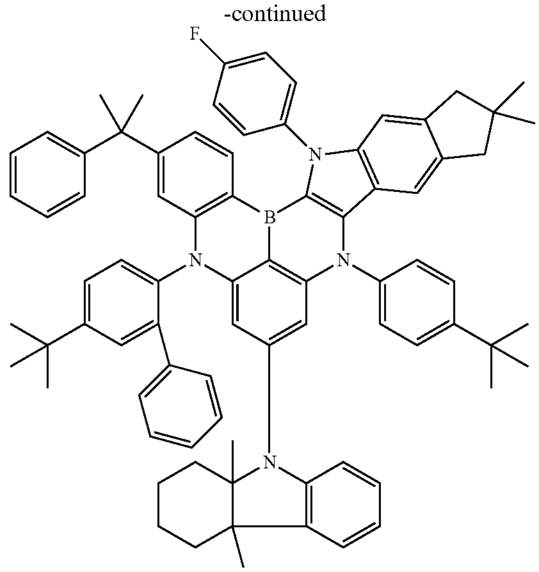
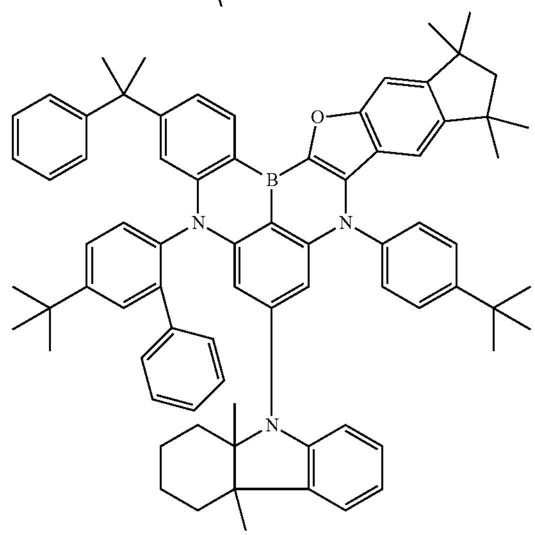
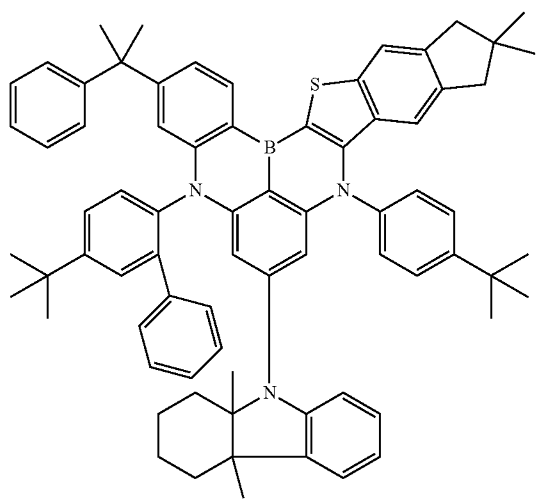
-continued
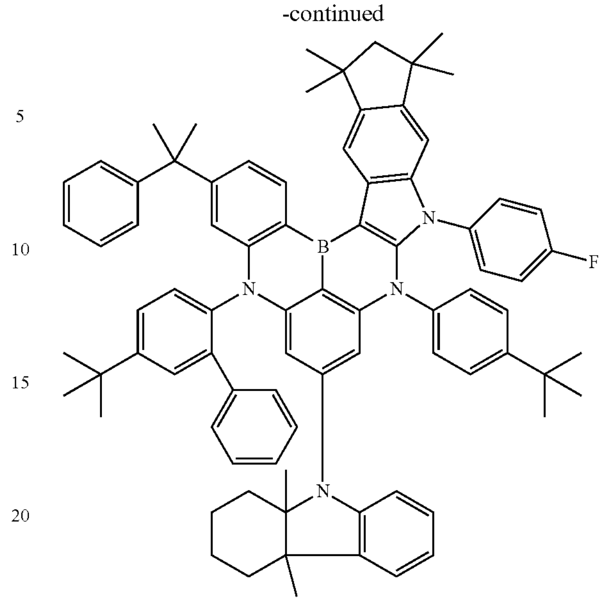
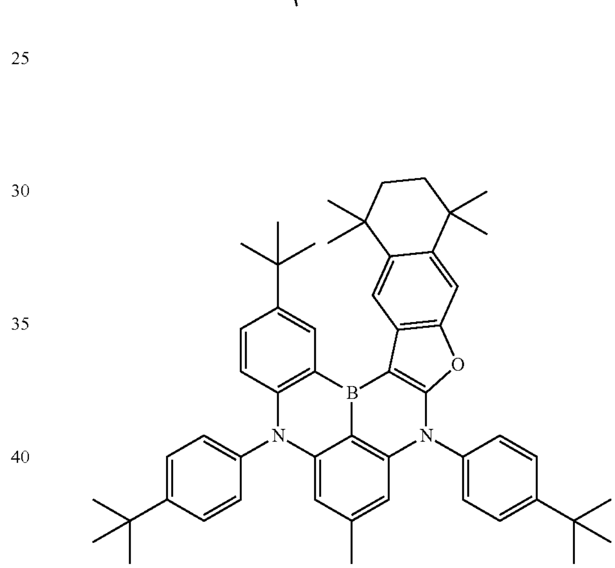
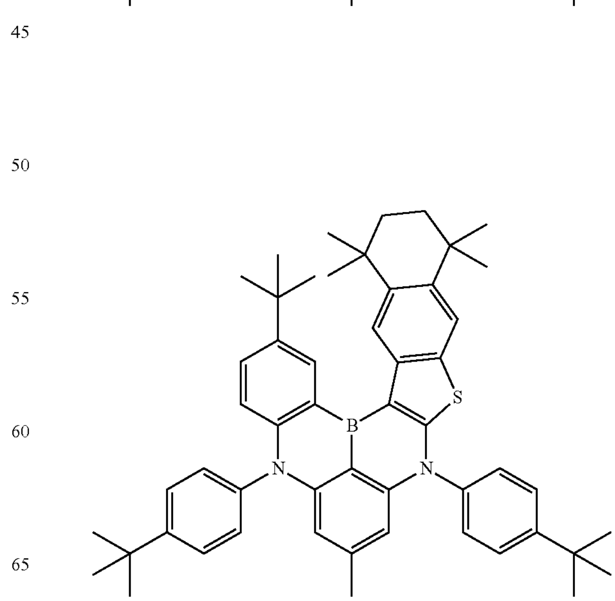

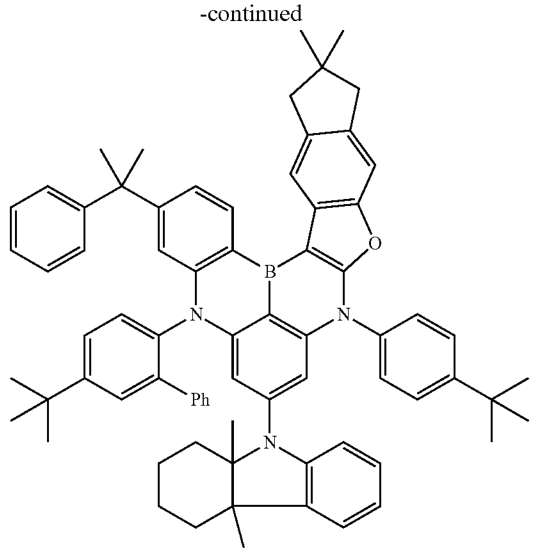
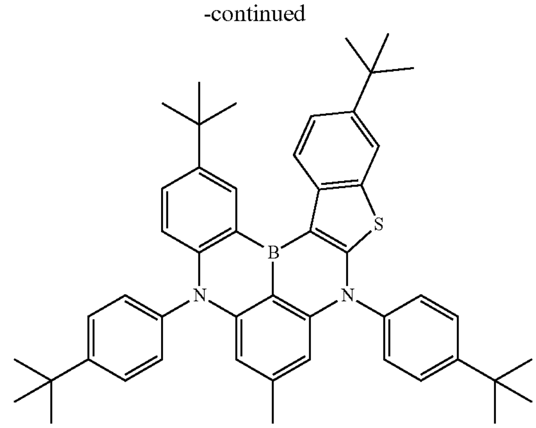
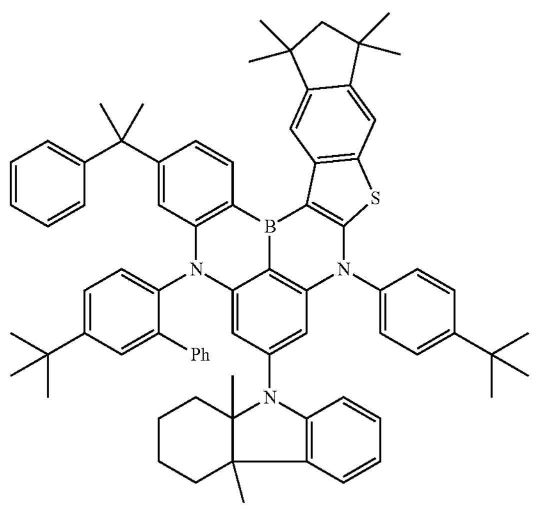
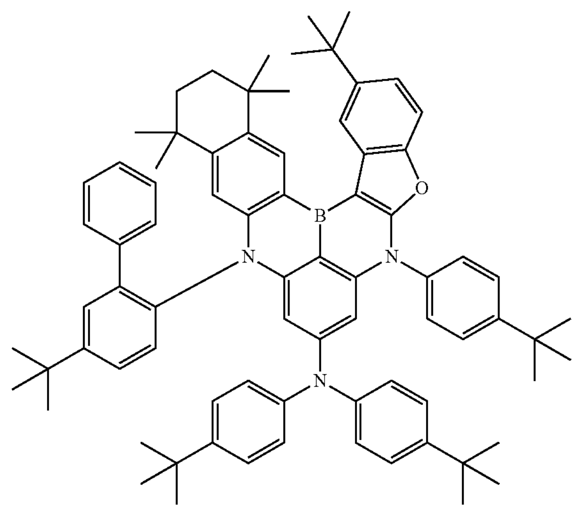
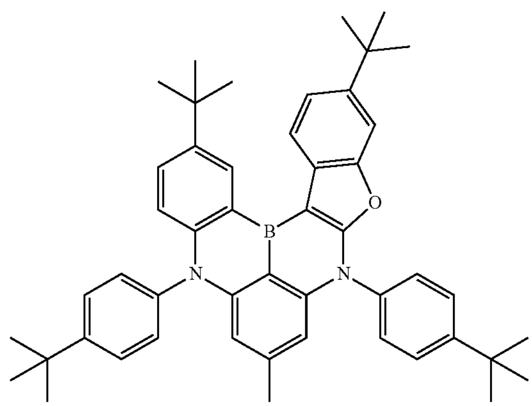
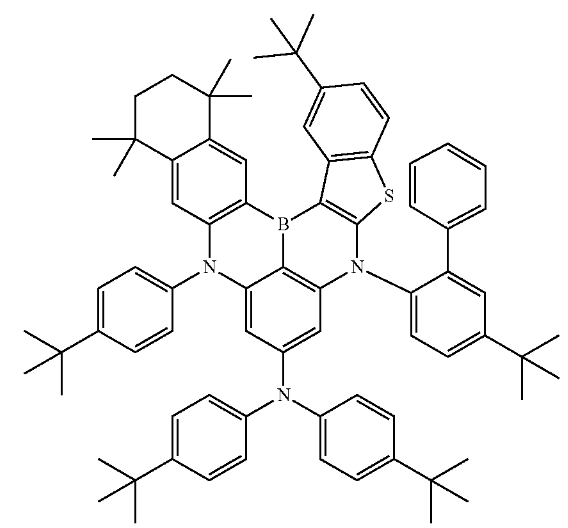

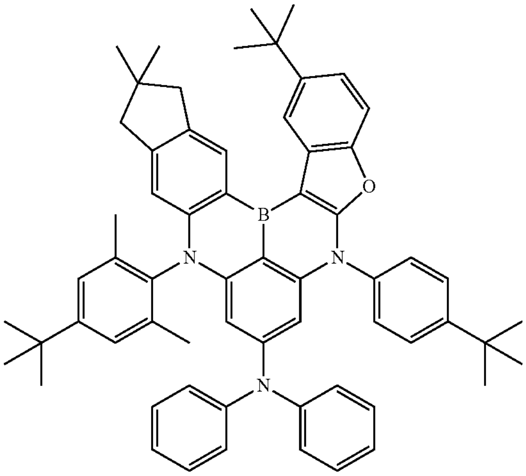
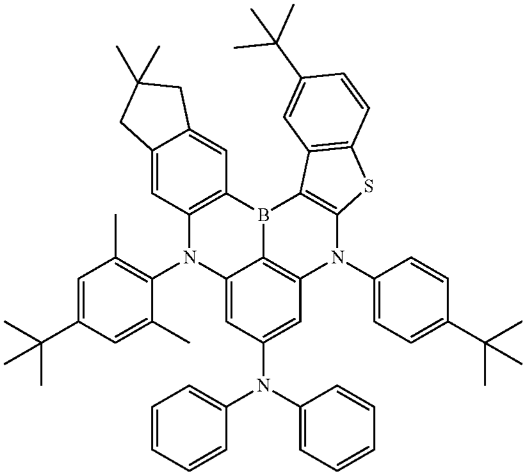
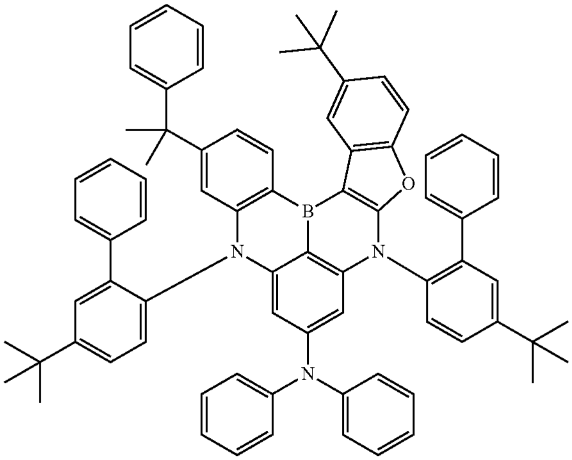
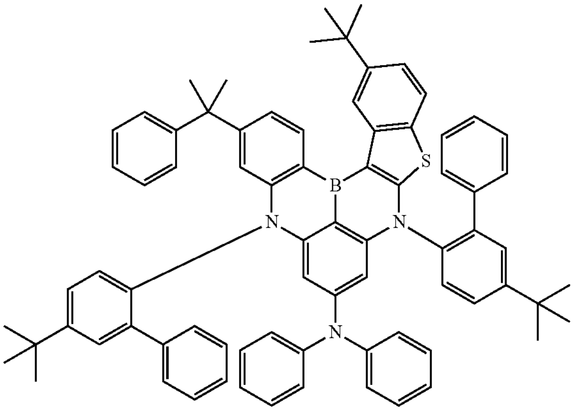
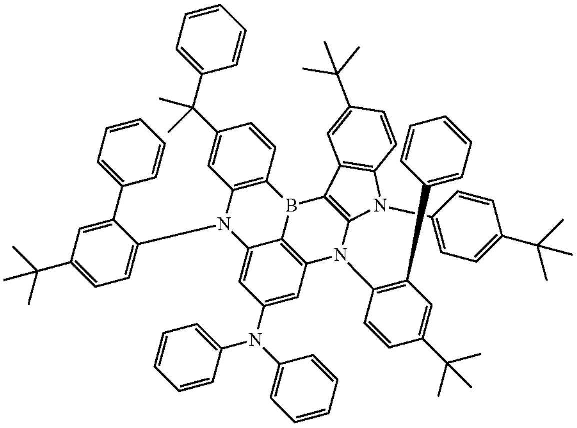
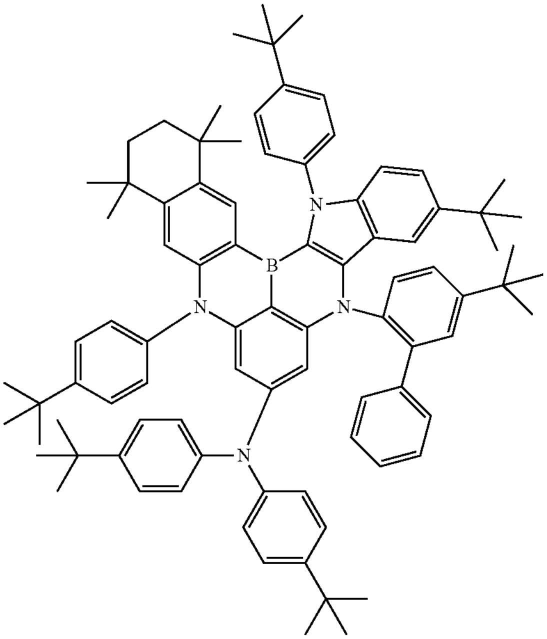

-continued
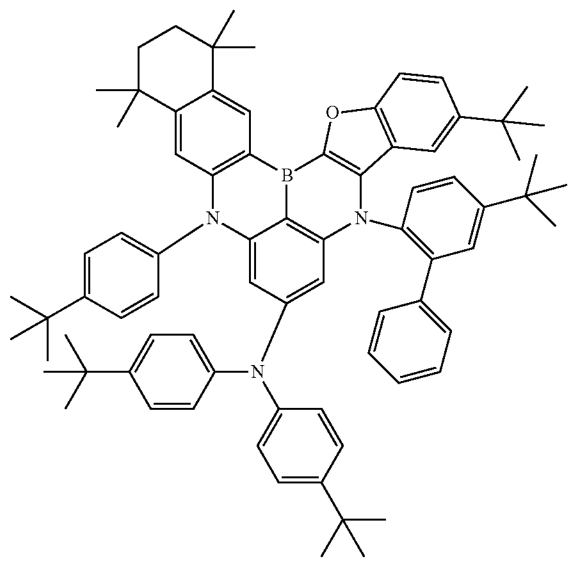
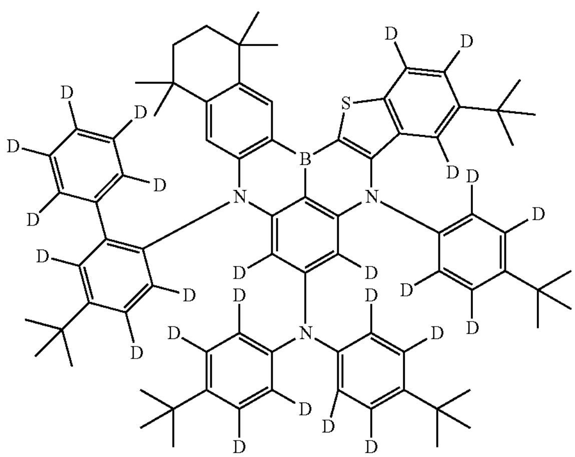
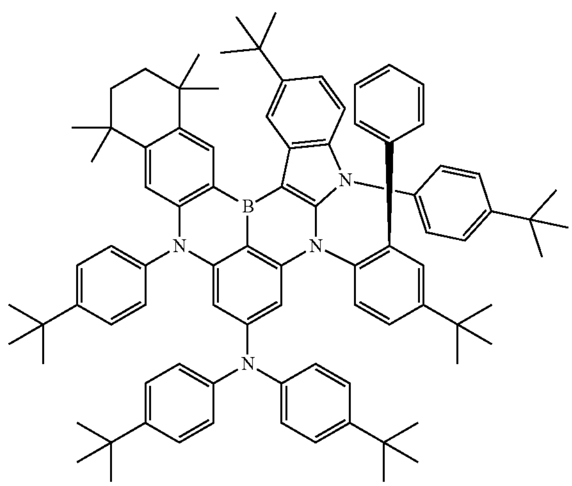
-continued
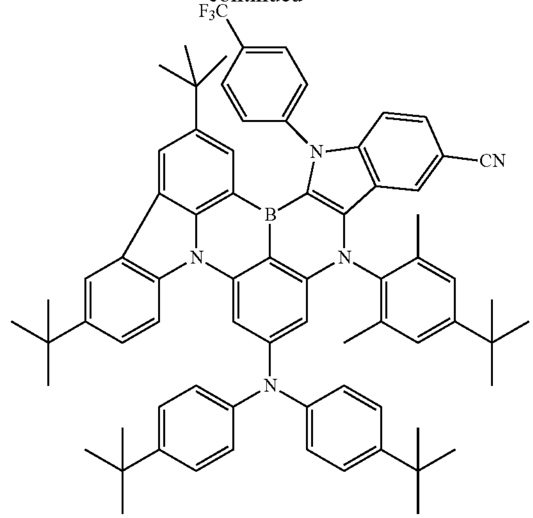
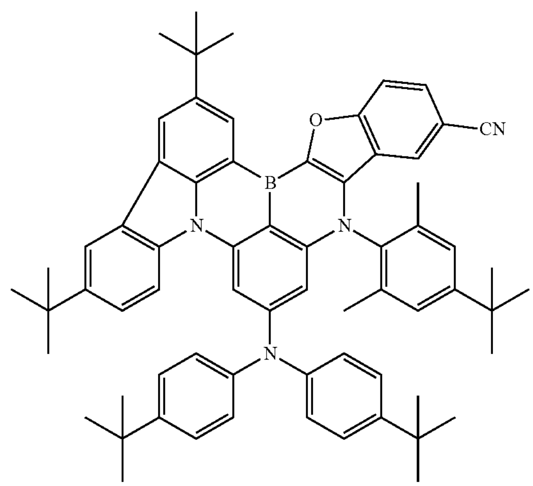
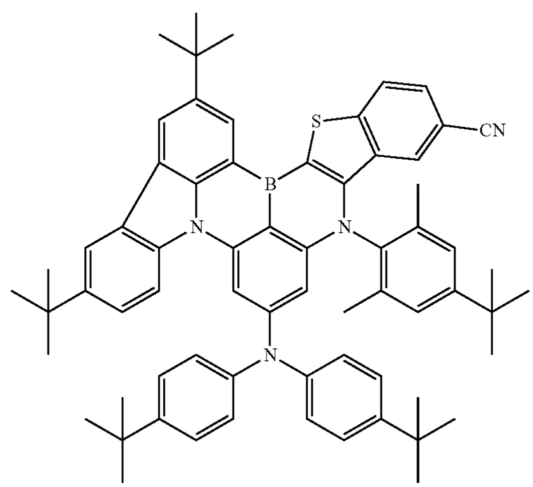

-continued
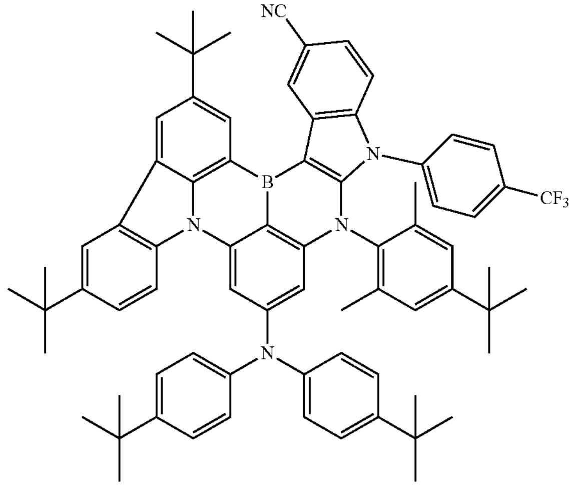
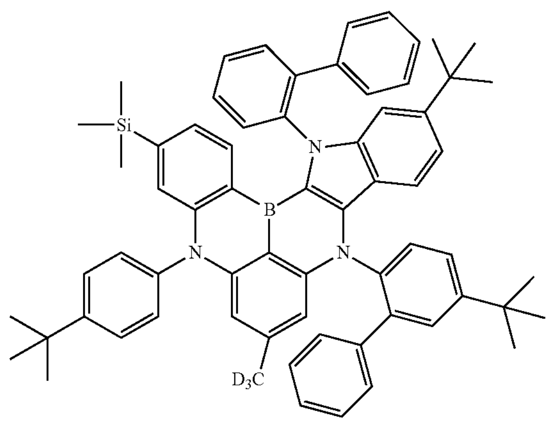
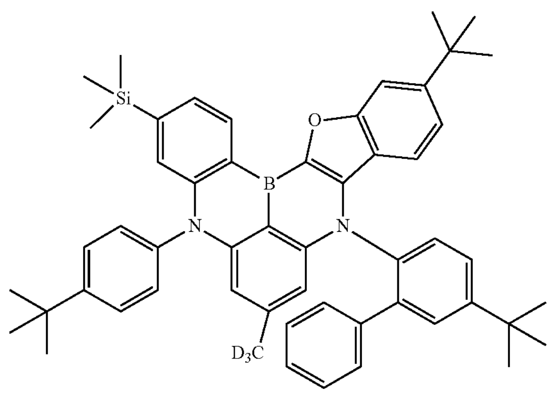
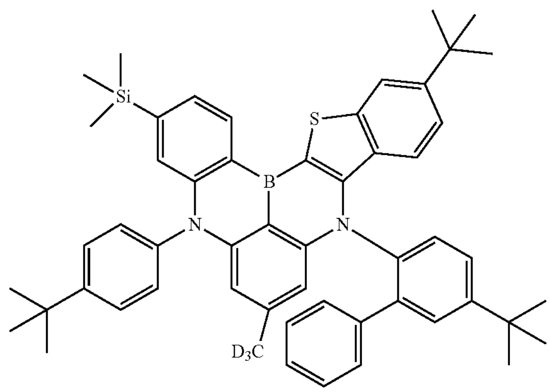
-continued
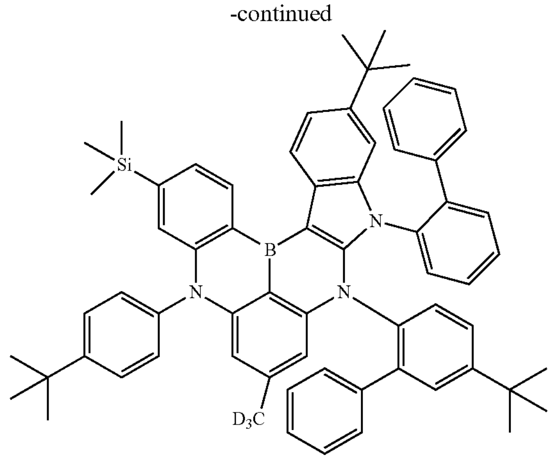
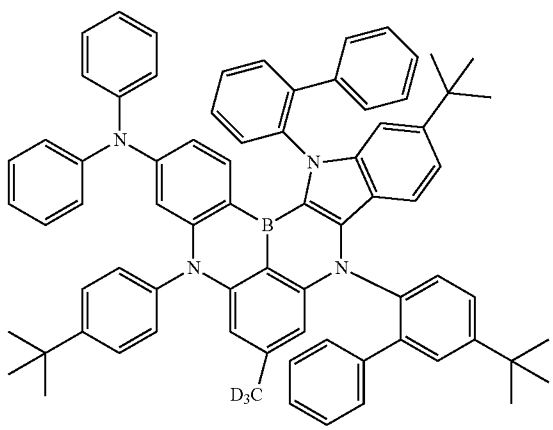
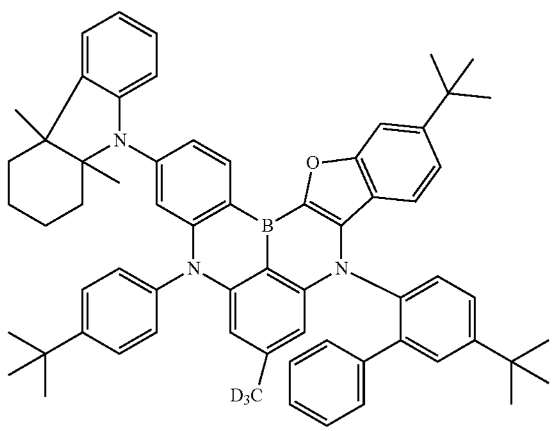
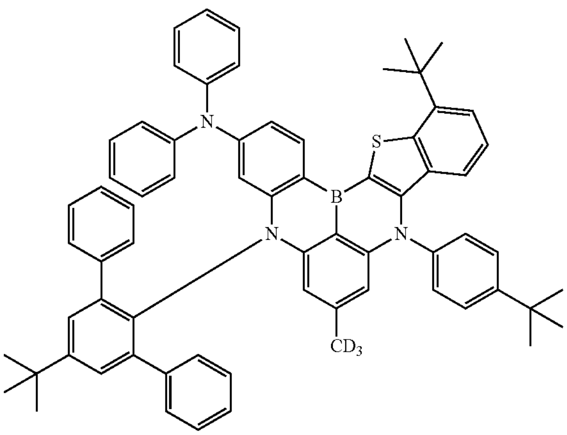

-continued
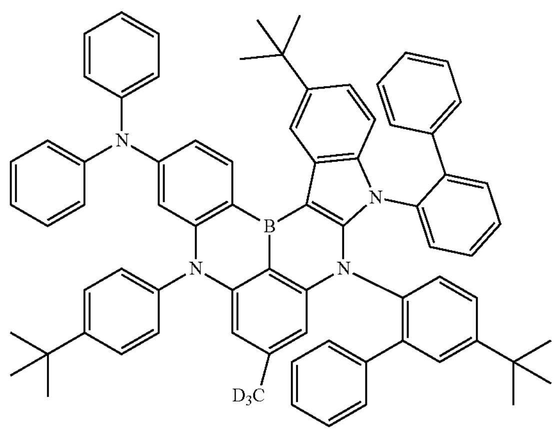
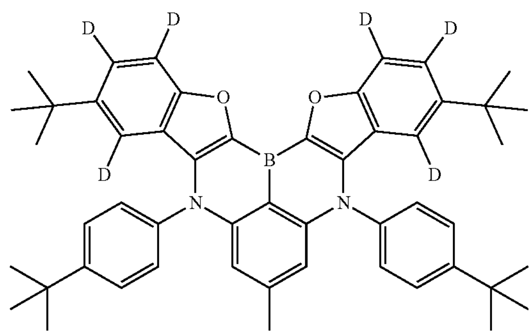
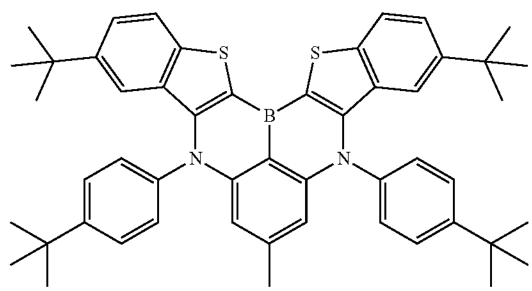
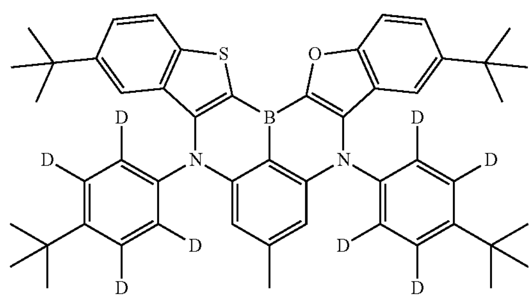
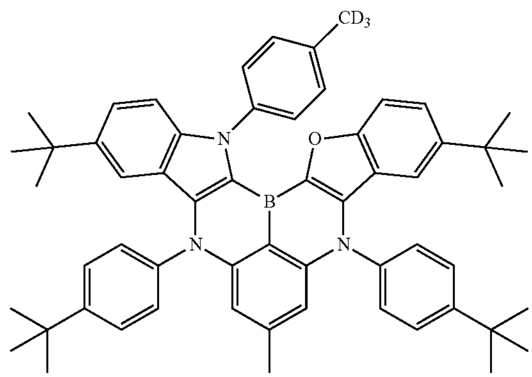
-continued
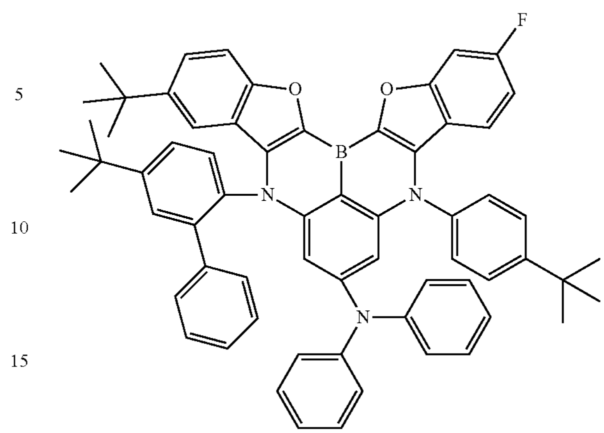
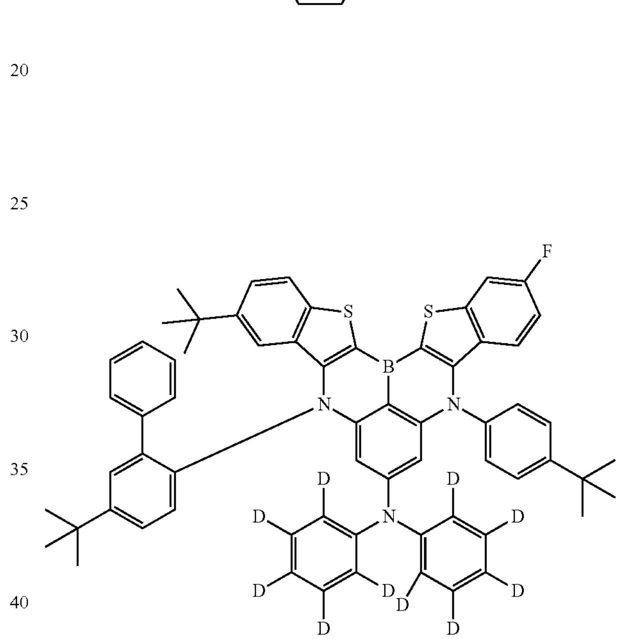
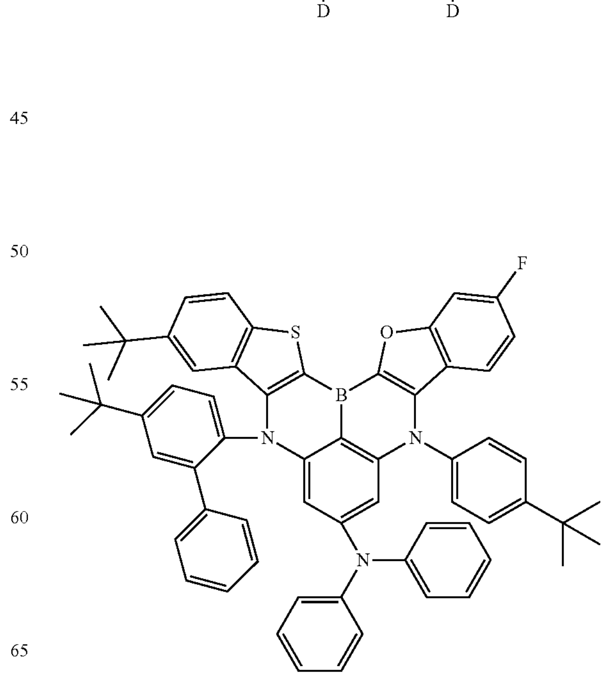

-continued

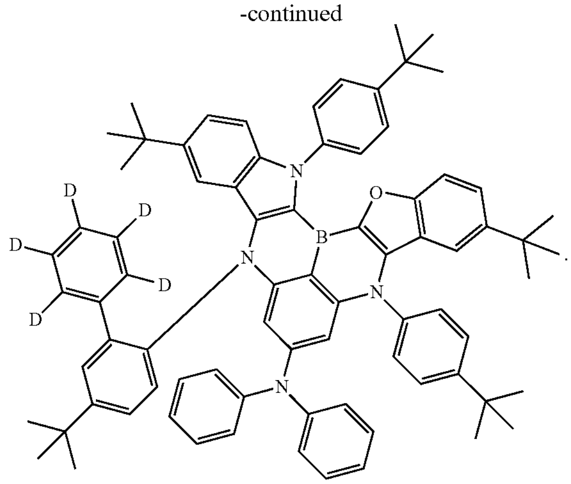

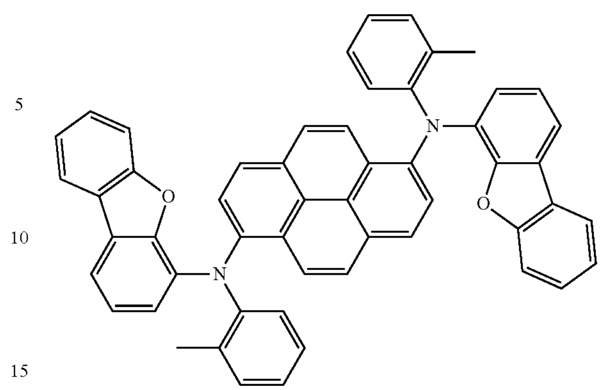

In the compound structures, Ph means a phenyl group.

In one embodiment of the present specification, the light emitting layer further includes a dopant, and the dopant is an amine compound. The amine compound is a compound of the following Chemical Formula 4:

[Chemical Formula 4]

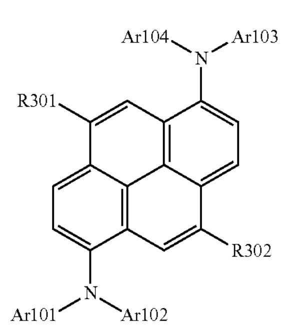

wherein in Chemical Formula 4:

Ar101 to Ar104 are the same as or different from each other, and each independently is a substituted or unsubstituted aryl group or a substituted or unsubstituted heteroaryl group; and vR301 and R302 are the same as or different from each other, and each independently is hydrogen, deuterium, a substituted or unsubstituted alkyl group, a substituted or unsubstituted silyl group, a substituted or unsubstituted aryl group, or a substituted or unsubstituted heteroaryl group.

According to one embodiment of the present specification, Ar101 to Ar104 are the same as or different from each other, and each independently is an aryl group having 6 to 30 carbon atoms, or an N—, O- or S-containing heteroaryl group having 2 to 30 carbon atoms, and Ar101 to Ar104 are unsubstituted or substituted with deuterium, an alkyl group, a deuterated alkyl group, an aryl group, or a deuterated aryl group.

In one embodiment of the present specification, Chemical Formula 4 is the following compound:

According to one embodiment of the present specification, a method for manufacturing the organic light emitting device includes preparing a substrate; forming a first electrode on the substrate; forming one or more organic material layers including a light emitting layer on the first electrode; and forming a second electrode on the organic material layer, wherein the light emitting layer includes the compound of Chemical Formula 1 and the compound of Chemical Formula 2 described above.

In one embodiment of the present specification, the forming of a light emitting layer includes forming one or more organic material layers using one deposition source including both the compound of Chemical Formula 1 and the compound of Chemical Formula 2.

In one embodiment of the present specification, the forming of a light emitting layer includes forming one or more organic material layers using a deposition source including the compound of Chemical Formula 1 and a deposition source including the compound of Chemical Formula 2.

The organic material layer of the organic light emitting device of the present specification can be formed in a single layer structure, but can be formed in a multilayer structure in which two or more organic material layers are laminated. For example, as a representative example of the organic light emitting device the present specification, the organic light emitting device can include only one light emitting layer as the organic material layer, but can have a structure including, in addition to the light emitting layer, one or more layers selected from the group consisting of a hole injection layer, a hole transfer layer, a hole control layer, a layer carrying out hole injection and hole transfer at the same time, an additional light emitting layer, an electron injection layer, an electron transfer layer, an electron control layer and a layer carrying out electron injection and electron transfer at the same time.

In one embodiment of the present specification, the organic light emitting device can be an organic light emitting device having a structure in which an anode, one or more organic material layers and a cathode are consecutively laminated on a substrate (normal type).

In one embodiment of the present specification, the organic light emitting device can be an organic light emitting device having a structure in a reverse direction in which a cathode, one or more organic material layers and an anode are consecutively laminated on a substrate (inverted type).

For example, structures of the organic light emitting device according to one embodiment of the present specification are illustrated in FIG. 1 to FIG. 3. FIG. 1 to FIG. 3 only illustrate the organic light emitting device, and the organic light emitting device is not limited thereto.

FIG. 1 illustrates a structure of the organic light emitting device (10) in which a substrate (20), an anode (30), a light emitting layer (40) and a cathode (50) are consecutively laminated.

FIG. 2 illustrates a structure of the organic light emitting device in which a substrate (20), an anode (30), a hole injection layer (60), a hole transfer layer (70), a hole control layer (80), a light emitting layer (40), an electron control layer (90), an electron transfer layer (100), an electron injection layer (110), a cathode (50) and a capping layer (120) are consecutively laminated.

FIG. 3 illustrates a structure of the organic light emitting device in which a substrate (20), an anode (30), a hole injection layer (60), a hole transfer layer (70), a light emitting layer (40), an electron transfer layer (100) and a cathode (50) are consecutively laminated, and the hole transfer layer can be one or two layers.

The organic light emitting device of the present specification can be manufactured using materials and methods known in the art, except for including a light emitting layer including the compound of Chemical Formula 1 and the compound of Chemical Formula 2 described above.

When the organic light emitting device includes a plurality of organic material layers, the organic material layers can be formed with the same materials or different materials.

For example, the organic light emitting device according to the present specification can be manufactured by forming an anode on a substrate by depositing a metal, a metal oxide having conductivity, or an alloy thereof using a physical vapor deposition (PVD) method such as sputtering or e-beam evaporation, forming an organic material layer including one or more of a hole injection layer, a hole transfer layer, a layer carrying out hole injection and hole transfer at the same time, an electron control layer, a hole control layer, a light emitting layer, an electron transfer layer, an electron injection layer, a layer carrying out electron injection and electron transfer at the same time thereon, and then depositing a material usable as a cathode thereon. In addition to such a method, the organic light emitting device can also be manufactured by consecutively depositing a cathode material, an organic material layer and an anode material on a substrate.

The one or more organic material layers can be formed using methods known in the art such as a deposition process and a solvent process. When the organic material layer includes two or more materials in the deposition process, co-deposition of depositing the two or more materials each through a different deposition source can be used, or a method of depositing with one deposition source after pre-mixing the two or more materials can be used. Examples of the solvent process can include a method of spin coating, dip coating, doctor blading, screen printing, inkjet printing, a thermal transfer method or the like.

The anode is an electrode injecting holes, and as the anode material, materials having large work function are normally preferred so that hole injection to an organic material layer is smooth. Specific examples of the anode material usable in the present disclosure include metals such as vanadium, chromium, copper, zinc and gold, or alloys thereof; metal oxides such as zinc oxide, indium oxide, indium tin oxide (ITO) and indium zinc oxide (IZO); combinations of metals and oxides such as ZnO:Al or $SnO_2$:Sb; conductive polymers such as poly(3-methylthiophene), poly[3,4-(ethylene-1,2-dioxy)thiophene] (PEDOT), polypyrrole and polyaniline, but are not limited thereto.

The cathode is an electrode injecting electrons, and as the cathode material, materials having small work function are normally preferred so that electron injection to an organic material layer is smooth. Specific examples of the cathode material include metals such as magnesium, calcium, sodium, potassium, titanium, indium, yttrium, lithium, gadolinium, aluminum, silver, tin and lead, or alloys thereof; multilayer structure materials such as LiF/Al or $LiO_2$/Al, and the like, but are not limited thereto.

The hole injection layer is a layer performing a role of smoothly injecting holes from an anode to a light emitting layer, and the hole injection material is a material capable of favorably receiving holes from an anode at a low voltage. The highest occupied molecular orbital (HOMO) of the hole injection material is preferably in between the work function of an anode material and the HOMO of surrounding organic material layers. Specific examples of the hole injection material include metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer can perform a role of smoothly transferring holes. As the hole transfer material, materials capable of receiving holes from an anode or a hole injection layer, moving the holes to a light emitting layer, and having high mobility for the holes are suited. Specific examples thereof include arylamine-based organic materials, conductive polymers, block copolymers having conjugated parts and non-conjugated parts together, and the like, but are not limited thereto.

A hole control layer can be provided between the hole transfer layer and the light emitting layer. As the hole control layer, materials known in the art can be used.

An electron control layer can be provided between the electron transfer layer and the light emitting layer. As the electron control layer, materials known in the art can be used.

The light emitting layer can emit red, green or blue, and can be formed with a phosphorescence material or a fluorescence material. The light emitting material is a material capable of emitting light in a visible region by receiving holes and electrons from a hole transfer layer and an electron transfer layer, respectively, and binding the holes and the electrons, and is preferably a material having favorable quantum efficiency for fluorescence or phosphorescence.

In addition to the two types of hosts of the composition described above, a host material of the light emitting layer includes fused aromatic ring derivatives, heteroring-containing compounds or the like. Specifically, the fused aromatic ring derivative includes anthracene derivatives, pyrene derivatives, naphthalene derivatives, pentacene derivatives, phenanthrene compounds, fluoranthene compounds and the like, and the heteroring-containing compound includes carbazole derivatives, dibenzofuran derivatives, ladder-type furan compounds, pyrimidine derivatives and the like, however, the host material is not limited thereto.

When the light emitting layer emits red light, phosphorescence materials such as bis(1-phenylisoquinoline)acetylacetonate iridium (PIQIr(acac)), bis(1-phenylquinoline) acetylacetonate iridium (PQIr(acac)), tris(1-phenylquinoline)iridium (PQIr) or octaethylporphyrin platinum (PtOEP), or fluorescence materials such as tris(8-hydroxyquinolino)aluminum ($Alq_3$) can be used as the light emitting dopant, however, the light emitting dopant is not limited thereto. When the light emitting layer emits green light, phosphorescence materials such as fac tris(2-phenylpyridine)iridium ($Ir(ppy)_3$), or fluorescence materials such as tris(8-hydroxyquinolino)aluminum ($Alq_3$), anthracene-based compounds, pyrene-based compounds or boron-based compounds can be used as the light emitting dopant, however, the light emitting dopant is not limited thereto. When the light emitting layer emits blue light, phosphorescence materials such as $(4,6\text{-}F_2ppy)_2Irpic$, or fluorescence materials such as spiro-DPVBi, spiro-6P, distyrylbenzene (DSB), distyrylarylene (DSA), PFO-based polymers, PPV-based polymers, anthracene-based compounds, pyrene-based compounds or boron-based compounds can be used as the light emitting dopant, however, the light emitting dopant is not limited thereto.

The electron transfer layer can perform a role of smoothly transferring electrons. As the electron transfer material, materials capable of favorably receiving electrons from a cathode, moving the electrons to a light emitting layer, and having high mobility for the electrons are suited. Specific examples thereof include Al complexes of 8-hydroxyquinoline; complexes including $Alq_3$; organic radical compounds; hydroxyflavon-metal complexes, and the like, but are not limited thereto.

The electron injection layer can perform a role of smoothly injecting electrons. As the electron injection material, compounds having an electron transferring ability, having an electron injection effect from a cathode, having an excellent electron injection effect for a light emitting layer or light emitting material, preventing excitons generated in the light emitting layer from migrating to a hole injection layer, and in addition thereto, having an excellent thin film forming ability are preferred. Specific examples thereof can include fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound includes 8-hydroxyquinolinato lithium, bis(8-hydroxyquinolinato)zinc, bis(8-hydroxy-quinolinato)copper, bis(8-hydroxyquinolinato)-manganese, tris(8-hydroxyquinolinato)aluminum, tris(2-methyl-8-hydroxy-quinolinato)aluminum, tris(8-hydroxyquinolinato)-gallium, bis(10-hydroxybenzo[h]quinolinato)beryllium, bis(10-hydroxy-benzo[h]quinolinato)zinc, bis(2-methyl-8-quinolinato)-chlorogallium, bis(2-methyl-8-quinolinato) (o-cresolato)-gallium, bis(2-methyl-8-quinolinato) (1-naphtholato) aluminum, bis(2-methyl-8-quinolinato)(2-naphtholato) gallium and the like, but is not limited thereto.

The organic light emitting device according to the present disclosure can be a top-emission type, a bottom-emission type or a dual-emission type depending on the materials used.

The organic light emitting device according to the present specification can be included and used in various electronic devices. For example, the electronic device can be a display panel, a touch panel, a solar module, an illumination device or the like, but is not limited thereto.

EXAMPLES

Hereinafter, the present specification will be described in more detail through examples. However, the following examples are for illustrative purposes only, and not for limiting the present specification.

Preparation Example

BH 1-1

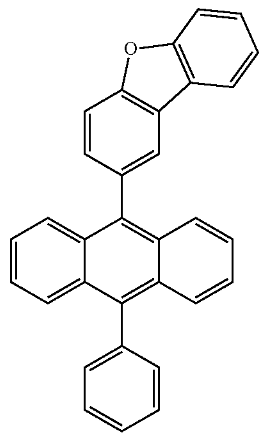

BH 1-2

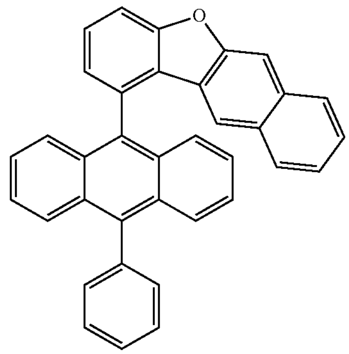

BH 1-3

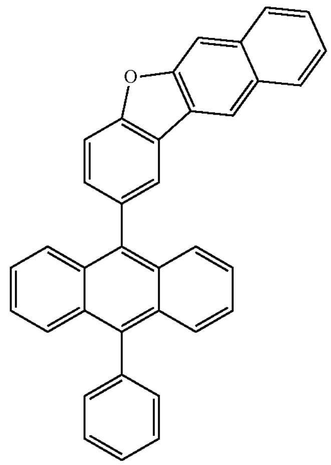

-continued
BH 1-4
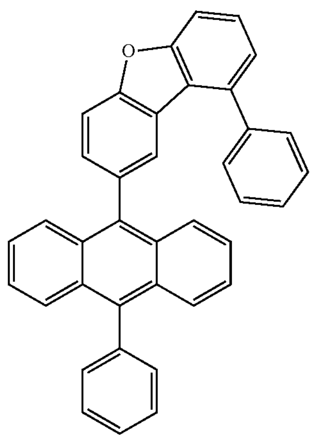
BH 1-5
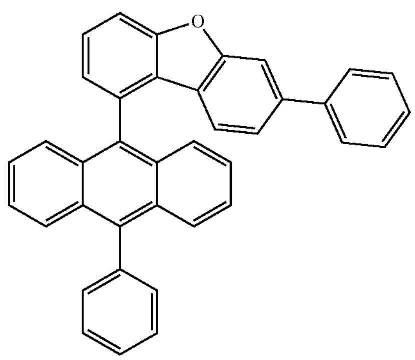
BH 1-6
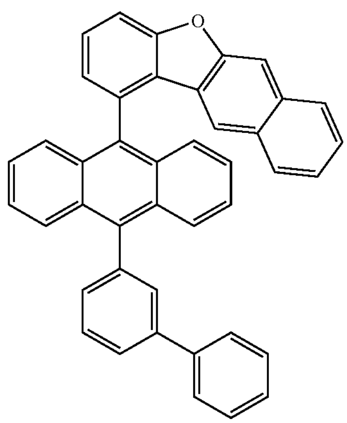
-continued
BH 1-7
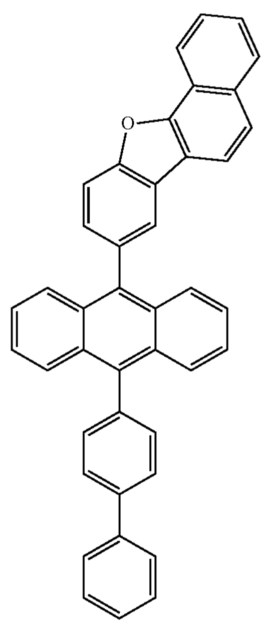
BH 1-8
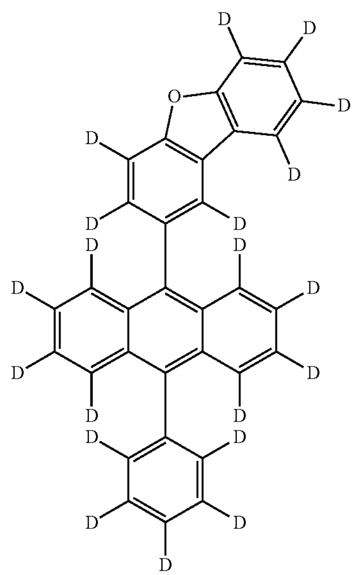
BH 2-1
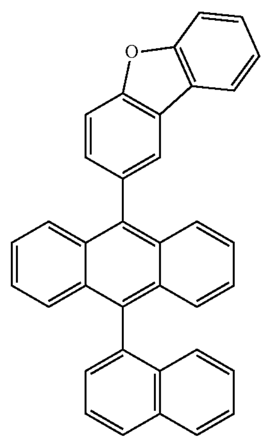

-continued
BH 2-2
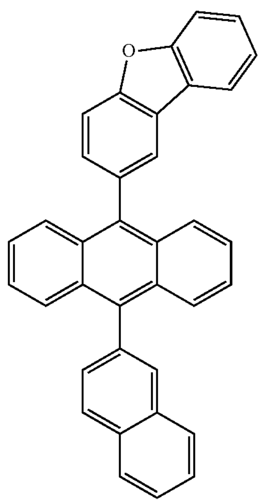
BH 2-3
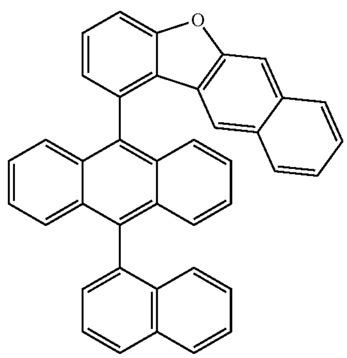
BH 2-4
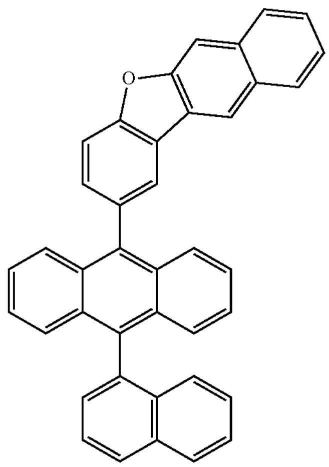
-continued
BH 2-5
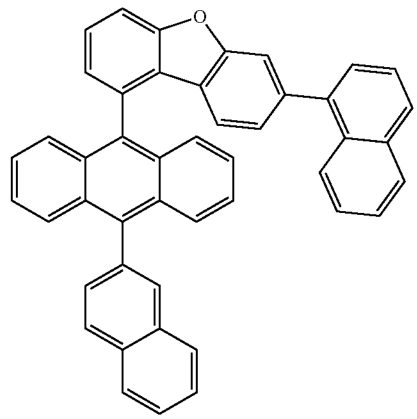
BH 2-6
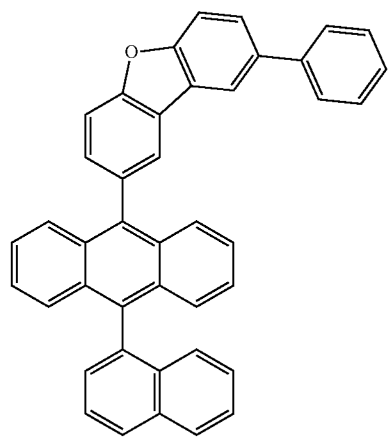
BH 2-7
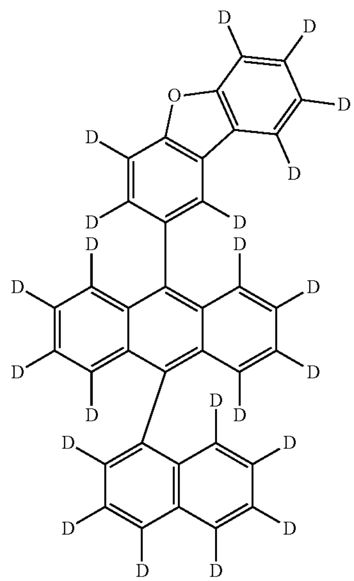

-continued

BH 2-8

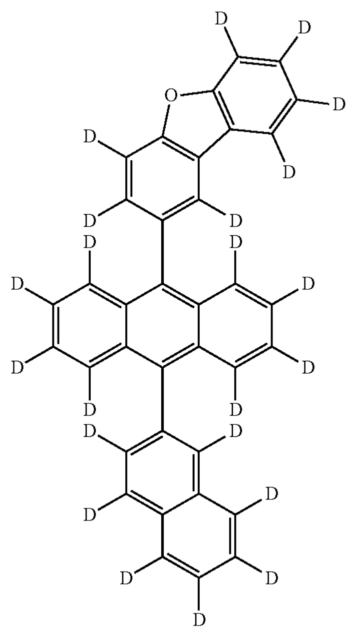

Preparation Example 1. Preparation of Compound BH 1-1

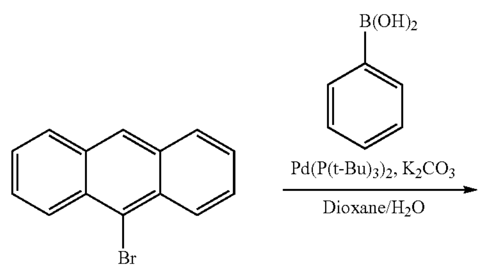

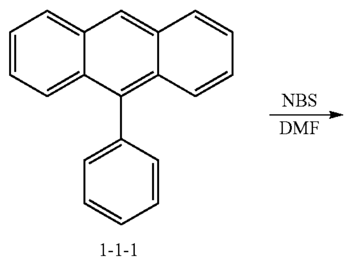

1-1-1

-continued

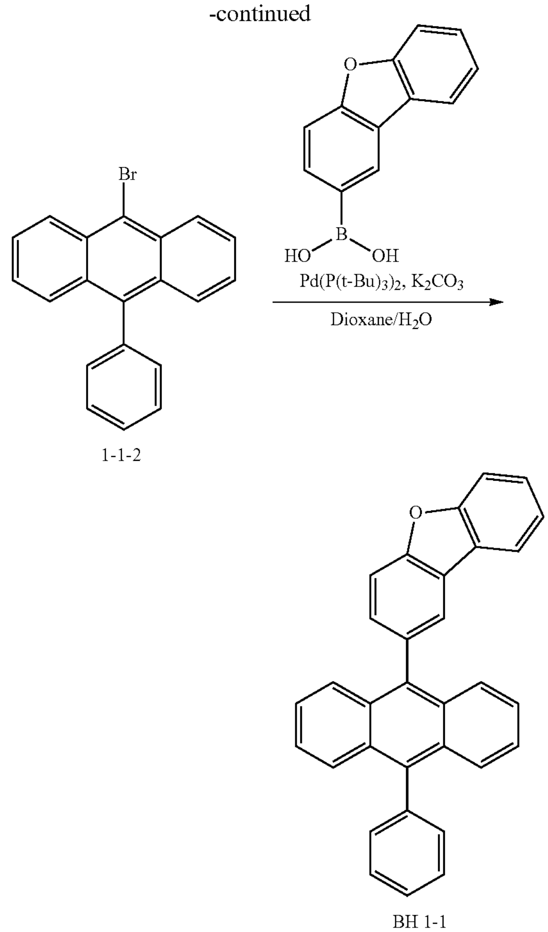

1-1-2

BH 1-1

Preparation Example 1-1) Preparation of Compound 1-1-1

In a three-neck flask, 9-bromoanthracene (50.0 g, 194 mmol) and phenylboronic acid (26.1 g, 214 mmol) were dissolved in 1,4-dioxane (500 ml), and $K_2CO_3$ (80.6 g, 583 mmol) dissolved in $H_2O$ (200 ml) was introduced thereto. $Pd(P(t\text{-}Bu)_3)_2$ (1.98 g, 3.9 mmol) was introduced thereto, and the mixture was stirred for 5 hours under an argon atmosphere reflux condition. When the reaction was finished, the temperature was lowered to room temperature, and the reaction solution was transferred to a separatory funnel and extracted with water and toluene. The extract was dried with $MgSO_4$, then filtered and concentrated, and the sample was purified by silica gel column chromatography to obtain Compound 1-1-1 (40.5 g, yield 82%, MS[M+H]+ =255).

Preparation Example 1-2) Preparation of Compound 1-1-2

To a 2-neck flask, Compound 1-1-1 (20.0 g, 78.6 mmol), N-bromosuccinimide (NBS) (16.5 g, 86.5 mmol) and dimethylformamide (DMF) (300 ml) were introduced, and stirred for 10 hours at room temperature under an argon atmosphere. After the reaction was finished, the reaction solution was transferred to a separatory funnel and extracted with water and ethyl acetate. The extract was dried with $MgSO_4$, then filtered and concentrated, and the sample was purified by silica gel column chromatography to obtain Compound 1-1-2 (16.4 g, yield 63%, MS[M+H]+=334).

Preparation Example 1-3) Preparation of Compound BH 1-1

In a three-neck flask, Compound 1-1-2 (20.0 g, 60.0 mmol) and dibenzofuran-2-boronic acid (19.1 g, 90.0 mmol) were dissolved in 1,4-dioxane (300 ml), and $K_2CO_3$ (20.7 g, 150 mmol) dissolved in $H_2O$ (100 ml) was introduced thereto. $Pd(P(t-Bu)_3)_2$ (0.61 g, 1.2 mmol) was introduced thereto, and the mixture was stirred for 5 hours under an argon atmosphere reflux condition. When the reaction was finished, the temperature was lowered to room temperature, and the reaction solution was transferred to a separatory funnel and extracted with water and toluene. The extract was dried with $MgSO_4$, then filtered and concentrated, and the sample was purified by silica gel column chromatography to obtain Compound BH 1-1 (17.6 g, yield 70%, MS[M+H]+=421).

Preparation Example 2. Preparation of Compound BH 1-2

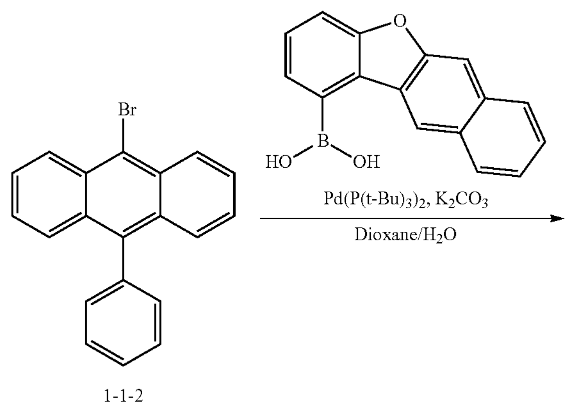

1-1-2

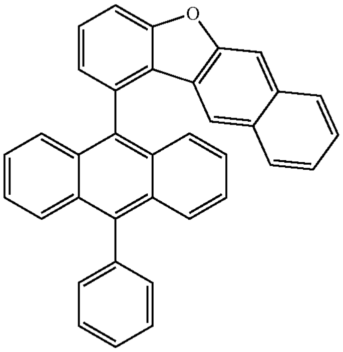

BH 1-2

Compound BH 1-2 (14.4 g, yield 51%, MS[M+H]+=471) was prepared in the same manner as in Preparation Example 1-3 except that naphtho[2,3-b]benzofuran-1-boronic acid was used instead of dibenzofuran-2-boronic acid.

Preparation Example 3. Preparation of Compound BH 1-3

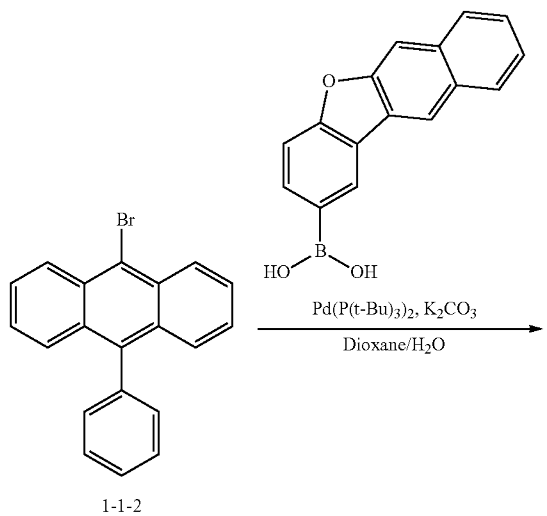

1-1-2

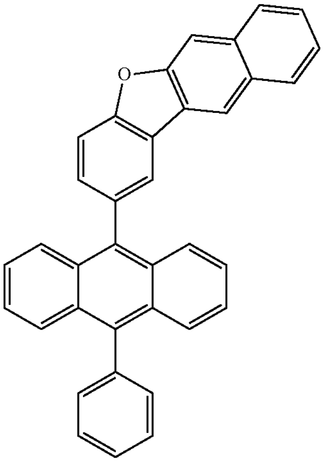

BH 1-3

Compound BH 1-3 (15.0 g, yield 53%, MS[M+H]+=471) was prepared in the same manner as in Preparation Example 1-3 except that naphtho[2,3-b]benzofuran-2-boronic acid was used instead of dibenzofuran-2-boronic acid.

Preparation Example 4. Preparation of Compound BH 1-4

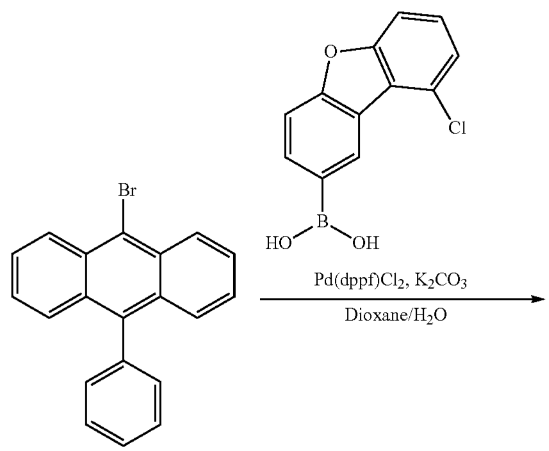

1-1-2

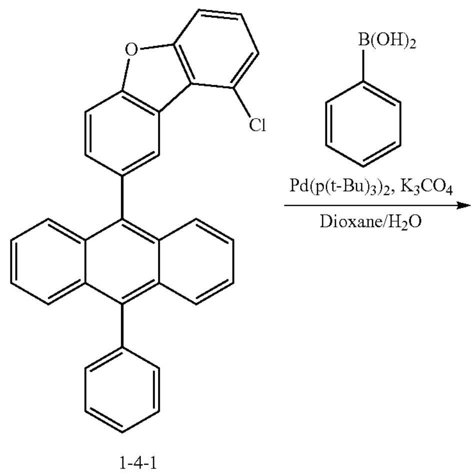

1-4-1

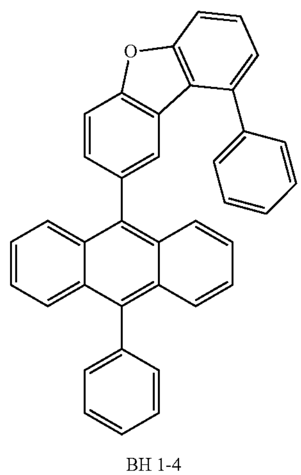

BH 1-4

Preparation Example 4-1) Preparation of Compound 1-4-1

In a three-neck flask, Compound 1-1-2 (20.0 g, 43.9 mmol) and 9-chlorodibenzofuran-2-boronic acid (29.5 g, 90.0 mmol) were dissolved in 1,4-dioxane (300 ml), and $K_2CO_3$ (20.7 g, 150 mmol) dissolved in $H_2O$ (100 ml) was introduced thereto. $Pd(dppf)Cl_2$ (0.55 g, 0.75 mmol) was introduced thereto, and the mixture was stirred for 5 hours under an argon atmosphere reflux condition. When the reaction was finished, the temperature was lowered to room temperature, and the reaction solution was transferred to a separatory funnel and extracted with water and toluene. The extract was dried with $MgSO_4$, then filtered and concentrated, and the sample was purified by silica gel column chromatography to obtain Compound 1-4-1 (20.9 g, yield 61%, MS[M+H]+=455).

Preparation Example 4-2) Preparation of Compound BH 1-4

In a three-neck flask, Compound 1-4-1 (20.0 g, 43.9 mmol) and phenylboronic acid (6.4 g, 52.7 mmol) were dissolved in 1,4-dioxane (200 ml), and $K_3CO_4$ (18.7 g, 88 mmol) dissolved in $H_2O$ (70 ml) was introduced thereto. $Pd(P(t\text{-}Bu)_3)_2$ (0.45 g, 0.88 mmol) was introduced thereto, and the mixture was stirred for 5 hours under an argon atmosphere reflux condition. When the reaction was finished, the temperature was lowered to room temperature, and the reaction solution was transferred to a separatory funnel and extracted with water and toluene. The extract was dried with $MgSO_4$, then filtered and concentrated, and the sample was purified by silica gel column chromatography to obtain Compound BH 1-4 (11.6 g, yield 53%, MS[M+H]+=497).

Preparation Example 5. Preparation of Compound BH 1-5

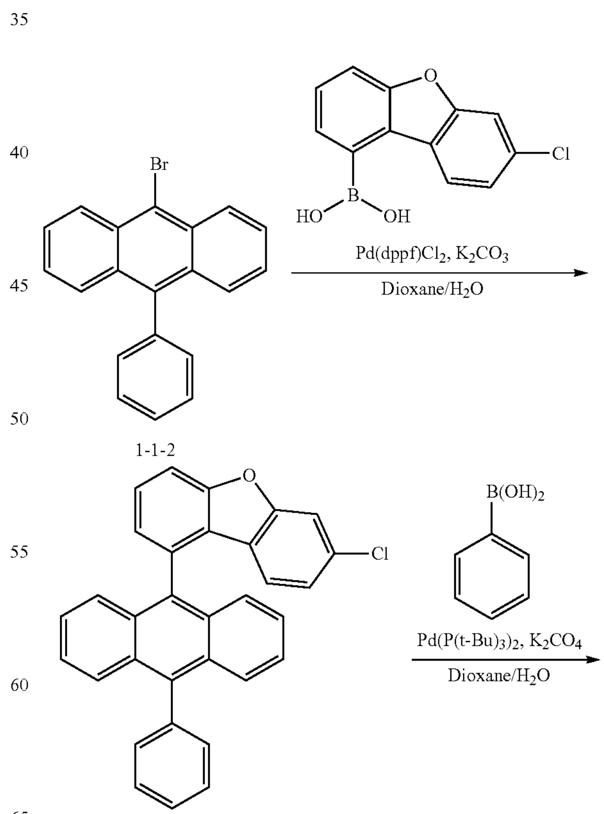

1-1-2

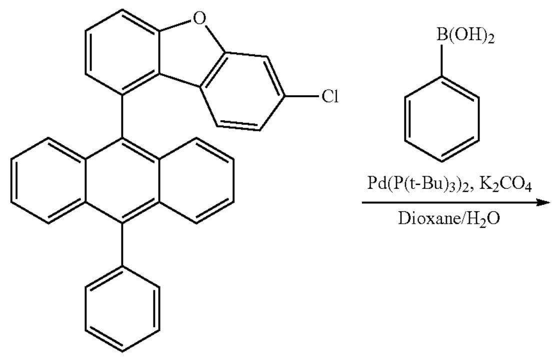

1-5-1

-continued

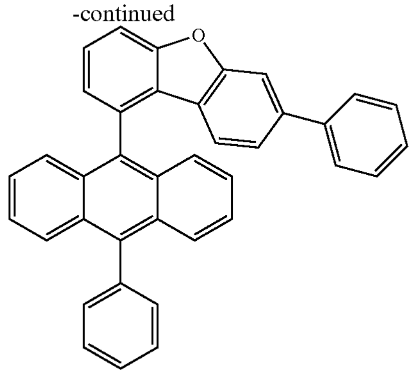

BH 1-5

Preparation Example 5-1) Preparation of Compound 1-5-1

Compound 1-5-1 (18.8 g, yield 55%, MS[M+H]+=455) was prepared in the same manner as in Preparation Example 4-1 except that 7-chlorodibenzofuran-1-boronic acid was used instead of 9-chlorodibenzofuran-2-boronic acid.

Preparation Example 5-2) Preparation of Compound BH 1-5

Compound BH 1-5 (12.8 g, yield 58%, MS[M+H]+=497) was prepared in the same manner as in Preparation Example 4-2.

Preparation Example 6. Preparation of Compound BH 1-6

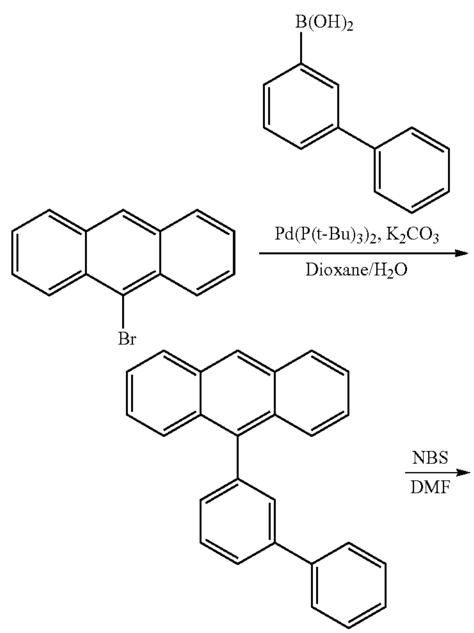

1-6-1

-continued

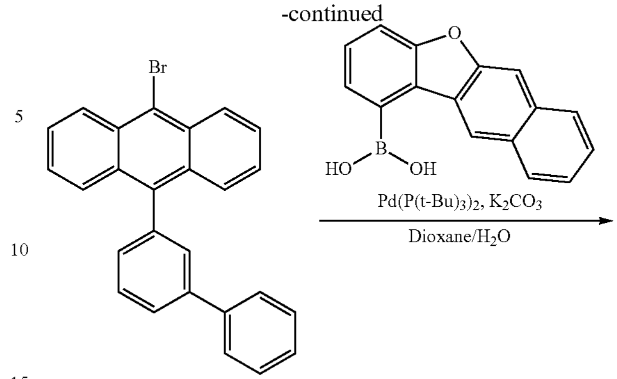

1-6-2

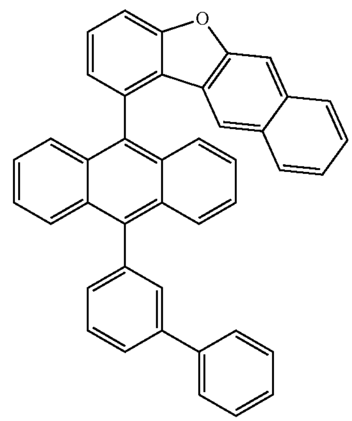

BH 1-6

Preparation Example 6-1) Preparation of Compound 1-6-1

Compound 1-6-1 (46.9 g, yield 73%, MS[M+H]+=331) was prepared in the same manner as in Preparation Example 1-1 except that 1,1-biphenyl-3-boronic acid was used instead of phenylboronic acid.

Preparation Example 6-2) Preparation of Compound 1-6-2

Compound 1-6-2 (18.1 g, yield 73%, MS[M+H]+=409) was prepared in the same manner as in Preparation Example 1-2.

Preparation Example 6-3) Preparation of Compound BH 1-6

Compound BH 1-6 (13.0 g, yield 49%, MS[M+H]+=409) was prepared in the same manner as in Preparation Example 2.

Preparation Example 7. Preparation of Compound BH 1-7

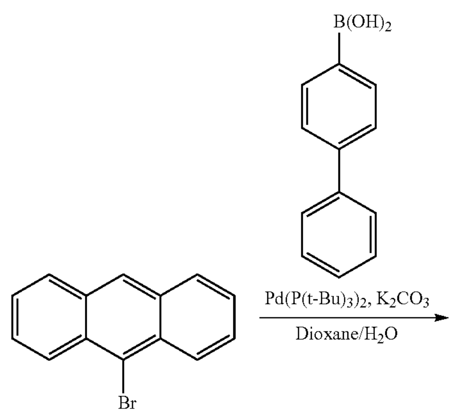

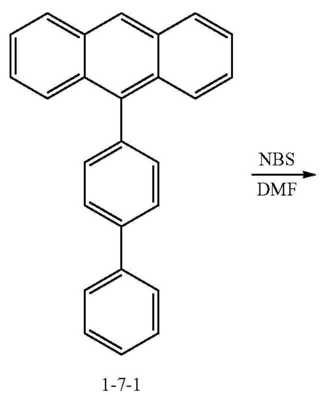

1-7-1

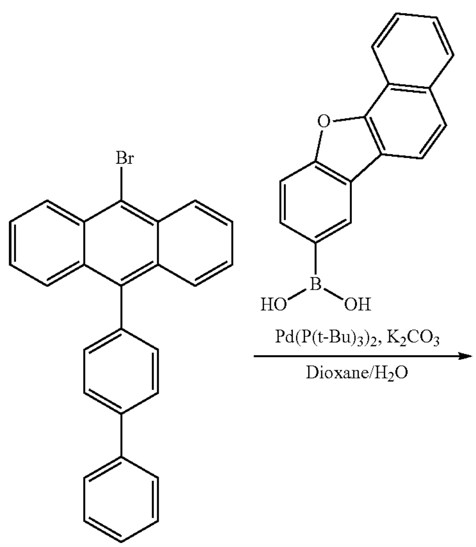

1-7-2

-continued

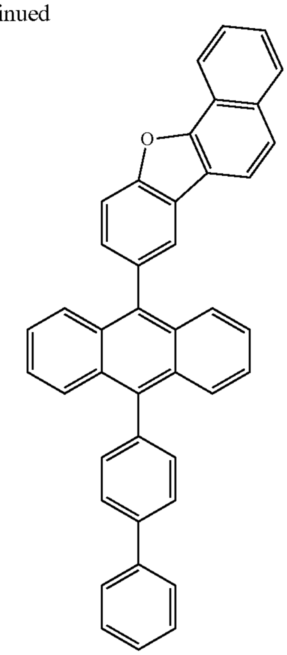

BH 1-7

Preparation Example 7-1) Preparation of Compound 1-7-1

Compound 1-7-1 (42.2 g, yield 63%, MS[M+H]+=331) was prepared in the same manner as in Preparation Example 6-1 except that 1,1-biphenyl-4-boronic acid was used instead of 1,1-biphenyl-3-boronic acid.

Preparation Example 7-2) Preparation of Compound 1-7-2

Compound 1-7-2 (17.0 g, yield 69%, MS[M+H]+=409) was prepared in the same manner as in Preparation Example 6-2.

Preparation Example 7-3) Preparation of Compound BH 1-7

Compound BH 1-7 (12.8 g, yield 48%, MS[M+H]+=409) was prepared in the same manner as in Preparation Example 6-3, except that naphtho[1,2-b]benzofuran-8-boronic acid was used instead of naphtho[2,3-b]benzofuran-1-boronic acid.

Preparation Example 8. Preparation of Compound BH 1-8

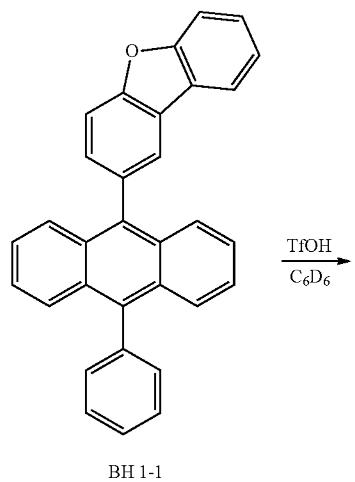

BH 1-1

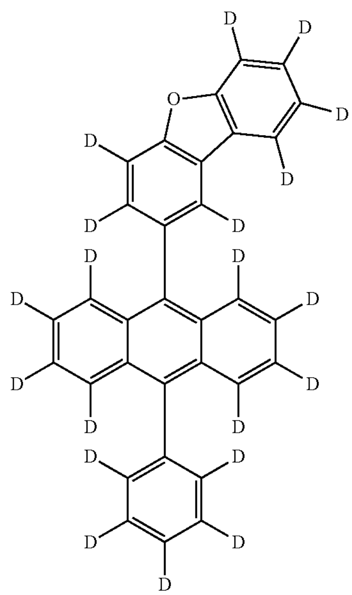

BH 1-8

Compound BH 1-1 (20 g) and TfOH (4 ml) were introduced to $C_6D_6$ (300 ml), and stirred for 2 hours. After the reaction was finished, $D_2O$ (50 ml) was introduced thereto, and after stirring the result for 30 minutes, trimethylamine (6 ml) was added dropwise thereto. The reaction solution was transferred to a separatory funnel, and extracted with water and toluene. The extract was dried with $MgSO_4$, and then recrystallized with ethyl acetate to obtain Compound BH 1-8 (14.4 g, yield 68%, MS[M+H]+=441).

Preparation Example 9. Preparation of Compound BH 2-1

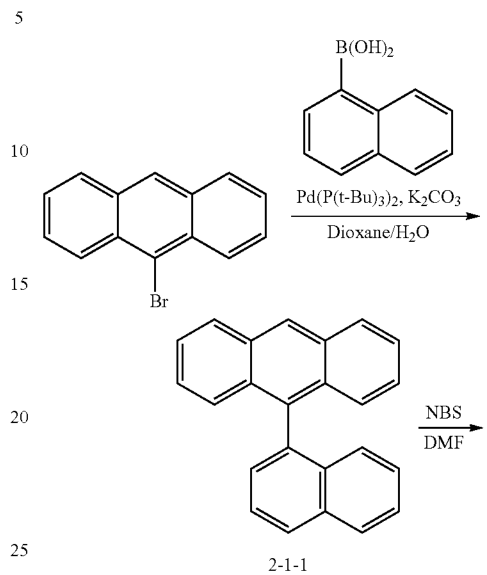

2-1-1

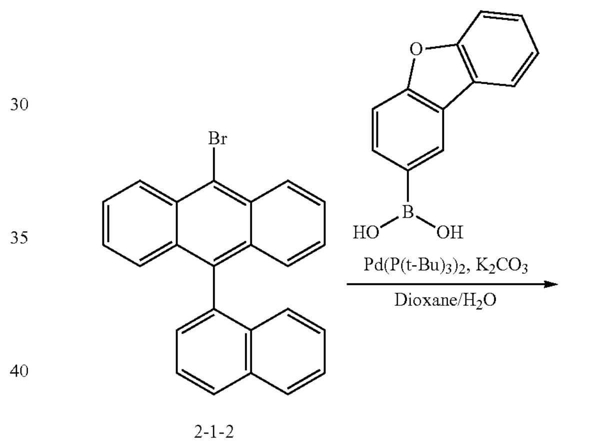

2-1-2

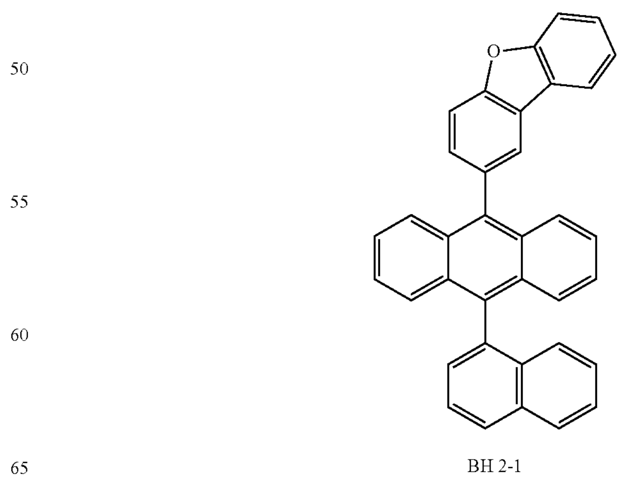

BH 2-1

Preparation Example 9-1) Synthesis of Compound 2-1-1

Compound 2-1-1 (47.5 g, yield 80%, MS[M+H]+=305) was prepared in the same manner as in Preparation Example 1-1 except that naphthyl-1-boronic acid was used instead of phenylboronic acid.

Preparation Example 9-2) Synthesis of Compound 2-1-2

Compound 2-1-2 (15.6 g, yield 62%, MS[M+H]+=384) was prepared in the same manner as in Preparation Example 1-2.

Preparation Example 9-3) Synthesis of Compound BH 2-1

Compound BH 2-1 (13.7 g, yield 56%, MS[M+H]+=471) was prepared in the same manner as in Preparation Example 1-3.

Preparation Example 10. Preparation of Compound BH 2-2

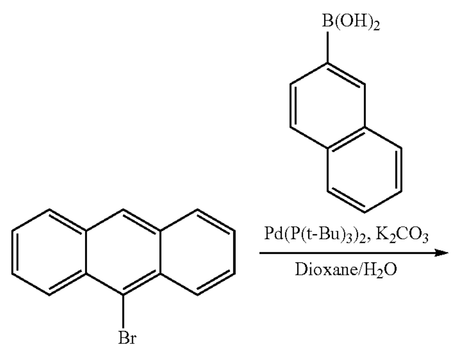

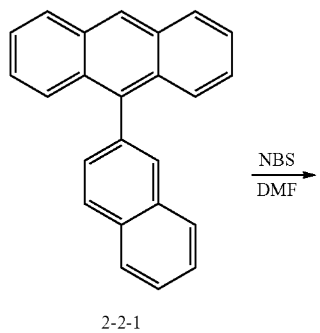

2-2-1

-continued

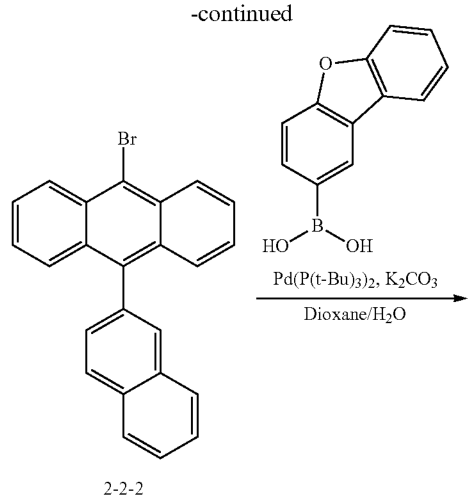

2-2-2

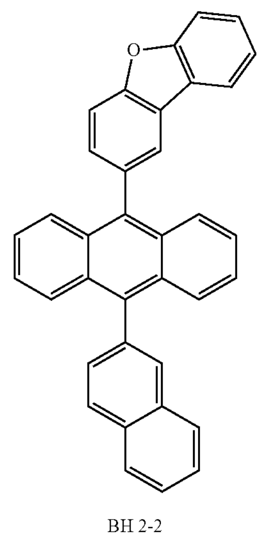

BH 2-2

Preparation Example 10-1) Synthesis of Compound 2-2-1

Compound 2-2-1 (47.5 g, yield 83%, MS[M+H]+=305) was prepared in the same manner as in Preparation Example 9-1 except that naphthyl-2-boronic acid was used instead of naphthyl-1-boronic acid.

Preparation Example 10-2) Synthesis of Compound 2-2-2

Compound 2-2-2 (15.6 g, yield 62%, MS[M+H]+=384) was prepared in the same manner as in Preparation Example 9-2.

Preparation Example 10-3) Synthesis of Compound BH 2-2

Compound BH 2-2 (13.7 g, yield 56%, MS[M+H]+=471) was prepared in the same manner as in Preparation Example 9-3.

Preparation Example 11. Preparation of Compound BH 2-3

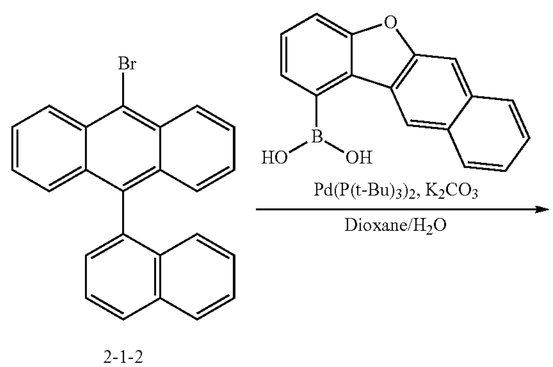

2-1-2

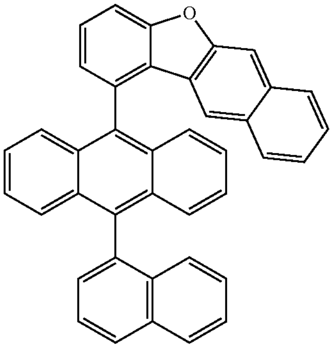

BH 2-3

Compound BH 2-3 (13.7 g, yield 56%, MS[M+H]+=521) was prepared in the same manner as in Preparation Example 9-3, except that naphtho[2,3-b]benzofuran-1-boronic acid was used instead of dibenzofuran-2-boronic acid.

Preparation Example 12. Preparation of Compound BH 2-4

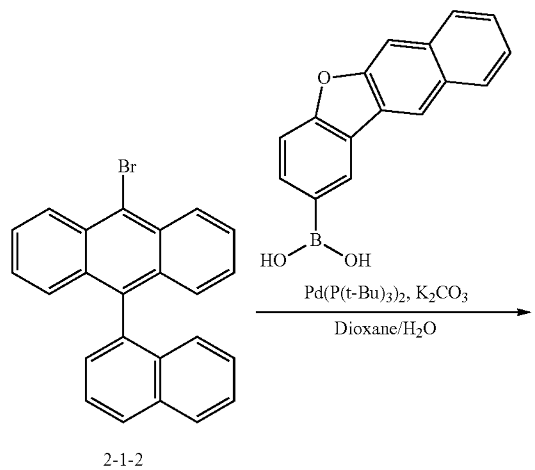

2-1-2

-continued

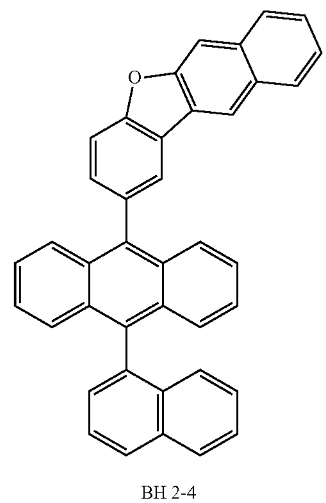

BH 2-4

Compound BH 2-4 (14.4 g, yield 53%, MS[M+H]+=521) was prepared in the same manner as in Preparation Example 9-3, except that naphtho[2,3-b]benzofuran-2-boronic acid was used instead of dibenzofuran-2-boronic acid.

Preparation Example 13. Preparation of Compound BH 2-5

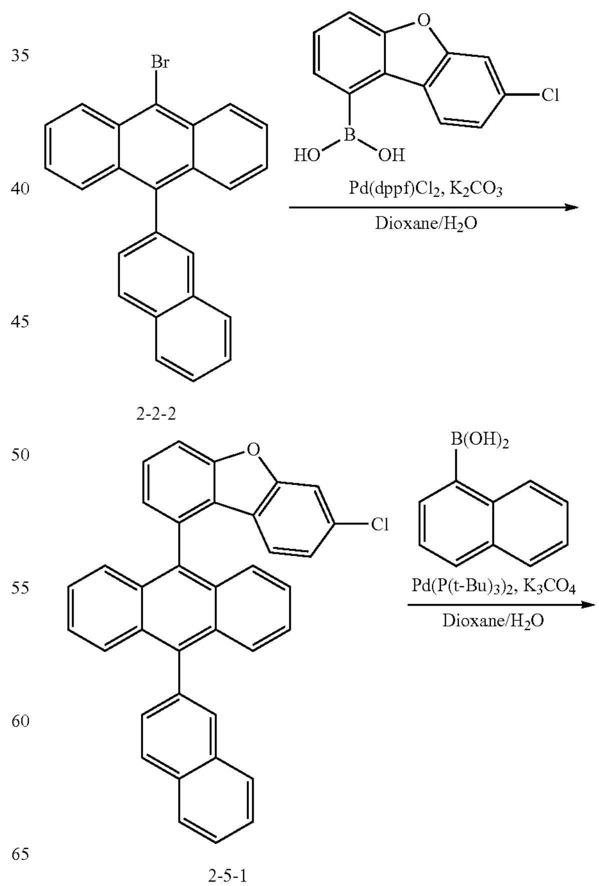

2-2-2

2-5-1

-continued

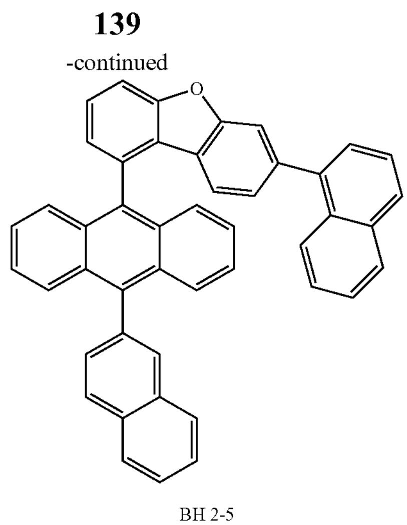

BH 2-5

Preparation Example 13-1) Preparation of Compound 2-5-1

Compound 2-5-1 (12.7 g, yield 48%, MS[M+H]+=505) was prepared in the same manner as in Preparation Example 5-1 except that Compound 2-2-2 was used instead of Compound 1-1-2.

Preparation Example 13-2) Preparation of Compound BH 2-5

Compound BH 2-5 (11.1 g, yield 47%, MS[M+H]+=597) was prepared in the same manner as in Preparation Example 5-2, except that naphthyl-1-boronic acid was used instead of phenylboronic acid.

Preparation Example 14. Preparation of Compound BH 2-6

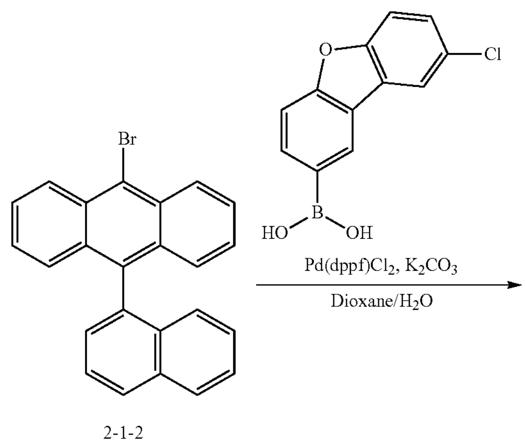

2-1-2

-continued

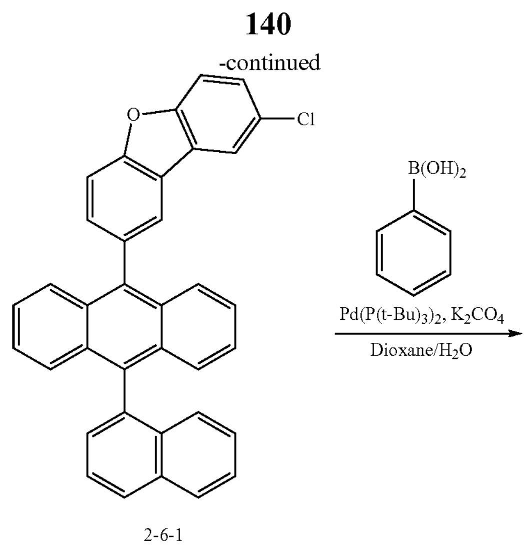

2-6-1

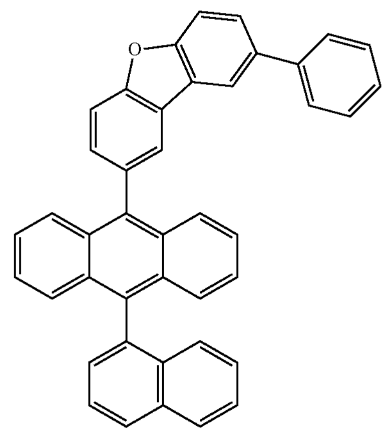

BH 2-6

Preparation Example 15-1) Preparation of Compound 2-6-1

Compound 2-6-1 (13.5 g, yield 51%, MS[M+H]+=505) was prepared in the same manner as in Preparation Example 13-1 except that Compound 2-1-2 was used instead of Compound 2-2-2, and 8 -chlorodibenzofuran-2-boronic acid was used instead of 7-chlorodibenzofuran-1-boronic acid.

Preparation Example 15-2) Preparation of Compound BH 2-6

Compound BH 2-6 (11.4 g, yield 48%, MS[M+H]+=547) was prepared in the same manner as in Preparation Example 13-2 except that phenylboronic acid was used instead of naphthalene-1-boronic acid.

Preparation Example 15. Preparation of Compound BH 2-7

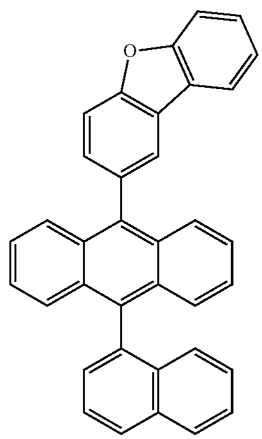

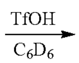

BH 2-1

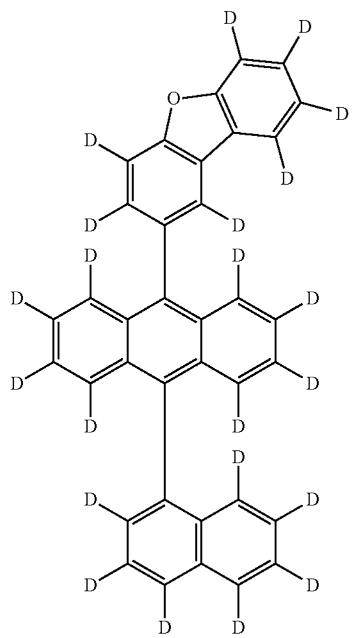

BH 2-7

Compound BH 2-7 (17.0 g, yield 81%, MS[M+H]+=493) was prepared in the same manner as in Preparation Example 8.

Preparation Example 16. Preparation of Compound BH 2-8

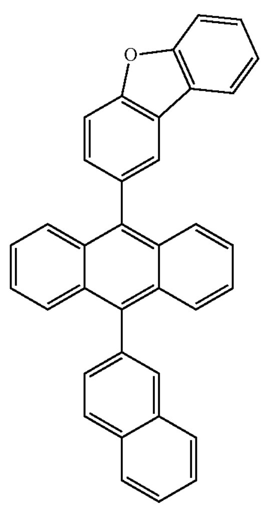

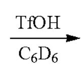

BH 2-2

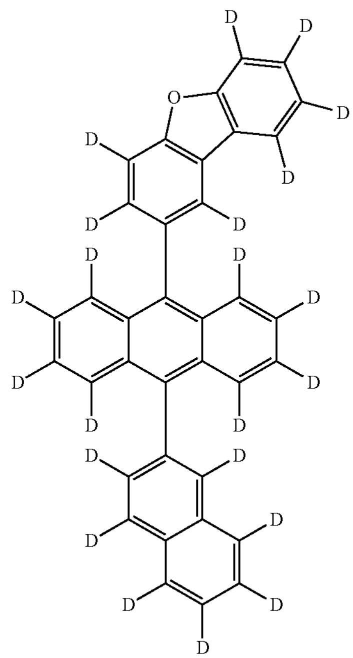

BH 2-8

Compound BH 2-8 (15.6 g, yield 74%, MS[M+H]+=493) was prepared in the same manner as in Preparation Example 8.

For each of BH 1-1 to BH 1-8 and BH 2-1 to 2-8 prepared in Preparation Examples 1 to 16, the evaporation temperature was measured, and described in the following Table 1. The evaporation temperature is measured by TGA (thermal gravity analysis). A temperature at a point where the sample has a weight loss of 1% is referred to as $T_d$-1%, and based on the temperature, deposition occurs at a temperature lower by 60° C. to 80° C. The pressure herein is in a range of $10^{-6}$ torr to $10^{-4}$ torr. The evaporation temperature can have flexibility within the range understood by those skilled in the art, and the deposition temperature can include a variation range of ±10° C.

TABLE 1

| Compound | Evaporation Temperature (° C.) |
|---|---|
| BH 1-1 | 260 |
| BH 1-2 | 260 |
| BH 1-3 | 270 |
| BH 1-4 | 260 |
| BH 1-5 | 270 |
| BH 1-6 | 275 |
| BH 1-7 | 275 |
| BH 1-8 | 260 |
| BH 2-1 | 270 |
| BH 2-2 | 280 |
| BH 2-3 | 290 |
| BH 2-4 | 280 |
| BH 2-5 | 285 |
| BH 2-6 | 280 |
| BH 2-7 | 270 |
| BH 2-8 | 280 |

EXPERIMENTAL EXAMPLE

Example 1

A glass substrate on which indium tin oxide (ITO) was coated as a thin film to a thickness of 150 nm was placed in detergent-dissolved distilled water and ultrasonic cleaned. Herein, a product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonic cleaned with solvents of isopropyl alcohol, acetone and methanol, then dried, and then transferred to a plasma cleaner. In addition, the substrate was cleaned for 5 minutes using nitrogen plasma, and then transferred to a vacuum deposition apparatus.

On the transparent ITO electrode prepared as above, the following HAT-CN compound was thermal vacuum deposited to a thickness of 5 nm to form a hole injection layer. Then, HTL1 was thermal vacuum deposited to a thickness of 100 nm to form a first hole transfer layer, and then HTL2 was thermal vacuum deposited to a thickness of 10 nm to form a second hole transfer layer. Subsequently, a light emitting layer having a thickness of 20 nm was famed by depositing BD-1 (2% by mass of total weight of light emitting layer) as a dopant and Compounds BH 1-1 and BH 2-1 (weight ratio 50:50) as a host using a co-deposition method. Then, ETL1 was vacuum deposited to a thickness of 20 nm to form an electron transfer layer. Then, LiF was vacuum deposited to a thickness of 0.5 nm to form an electron injection layer. Subsequently, a cathode was formed by depositing aluminum to a thickness of 100 nm, and as a result, an organic light emitting device was manufactured.

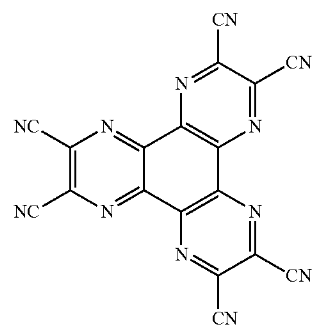

HAT-CN

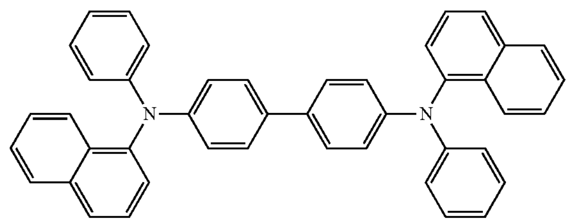

HTL1

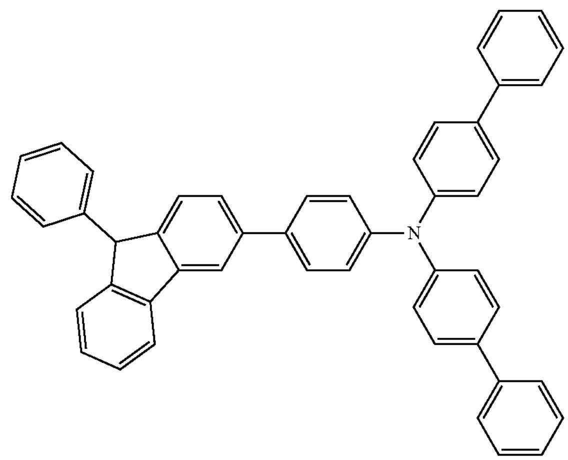

HTL2

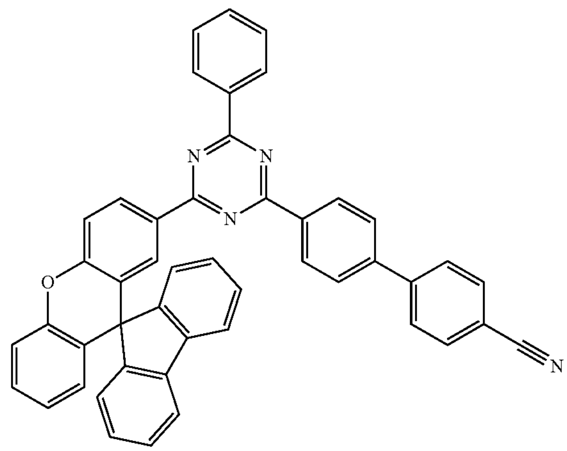

ETL1

-continued

BD-1

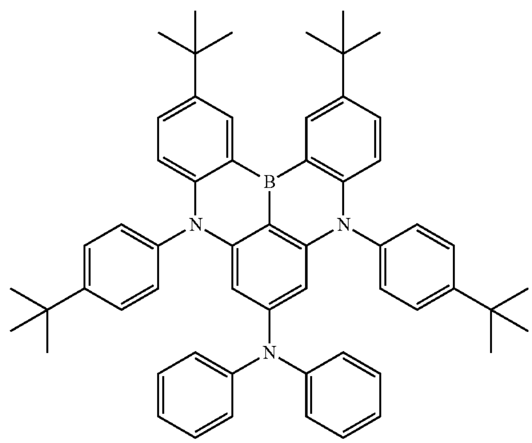

BD-2

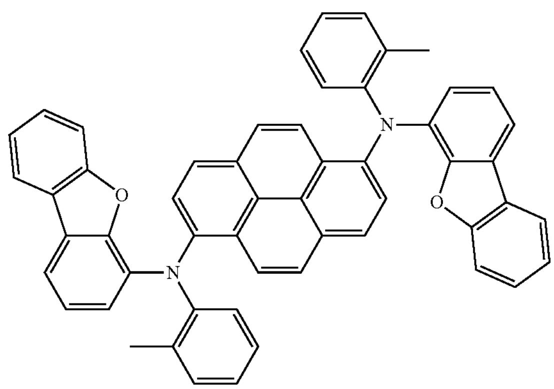 [SMILES: Cc1ccccc1N(c1ccc2ccc3c(N(c4ccccc4C)c4cccc5c4oc4ccccc45)ccc4ccc1c2c43)c1cccc2c1oc1ccccc12]

In the above-described process, the deposition rates of the organic materials were maintained at 0.04 nm/sec to 0.09 nm/sec, the deposition rate of the lithium fluoride of the electron transfer layer was maintained at 0.03 nm/sec, the deposition rate of the aluminum of the cathode was maintained at 0.2 nm/sec, and the degree of vacuum during the deposition was maintained at $1\times10^{-7}$ torr to $5\times10^{-5}$ torr to manufacture the organic light emitting device.

Examples 2 to 55, 62 to 65 and Comparative Examples 1 to 8

Devices were manufactured in the same manner as in Example 1 except that compounds specified in the following Table 2 were used as the host compound of the light emitting layer, and a different light emitting layer forming method (co-deposition or pre-mix) was used. In Example 1, the light emitting layer was formed using the compound of Chemical Formula 1, the compound of Chemical Formula 2 and the dopant through different deposition sources (co-deposition), and in the examples and the comparative examples using the pre-mix deposition method in the following Table 2, the materials (host and dopant) were mixed in advance before forming the light emitting layer, and the light emitting layer was formed through one deposition source.

BH-A

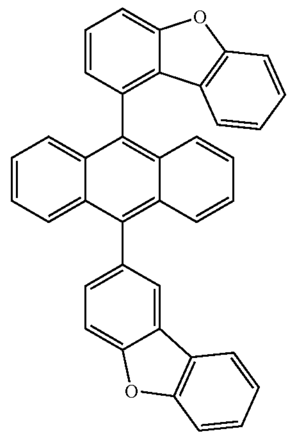

BH-B

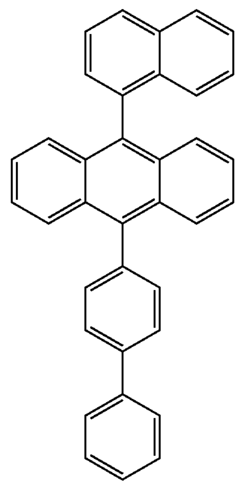

Examples 56 to 61

Devices were manufactured in the same manner as in Example 1 except that compounds specified in the following Table 2 were used as the host compound of the light emitting layer, BD-2 was used as the dopant, and a different light emitting layer forming method (co-deposition or pre-mix) was used.

For each of the devices manufactured in Examples 1 to 65 and Comparative Examples 1 to 8, driving voltage, efficiency, color coordinate, and time taken for luminance to become 97% with respect to initial luminance (T97) were measured at current density of 20 mA/cm$^2$, and the results are shown in the following Table 2.

TABLE 2

| | Light Emitting Layer Host | Light Emitting Layer Dopant | Color Coordinate | Voltage (V) | Efficiency (Cd/A) | Lifetime (T97, h) |
|---|---|---|---|---|---|---|
| Example 1 | BH 1-1:BH 2-1 (co-deposition, 1:1) | BD 1 | (0.138, 0.115) | 3.74 | 6.52 | 70 |

TABLE 2-continued

| | Light Emitting Layer Host | Light Emitting Layer Dopant | Color Coordinate | Voltage (V) | Efficiency (Cd/A) | Lifetime (T97, h) |
|---|---|---|---|---|---|---|
| Example 2 | BH 1-1:BH 2-2 (co-deposition, 1:1) | BD 1 | (0.138, 0.116) | 3.67 | 6.45 | 76 |
| Example 3 | BH 1-1:BH 2-7 (co-deposition, 1:1) | BD 1 | (0.138, 0.115) | 3.75 | 6.51 | 115 |
| Example 4 | BH 1-1:BH 2-1 (pre-mix, 1:1) | BD 1 | (0.138, 0.116) | 3.68 | 6.82 | 84 |
| Example 5 | BH 1-1:BH 2-2 (pre-mix, 1:1) | BD 1 | (0.138, 0.118) | 3.55 | 6.74 | 110 |
| Example 6 | BH 1-1:BH 2-7 (pre-mix, 1:1) | BD 1 | (0.138, 0.115) | 3.70 | 6.78 | 133 |
| Example 7 | BH 1-2:BH 2-1 (co-deposition, 1:1) | BD 1 | (0.139, 0.117) | 3.68 | 6.52 | 82 |
| Example 8 | BH 1-2:BH 2-2 (co-deposition, 1:1) | BD 1 | (0.139, 0.117) | 3.60 | 6.44 | 85 |
| Example 9 | BH 1-2:BH 2-7 (co-deposition, 1:1) | BD 1 | (0.139, 0.117) | 3.67 | 6.55 | 104 |
| Example 10 | BH 1-2:BH 2-8 (co-deposition, 1:1) | BD 1 | (0.139, 0.117) | 3.61 | 6.43 | 122 |
| Example 11 | BH 1-2:BH 2-1 (pre-mix, 1:1) | BD 1 | (0.139, 0.117) | 3.59 | 6.65 | 99 |
| Example 12 | BH 1-2:BH 2-2 (pre-mix, 1:1) | BD 1 | (0.139, 0.117) | 3.55 | 6.71 | 101 |
| Example 13 | BH 1-2:BH 2-7 (pre-mix, 1:1) | BD 1 | (0.139, 0.117) | 3.63 | 6.70 | 114 |
| Example 14 | BH 1-2:BH 2-8 (pre-mix, 1:1) | BD 1 | (0.139, 0.117) | 3.55 | 6.70 | 159 |
| Example 15 | BH 1-3:BH 2-1 (co-deposition, 1:1) | BD 1 | (0.139, 0.117) | 3.70 | 6.61 | 79 |
| Example 16 | BH 1-3:BH 2-7 (co-deposition, 1:1) | BD 1 | (0.139, 0.117) | 3.69 | 6.59 | 114 |
| Example 17 | BH 1-3:BH 2-8 (co-deposition, 1:1) | BD 1 | (0.139, 0.118) | 3.64 | 6.56 | 108 |
| Example 18 | BH 1-3:BH 2-1 (pre-mix, 1:1) | BD 1 | (0.139, 0.117) | 3.65 | 6.79 | 94 |
| Example 19 | BH 1-3:BH 2-7 (pre-mix, 1:1) | BD 1 | (0.139, 0.117) | 3.64 | 6.75 | 133 |
| Example 20 | BH 1-3:BH 2-8 (pre-mix, 1:1) | BD 1 | (0.139, 0.118) | 3.60 | 6.71 | 124 |
| Example 21 | BH 1-4:BH 2-1 (co-deposition, 1:1) | BD 1 | (0.138, 0.116) | 3.67 | 6.48 | 88 |
| Example 22 | BH 1-4:BH 2-3 (co-deposition, 1:1) | BD 1 | (0.139, 0.118) | 3.72 | 6.59 | 82 |
| Example 23 | BH 1-4:BH 2-4 (co-deposition, 1:1) | BD 1 | (0.139, 0.119) | 3.67 | 6.57 | 79 |
| Example 24 | BH 1-4:BH 2-1 (pre-mix, 1:1) | BD 1 | (0.138, 0.116) | 3.63 | 6.70 | 104 |
| Example 25 | BH 1-4:BH 2-3 (pre-mix, 1:1) | BD 1 | (0.139, 0.118) | 3.67 | 6.75 | 99 |
| Example 26 | BH 1-4:BH 2-4 (pre-mix, 1:1) | BD 1 | (0.139, 0.119) | 3.60 | 6.72 | 101 |
| Example 27 | BH 1-5:BH 2-1 (co-deposition, 1:1) | BD 1 | (0.138, 0.116) | 3.63 | 6.55 | 77 |
| Example 28 | BH 1-5:BH 2-2 (co-deposition, 1:1) | BD 1 | (0.138, 0.116) | 3.62 | 6.47 | 80 |
| Example 29 | BH 1-5:BH 2-3 (co-deposition, 1:1) | BD 1 | (0.138, 0.116) | 3.58 | 6.49 | 77 |
| Example 30 | BH 1-5:BH 2-7 (co-deposition, 1:1) | BD 1 | (0.138, 0.116) | 3.64 | 6.55 | 103 |
| Example 31 | BH 1-5:BH 2-8 (co-deposition, 1:1) | BD 1 | (0.138, 0.116) | 3.62 | 6.47 | 111 |
| Example 32 | BH 1-5:BH 2-1 (pre-mix, 1:1) | BD 1 | (0.138, 0.117) | 3.58 | 6.69 | 85 |
| Example 33 | BH 1-5:BH 2-2 (pre-mix, 1:1) | BD 1 | (0.138, 0.116) | 3.57 | 6.43 | 100 |
| Example 34 | BH 1-5:BH 2-3 (pre-mix, 1:1) | BD 1 | (0.138, 0.117) | 3.51 | 6.63 | 97 |
| Example 35 | BH 1-5:BH 2-7 (pre-mix, 1:1) | BD 1 | (0.138, 0.117) | 3.60 | 6.68 | 117 |
| Example 36 | BH 1-5:BH 2-8 (pre-mix, 1:1) | BD 1 | (0.138, 0.116) | 3.58 | 6.42 | 131 |
| Example 37 | BH 1-6:BH 2-3 (co-deposition, 1:1) | BD 1 | (0.138, 0.118) | 3.57 | 6.55 | 82 |
| Example 38 | BH 1-6:BH 2-4 (co-deposition, 1:1) | BD 1 | (0.138, 0.117) | 3.60 | 6.57 | 80 |

TABLE 2-continued

| | Light Emitting Layer Host | Light Emitting Layer Dopant | Color Coordinate | Voltage (V) | Efficiency (Cd/A) | Lifetime (T97, h) |
|---|---|---|---|---|---|---|
| Example 39 | BH 1-6:BH 2-5 (co-deposition, 1:1) | BD 1 | (0.138, 0.118) | 3.61 | 6.55 | 78 |
| Example 40 | BH 1-6:BH 2-6 (co-deposition, 1:1) | BD 1 | (0.138, 0.116) | 3.64 | 6.44 | 75 |
| Example 41 | BH 1-6:BH 2-3 (pre-mix, 1:1) | BD 1 | (0.138, 0.118) | 3.50 | 6.69 | 95 |
| Example 42 | BH 1-6:BH 2-4 (pre-mix, 1:1) | BD 1 | (0.138, 0.118) | 3.52 | 6.70 | 92 |
| Example 43 | BH 1-6:BH 2-5 (pre-mix, 1:1) | BD 1 | (0.138, 0.117) | 3.56 | 6.67 | 89 |
| Example 44 | BH 1-6:BH 2-6 (pre-mix, 1:1) | BD 1 | (0.138, 0.117) | 3.57 | 6.55 | 90 |
| Example 45 | BH 1-7:BH 2-3 (co-deposition, 1:1) | BD 1 | (0.138, 0.117) | 3.65 | 6.58 | 78 |
| Example 46 | BH 1-7:BH 2-4 (co-deposition, 1:1) | BD 1 | (0.138, 0.118) | 3.63 | 6.59 | 82 |
| Example 47 | BH 1-7:BH 2-5 (co-deposition, 1:1) | BD 1 | (0.138, 0.117) | 3.67 | 6.60 | 75 |
| Example 48 | BH 1-7:BH 2-6 (co-deposition, 1:1) | BD 1 | (0.138, 0.117) | 3.65 | 6.48 | 78 |
| Example 49 | BH 1-7:BH 2-3 (pre-mix, 1:1) | BD 1 | (0.138, 0.117) | 3.60 | 6.73 | 88 |
| Example 50 | BH 1-7:BH 2-4 (pre-mix, 1:1) | BD 1 | (0.138, 0.118) | 3.53 | 6.68 | 97 |
| Example 51 | BH 1-7:BH 2-5 (pre-mix, 1:1) | BD 1 | (0.138, 0.118) | 3.55 | 6.70 | 93 |
| Example 52 | BH 1-8:BH 2-1 (co-deposition, 1:1) | BD 1 | (0.138, 0.117) | 3.75 | 6.51 | 97 |
| Example 53 | BH 1-8:BH 2-7 (co-deposition, 1:1) | BD 1 | (0.138, 0.117) | 3.77 | 6.52 | 138 |
| Example 54 | BH 1-8:BH 2-1 (pre-mix, 1:1) | BD 1 | (0.138, 0.117) | 3.68 | 6.81 | 110 |
| Example 55 | BH 1-8:BH 2-7 (pre-mix, 1:1) | BD 1 | (0.138, 0.117) | 3.71 | 6.79 | 161 |
| Example 56 | BH 1-1:BH 2-1 (co-deposition, 1:1) | BD 2 | (0.138, 0.115) | 3.78 | 6.28 | 64 |
| Example 57 | BH 1-1:BH 2-2 (co-deposition, 1:1) | BD 2 | (0.138, 0.116) | 3.67 | 6.25 | 74 |
| Example 58 | BH 1-1:BH 2-7 (co-deposition, 1:1) | BD 2 | (0.138, 0.115) | 3.78 | 6.27 | 109 |
| Example 59 | BH 1-1:BH 2-1 (pre-mix, 1:1) | BD 2 | (0.138, 0.116) | 3.74 | 6.37 | 70 |
| Example 60 | BH 1-1:BH 2-2 (pre-mix, 1:1) | BD 2 | (0.138, 0.118) | 3.61 | 6.39 | 88 |
| Example 61 | BH 1-1:BH 2-7 (pre-mix, 1:1) | BD 2 | (0.138, 0.115) | 3.71 | 6.40 | 133 |
| Example 62 | BH 1-8:BH 2-1 (co-deposition, 1:1) | BD 1 | (0.138, 0.117) | 3.75 | 6.51 | 97 |
| Example 63 | BH 1-8:BH 2-7 (co-deposition, 1:1) | BD 1 | (0.138, 0.117) | 3.77 | 6.52 | 138 |
| Example 64 | BH 1-8:BH 2-1 (pre-mix, 1:1) | BD 1 | (0.138, 0.117) | 3.68 | 6.81 | 110 |
| Example 65 | BH 1-8:BH 2-7 (pre-mix, 1:1) | BD 1 | (0.138, 0.117) | 3.71 | 6.79 | 161 |
| Comparative Example 1 | BH 1-1 | BD 1 | (0.138, 0.115) | 3.90 | 6.11 | 65 |
| Comparative Example 2 | BH 2-1 | BD 1 | (0.138, 0.116) | 3.95 | 6.18 | 45 |
| Comparative Example 3 | BH 1-1:BH 1-3 (co-deposition, 1:1) | BD 1 | (0.138, 0.116) | 3.85 | 5.87 | 65 |
| Comparative Example 4 | BH 1-1:BH 1-3 (pre-mix, 1:1) | BD 1 | (0.138, 0.116) | 3.77 | 6.00 | 79 |
| Comparative Example 5 | BH 1-2:BH-A (pre-mix, 1:1) | BD 1 | (0.138, 0.116) | 3.83 | 5.88 | 60 |
| Comparative Example 6 | BH 2-1:BH-A (pre-mix, 1:1) | BD 1 | (0.138, 0.116) | 3.98 | 6.07 | 48 |
| Comparative Example 7 | BH 1-1:BH-B (pre-mix, 1:1) | BD 1 | (0.138, 0.116) | 4.01 | 6.01 | 52 |
| Comparative Example 8 | BH 2-2:BH-B (pre-mix, 1:1) | BD 1 | (0.138, 0.116) | 3.90 | 6.12 | 70 |

Examples 1 to 65 of the present application includes the compound of Chemical Formula 1 and the compound of Chemical Formula 2 at the same time as the light emitting layer host.

Comparative Examples 1 and 2 use only one type of the compound of Chemical Formula 1 and the compound of Chemical Formula 2 as the light emitting layer host, and have reduced driving voltage, efficiency and lifetime in the device compared to the examples of the present application.

Comparative Examples 3 and 4 use two types of the compound of Chemical Formula 1 as the light emitting layer host, and have reduced driving voltage, efficiency and lifetime in the device compared to the examples of the present application.

In addition, Comparative Examples 5 to 8 use one type of the compound of Chemical Formula 1 or one type of the compound of Chemical Formula 2 and one type of the compound not corresponding to Chemical Formula 1 or Chemical Formula 2 of the present application as the light emitting layer host, and having reduced driving voltage, efficiency and lifetime in the device is identified from Table 2.

Depositing the compound of Chemical Formula 1 and the compound of Chemical Formula 2 after pre-mixing (one deposition source) facilitates interactions between the two compounds compared to using co-deposition (separate deposition source), which enhances processability.

When comparing Examples 1 to 6 and Examples 56 to 60, it is seen that the device including the boron-based compound of Chemical Formula 3 as the dopant has properties of low voltage, high efficiency and long lifetime.

The invention claimed is:

1. An organic light emitting device, comprising:

a first electrode;

a second electrode; and one or more organic material layers including a light emitting layer provided between the first electrode and the second electrode, wherein the light emitting layer includes a compound of the following Chemical Formula 1 and a compound of the following Chemical Formula 2:

[Chemical Formula 1]

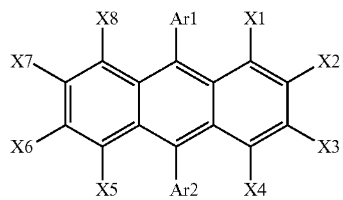

wherein in Chemical Formula 1:

X1 to X8 are the same as or different from each other, and each independently is hydrogen, deuterium, a substituted or unsubstituted aryl group, or a substituted or unsubstituted heteroaryl group;

Ar1 is a bond to R1 or R2 of the following Chemical Formula A; and

Ar2 is a substituted or unsubstituted phenyl group;

[Chemical Formula A]

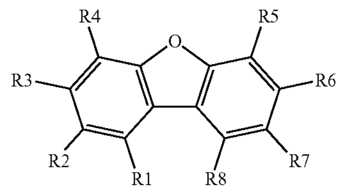

wherein in Chemical Formula A:

a substituent among R1 and R2 not bonding to Ar1, and substituents R3 to R8 are the same as or different from each other, and each independently is hydrogen, deuterium, a substituted or unsubstituted aryl group, or a substituted or unsubstituted heteroaryl group, or bond to adjacent groups to form a substituted or unsubstituted ring;

[Chemical Formula 2]

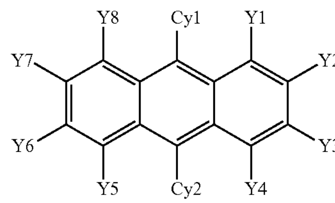

wherein in Chemical Formula 2:

Y1 to Y8 are the same as or different from each other, and each independently is hydrogen, deuterium, a substituted or unsubstituted aryl group, or a substituted or unsubstituted heteroaryl group;

Cy1 is a bond to R11 or R12 of the following Chemical Formula B; and

Cy2 is a substituted or unsubstituted fused aryl group having 10 to 20 carbon atoms;

[Chemical Formula B]

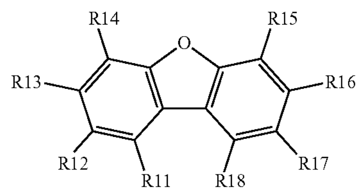

wherein in Chemical Formula B:

a substituent among R11 and R12 not bonding to Cy1, and substituents R13 to R18 are the same as or different from each other, and each independently is hydrogen, deuterium, a substituted or unsubstituted aryl group, or a substituted or unsubstituted heteroaryl group, or bond to adjacent groups to form a substituted or unsubstituted ring, wherein the compounds of Chemical Formula 1 and 2 are deuterated to 50% or greater.

2. The organic light emitting device of claim 1, wherein Chemical Formula 1 is the following Chemical Formula 1-1 or 1-2:

[Chemical Formula 1-1]

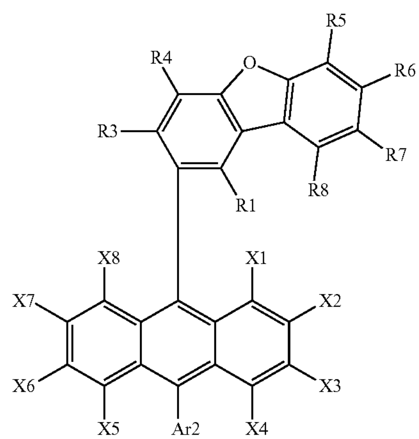

[Chemical Formula 1-2]

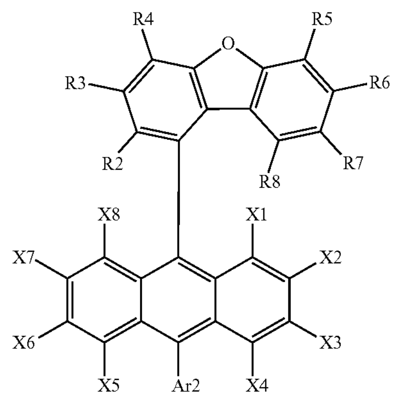

wherein in Chemical Formulae 1-1 and 1-2:

R1 to R8, X1 to X8 and Ar2 have the same definitions as in Chemical Formula 1 and Chemical Formula A, wherein the compounds of Chemical Formula 1-1 and 1-2 are deuterated to 50% or greater.

3. The organic light emitting device of claim 1, wherein Chemical Formula 2 is the following Chemical Formula 2-1 or 2-2:

[Chemical Formula 2-1]

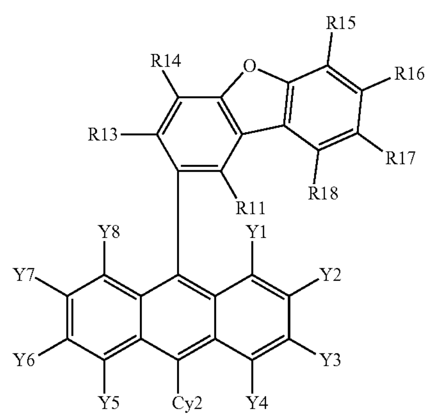

-continued

[Chemical Formula 2-2]

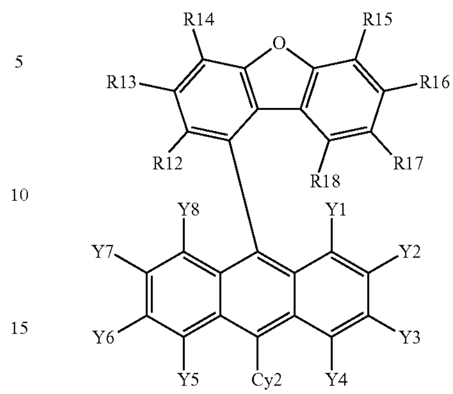

wherein in Chemical Formulae 2-1 and 2-2:

R11 to R18, Y1 to Y8 and Cy2 have the same definitions as in Chemical Formula 2 and Chemical Formula B, wherein the compounds of Chemical Formula 2-1 and 2-2 are deuterated to 50% or greater.

4. The organic light emitting device of claim 1, wherein one or more of the substituent among R1 and R2 not bonding to Ar1 and substituents R3 to R8 are a substituted or unsubstituted aryl group, or a substituted or unsubstituted heteroaryl group, and the rest are the same as or different from each other and each independently is hydrogen or deuterium, or bond to adjacent groups to form a substituted or unsubstituted ring.

5. The organic light emitting device of claim 1, wherein one or more of the substituent among R11 and R12 not bonding to Cy1 and substituents R13 to R18 are a substituted or unsubstituted aryl group or a substituted or unsubstituted heteroaryl group, and the rest are the same as or different from each other and each independently hydrogen or deuterium, or bond to adjacent groups to form a substituted or unsubstituted ring.

6. The organic light emitting device of claim 1, wherein Chemical Formula A is any one of the following Chemical Formulae A-1 to A-4:

[Chemical Formula A-1]

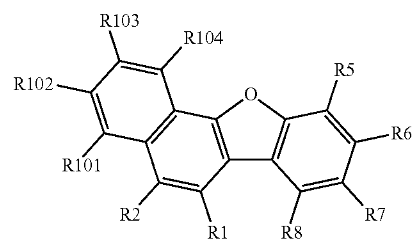

[Chemical Formula A-2]

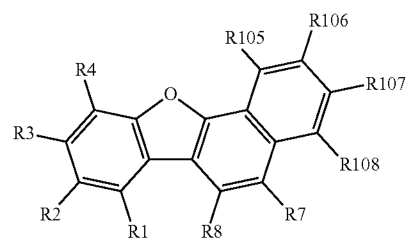

-continued

[Chemical Formula A-3]

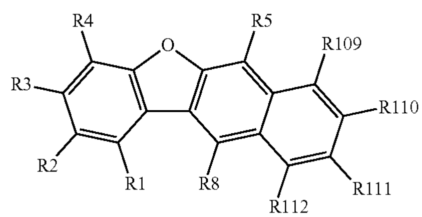

[Chemical Formula A-4]

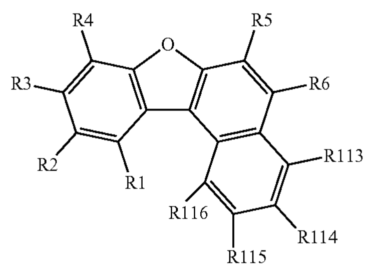

wherein in Chemical Formulae A-1 to A-4:

R1 to R8 have the same definitions as in Chemical Formula A; and

R101 to R116 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

7. The organic light emitting device of claim 1, wherein Chemical Formula B is any one of the following Chemical Formulae B-1 to B-4:

[Chemical Formula B-1]

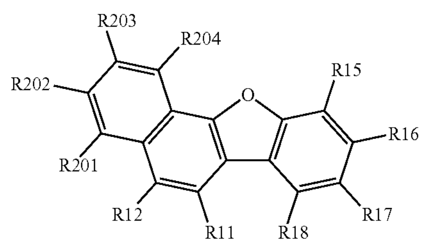

[Chemical Formula B-2]

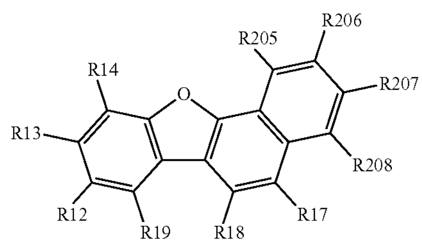

[Chemical Formula B-3]

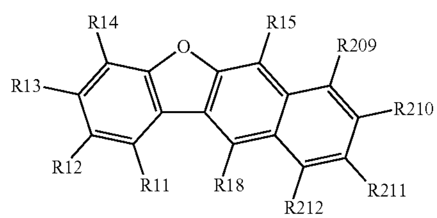

-continued

[Chemical Formula B-4]

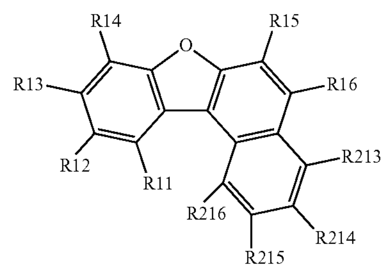

wherein in Chemical Formulae B-1 to B-4:

R11 to R18 have the same definitions as in Chemical Formula B; and

R201 to R216 are the same as or different from each other, and each independently is hydrogen, deuterium, a substituted or unsubstituted aryl group, or a substituted or unsubstituted heteroaryl group, or bond to adjacent groups to form a substituted or unsubstituted ring.

8. The organic light emitting device of claim 1, wherein Chemical Formula 1 is any one of the following Chemical Formulae 1-10 to 1-17:

[Chemical Formula 1-10]

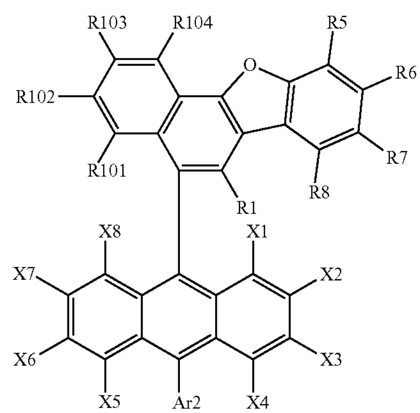

[Chemical Formula 1-11]

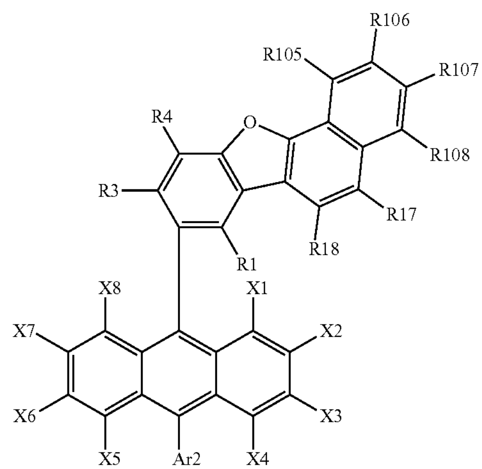

-continued

[Chemical Formula 1-12]

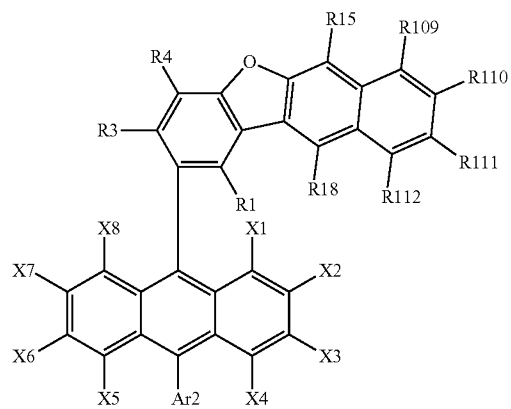

[Chemical Formula 1-13]

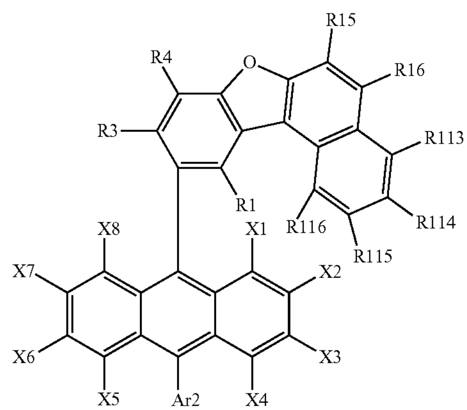

[Chemical Formula 1-14]

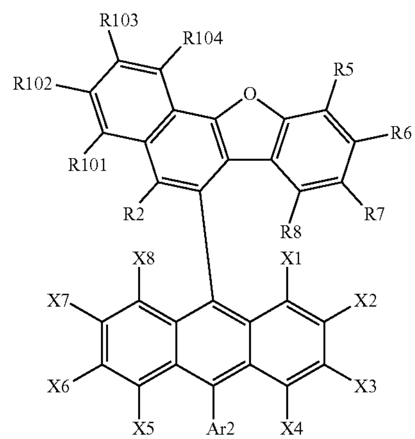

-continued

[Chemical Formula 1-15]

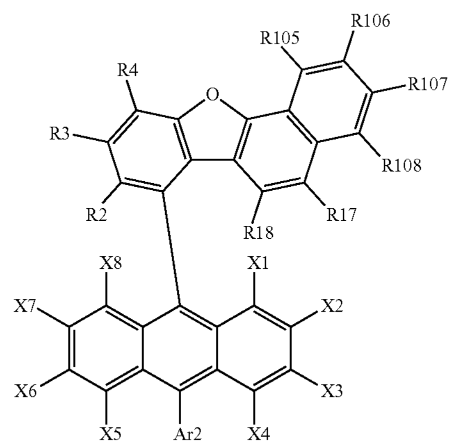

[Chemical Formula 1-16]

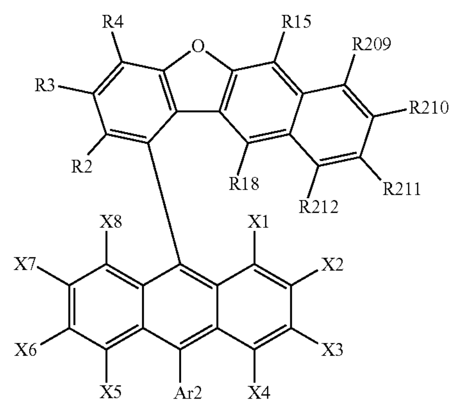

[Chemical Formula 1-17]

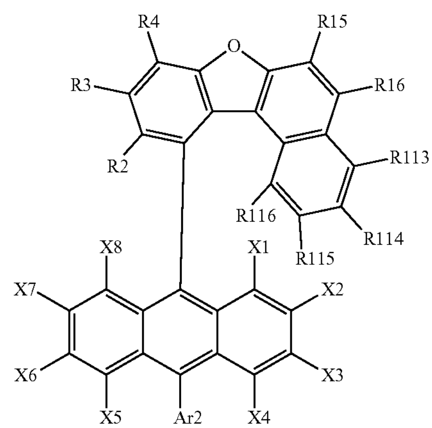

wherein in Chemical Formulae 1-10 to 1-17:

R1 to R8, X1 to X8 and Ar2 have the same definitions as in Chemical Formula 1 and Chemical Formula A; and R101 to R116 are the same as or different from each other, and each independently is hydrogen, deuterium, a substituted or unsubstituted aryl group, or a substituted or unsubstituted heteroaryl group, or bond to adjacent groups to form a substituted or unsubstituted ring, wherein the compounds of Chemical Formula 1-10 to 1-17 are deuterated to 50% or greater.

9. The organic light emitting device of claim 1, wherein Chemical Formula 2 is any one of the following Chemical Formulae 2-10 to 2-17:

-continued
[Chemical Formula 2-10]
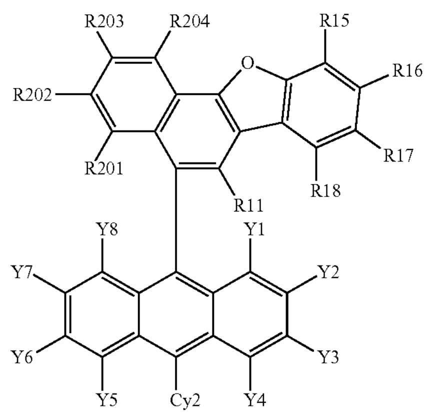
[Chemical Formula 2-13]
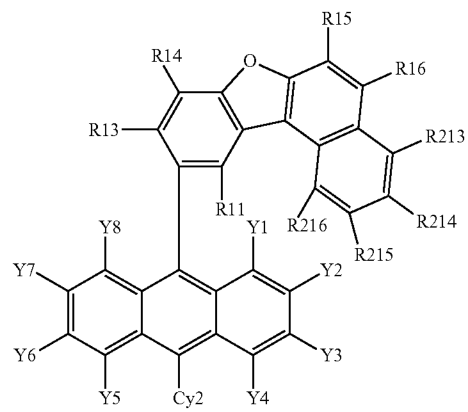
[Chemical Formula 2-11]
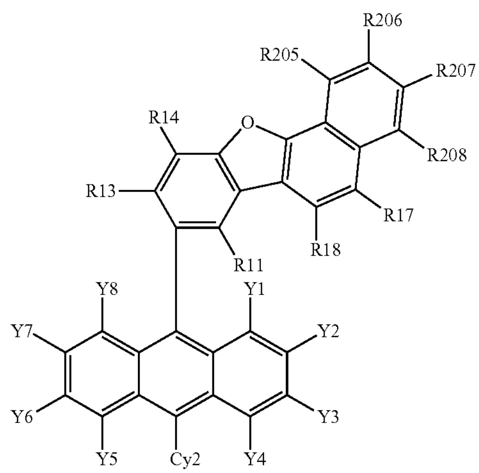
[Chemical Formula 2-14]
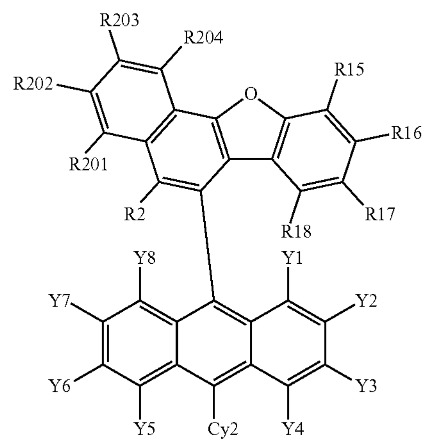
[Chemical Formula 2-12]
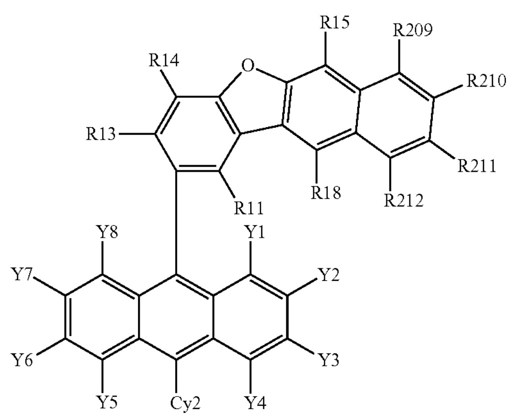
[Chemical Formula 2-15]
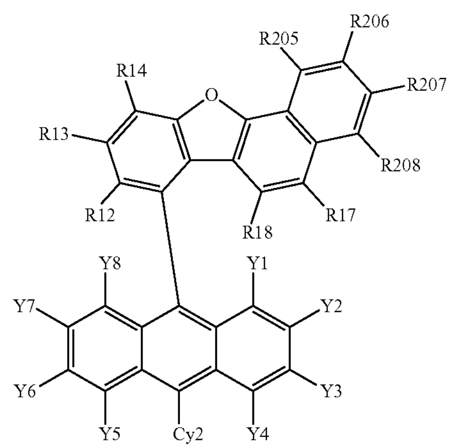

-continued

[Chemical Formula 2-16]

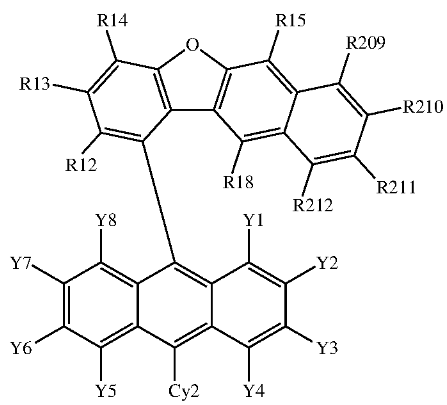

[Chemical Formula 2-17]

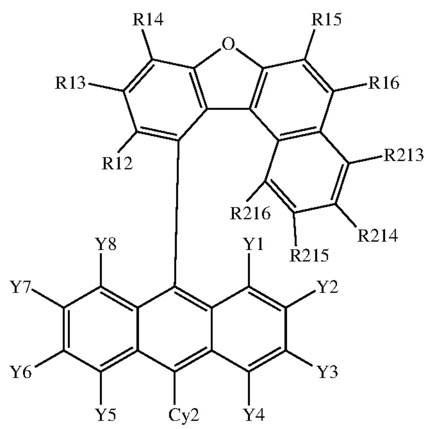

wherein in Chemical Formulae 2-10 to 2-17:

R11 to R18, Y1 to Y8 and Cy2 have the same definitions as in Chemical Formula 2 and Chemical Formula B; and R201 to R216 are the same as or different from each other, and each independently is hydrogen, deuterium, a substituted or unsubstituted aryl group, or a substituted or unsubstituted heteroaryl group, or bond to adjacent groups to form a substituted or unsubstituted ring, wherein the compounds of Chemical Formula 2-10 to 2-17 are deuterated to 50% or greater.

10. The organic light emitting device of claim 1, wherein the compound of Chemical Formula 1 and the compound of Chemical Formula 2 have a mass ratio of 1:9 to 9:1.

11. The organic light emitting device of claim 1, wherein the compound of Chemical Formula 1 and the compound of Chemical Formula 2 satisfy the following Equation 1:

$$|T_{sub1} - T_{sub2}| \leq 30° \text{ C.} \quad \text{[Equation 1]}$$

$T_{sub1}$ is an evaporation temperature of the compound of Chemical Formula 1; and $T_{sub2}$ is an evaporation temperature of the compound of Chemical Formula 2.

12. The organic light emitting device of claim 1, wherein the light emitting layer further includes a dopant, and the dopant is a boron-based compound.

13. The organic light emitting device of claim 12, wherein the boron-based compound is a compound of the following Chemical Formula 3:

[Chemical Formula 3]

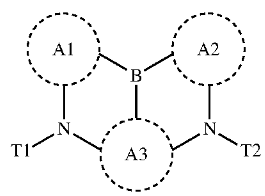

wherein in Chemical Formula 3:

A1 to A3 are the same as or different from each other, and each independently is a substituted or unsubstituted hydrocarbon ring or a substituted or unsubstituted heteroring, or bond to adjacent groups to form a substituted or unsubstituted ring; and T1 and T2 are the same as or different from each other, and each independently is a substituted or unsubstituted aryl group, or a substituted or unsubstituted heterocyclic group, or bond to adjacent groups to form a substituted or unsubstituted ring.

14. The organic light emitting device of claim 1, which is a multi-stack type, and one or two stacks of the multi-stack include the light emitting layer including the compound of Chemical Formula 1 and the compound of Chemical Formula 2.

15. The organic light emitting device of claim 1, wherein the organic material layer includes the light emitting layer, and further includes one or more layers selected from the group consisting of a hole injection layer, a hole transfer layer, a hole control layer, a layer carrying out hole injection and hole transfer at the same time, an additional light emitting layer, an electron injection layer, an electron transfer layer, an electron control layer and a layer carrying out electron injection and electron transfer at the same time.

* * * * *